(12) United States Patent
Hoffman et al.

(10) Patent No.: US 8,617,351 B2
(45) Date of Patent: Dec. 31, 2013

(54) PLASMA REACTOR WITH MINIMAL D.C. COILS FOR CUSP, SOLENOID AND MIRROR FIELDS FOR PLASMA UNIFORMITY AND DEVICE DAMAGE REDUCTION

(75) Inventors: Daniel J. Hoffman, Saratoga, CA (US); Roger A. Lindley, Santa Clara, CA (US); Michael C. Kutney, Santa Clara, CA (US); Martin J. Salinas, San Jose, CA (US); Hamid F. Tavassoli, Cupertino, CA (US); Keiji Horioka, Chiba (JP); Douglas A. Buchberger, Jr., Livermore, CA (US)

(73) Assignee: Applied Materials, Inc., Santa Clara, CA (US)

( * ) Notice: Subject to any disclaimer, the term of this patent is extended or adjusted under 35 U.S.C. 154(b) by 1245 days.

(21) Appl. No.: 11/046,656

(22) Filed: Jan. 28, 2005

(65) Prior Publication Data

US 2005/0167051 A1 Aug. 4, 2005

Related U.S. Application Data

(60) Continuation-in-part of application No. 10/841,116, filed on May 7, 2004, now abandoned, which is a division of application No. 10/192,271, filed on Jul. 9, 2002, now Pat. No. 6,853,141.

(51) Int. Cl.
*C23F 1/00* (2006.01)
*H01L 21/306* (2006.01)
*C03C 15/00* (2006.01)

(52) U.S. Cl.
USPC ........................................ 156/345.46; 216/67

(58) Field of Classification Search
USPC ........................................ 156/345.46; 216/67
See application file for complete search history.

(56) References Cited

U.S. PATENT DOCUMENTS

| 2,951,960 A | 9/1960 | Watrous, Jr. ............... 313/36 |
| 2,967,926 A | 1/1961 | Edstrom ..................... 219/75 |
| 3,355,615 A | 11/1967 | Le Bihan et al. ........ 313/363.1 |
| 3,610,986 A | 10/1971 | King .......................... 313/63 |

(Continued)

FOREIGN PATENT DOCUMENTS

| EP | 0 343 500 A1 | 11/1989 |
| EP | 0 678 903 | 10/1995 |

(Continued)

OTHER PUBLICATIONS

King, Ronald W.P., "Transmission-Line Theory", Dover Publications, Inc., 1965, New York, pp. 1-10 and 282-286.

(Continued)

*Primary Examiner* — Rakesh Dhingra
(74) *Attorney, Agent, or Firm* — Robert M. Wallace

(57) ABSTRACT

A plasma reactor for processing a workpiece, includes a vacuum chamber defined by a sidewall and ceiling, and a workpiece support pedestal having a workpiece support surface in the chamber and facing the ceiling and including a cathode electrode. An RF power generator is coupled to the cathode electrode. Plasma distribution is controlled by an external annular inner electromagnet in a first plane overlying the workpiece support surface, an external annular outer electromagnet in a second plane overlying the workpiece support surface and having a greater diameter than the inner electromagnet, and an external annular bottom electromagnet in a third plane underlying the workpiece support surface. D.C. current supplies are connected to respective ones of the inner, outer and bottom electromagnets.

10 Claims, 52 Drawing Sheets

(56) References Cited

U.S. PATENT DOCUMENTS

| | | | |
|---|---|---|---|
| 4,293,794 A | 10/1981 | Kapetanakos | 315/111.81 |
| 4,401,054 A | 8/1983 | Matsuo et al. | 118/723 MR |
| 4,438,368 A | 3/1984 | Abe et al. | 315/39 |
| 4,458,180 A | 7/1984 | Sohval | 315/111.81 |
| 4,464,223 A | 8/1984 | Gorin | 156/643 |
| 4,526,643 A | 7/1985 | Okano et al. | 156/345 |
| 4,552,639 A | 11/1985 | Garrett | 204/298 |
| 4,570,106 A | 2/1986 | Sohval et al. | 315/111.81 |
| 4,579,618 A | 4/1986 | Celestino et al. | 156/345 |
| 4,600,492 A | 7/1986 | Ooshio et al. | 204/298 |
| 4,631,106 A | 12/1986 | Nakazato et al. | 156/345.46 |
| 4,665,487 A | 5/1987 | Ogawa et al. | 701/24 |
| 4,665,489 A | 5/1987 | Suzuki et al. | 701/24 |
| 4,668,338 A | 5/1987 | Maydan et al. | 438/714 |
| 4,668,365 A | 5/1987 | Foster et al. | 204/192.23 |
| 4,740,268 A | 4/1988 | Bukhman | 216/63 |
| 4,829,215 A | 5/1989 | Kim et al. | 315/111.81 |
| 4,842,683 A | 6/1989 | Cheng et al. | 156/345.37 |
| 4,859,908 A | 8/1989 | Yoshida et al. | 315/111.81 |
| 4,888,518 A | 12/1989 | Grunwald | 313/40 |
| 4,947,085 A | 8/1990 | Nakanishi et al. | 315/111.41 |
| 4,950,956 A | 8/1990 | Asamaki et al. | 315/111.21 |
| 4,963,242 A * | 10/1990 | Sato et al. | 204/298.31 |
| 4,973,883 A | 11/1990 | Hirose et al. | 315/111.41 |
| 4,990,229 A | 2/1991 | Campbell et al. | 204/298.06 |
| 5,006,760 A | 4/1991 | Drake, Jr. | 315/111.21 |
| 5,017,835 A | 5/1991 | Oechsner | 315/111.81 |
| 5,032,202 A | 7/1991 | Tsai et al. | 156/345 |
| 5,053,678 A | 10/1991 | Koike et al. | 315/111.81 |
| 5,055,853 A | 10/1991 | Garnier | 343/769 |
| 5,061,838 A | 10/1991 | Lane et al. | 219/121.59 |
| 5,077,499 A | 12/1991 | Oku | 315/111.21 |
| 5,079,481 A | 1/1992 | Moslehi | 315/111.41 |
| 5,081,398 A | 1/1992 | Asmussen et al. | 315/111.41 |
| 5,087,857 A | 2/1992 | Ahn | 315/111.21 |
| 5,089,083 A | 2/1992 | Kojima et al. | 156/643 |
| 5,107,170 A | 4/1992 | Ishikawa et al. | 313/362.1 |
| 5,115,167 A | 5/1992 | Ootera et al. | 315/111.21 |
| 5,122,251 A | 6/1992 | Campbell et al. | 204/298.06 |
| 5,140,223 A | 8/1992 | Gesche et al. | 315/111.21 |
| 5,175,472 A | 12/1992 | Johnson et al. | 315/111.21 |
| 5,195,045 A | 3/1993 | Keane et al. | 364/482 |
| 5,198,725 A * | 3/1993 | Chen et al. | 315/111.41 |
| 5,208,512 A | 5/1993 | Forster et al. | 315/111.41 |
| 5,210,466 A | 5/1993 | Collins et al. | 315/111.21 |
| 5,211,825 A | 5/1993 | Saito et al. | 204/192.32 |
| 5,213,658 A | 5/1993 | Ishida | 156/643 |
| 5,215,619 A | 6/1993 | Cheng et al. | |
| 5,218,271 A | 6/1993 | Egorov et al. | 315/111.61 |
| 5,223,457 A | 6/1993 | Mintz et al. | 437/225 |
| 5,225,024 A | 7/1993 | Hanley et al. | 156/345 |
| 5,246,532 A | 9/1993 | Ishida | 156/345 |
| 5,252,194 A | 10/1993 | Demaray et al. | 204/298.2 |
| 5,256,931 A | 10/1993 | Bernadet | 313/360.1 |
| 5,272,417 A | 12/1993 | Ohmi | 315/111.21 |
| 5,273,610 A | 12/1993 | Thomas, III et al. | 156/62.7 |
| 5,274,306 A | 12/1993 | Kaufman et al. | 315/111.41 |
| 5,279,669 A | 1/1994 | Lee | 118/723 |
| 5,280,219 A | 1/1994 | Ghanbari | 315/111.41 |
| 5,300,460 A | 4/1994 | Collins et al. | 437/225 |
| 5,304,279 A | 4/1994 | Coultas et al. | 156/345 |
| 5,308,417 A | 5/1994 | Groechel et al. | 216/67 |
| 5,314,603 A | 5/1994 | Sugiyama et al. | 204/298.32 |
| 5,325,019 A | 6/1994 | Miller et al. | 315/111.21 |
| 5,345,145 A | 9/1994 | Harafuji et al. | 315/111.41 |
| 5,401,351 A | 3/1995 | Samukawa | 156/345 |
| 5,432,315 A | 7/1995 | Kaji et al. | 219/121.43 |
| 5,433,836 A | 7/1995 | Martin et al. | 204/298.41 |
| 5,444,207 A | 8/1995 | Sekine et al. | 219/121.43 |
| 5,449,977 A | 9/1995 | Nakagawa et al. | 315/111.51 |
| 5,453,305 A | 9/1995 | Lee | 427/562 |
| 5,463,525 A | 10/1995 | Barnes et al. | 361/234 |
| 5,467,013 A | 11/1995 | Williams et al. | 324/127 |
| 5,474,648 A | 12/1995 | Patrick et al. | 156/627.1 |
| 5,503,676 A | 4/1996 | Shufflebotham et al. | 118/723 MR |
| 5,506,475 A | 4/1996 | Alton | 315/111.41 |
| 5,512,130 A | 4/1996 | Barna et al. | 156/651.1 |
| 5,519,373 A | 5/1996 | Miyata | 335/306 |
| 5,527,394 A | 6/1996 | Heinrich et al. | 118/723 E |
| 5,534,070 A | 7/1996 | Okamura et al. | 118/723 |
| 5,534,108 A | 7/1996 | Qian et al. | 216/68 |
| 5,537,004 A | 7/1996 | Imahashi et al. | 315/111.21 |
| 5,554,223 A | 9/1996 | Imahashi | 118/723 |
| 5,556,549 A | 9/1996 | Patrick et al. | 216/61 |
| 5,565,382 A | 10/1996 | Tseng et al. | 438/680 |
| 5,567,268 A | 10/1996 | Kadomura | 156/345 |
| 5,571,366 A | 11/1996 | Ishii et al. | 156/345 |
| 5,576,600 A | 11/1996 | McCrary et al. | 315/111.81 |
| 5,576,629 A | 11/1996 | Turner et al. | 324/709 |
| 5,587,038 A | 12/1996 | Cecchi et al. | 156/345 |
| 5,592,055 A | 1/1997 | Capacci et al. | 315/111.21 |
| 5,595,627 A | 1/1997 | Inazawa et al. | 156/643.1 |
| 5,605,637 A | 2/1997 | Shan et al. | 216/71 |
| 5,618,382 A | 4/1997 | Mintz et al. | 216/64 |
| 5,627,435 A | 5/1997 | Jansen et al. | 315/111.21 |
| 5,659,276 A | 8/1997 | Miyata | 335/209 |
| 5,660,671 A | 8/1997 | Harada et al. | 156/345 |
| 5,662,770 A | 9/1997 | Donohoe | 438/716 |
| 5,662,819 A | 9/1997 | Kadomura | 216/68 |
| 5,674,321 A * | 10/1997 | Pu et al. | 118/723 MR |
| 5,685,914 A | 11/1997 | Hills et al. | 118/723 |
| 5,705,019 A | 1/1998 | Yamada et al. | 156/345 |
| 5,707,486 A | 1/1998 | Collins | 156/643.1 |
| 5,710,486 A | 1/1998 | Ye et al. | 315/111.21 |
| 5,717,294 A | 2/1998 | Sakai et al. | 315/111.41 |
| 5,718,795 A | 2/1998 | Plavidal et al. | 156/345 |
| 5,720,826 A | 2/1998 | Hayashi et al. | 136/249 |
| 5,726,412 A | 3/1998 | Brifford et al. | 219/121.43 |
| 5,733,511 A | 3/1998 | De Francesco | 422/186.05 |
| 5,770,922 A | 6/1998 | Gerrish et al. | 315/111.21 |
| 5,783,102 A | 7/1998 | Keller | 216/68 |
| 5,792,376 A | 8/1998 | Kanai et al. | 216/71 |
| 5,798,029 A | 8/1998 | Morita | 204/298.16 |
| 5,824,607 A | 10/1998 | Trow et al. | 118/723 |
| 5,846,885 A | 12/1998 | Kamata et al. | 438/729 |
| 5,849,136 A | 12/1998 | Mintz et al. | 156/345 |
| 5,849,372 A | 12/1998 | Annaratone et al. | 427/569 |
| 5,855,685 A | 1/1999 | Tobe et al. | 118/723 |
| 5,855,725 A | 1/1999 | Sakai | 156/345 |
| 5,858,819 A | 1/1999 | Miyasaka | 438/149 |
| 5,863,376 A | 1/1999 | Wicker et al. | 156/345 |
| 5,866,986 A | 2/1999 | Pennington | 315/111.21 |
| 5,868,848 A | 2/1999 | Tsukamoto | 118/723 |
| 5,876,576 A | 3/1999 | Fu | 204/298.2 |
| 5,880,034 A | 3/1999 | Keller | 438/732 |
| 5,885,358 A | 3/1999 | Maydan et al. | 118/723 |
| 5,902,461 A | 5/1999 | Xu et al. | 204/192.12 |
| 5,904,799 A | 5/1999 | Donohoe | 156/345 |
| 5,907,220 A | 5/1999 | Tepman et al. | 315/111.41 |
| 5,914,568 A | 6/1999 | Nonaka | 315/111.21 |
| 5,929,717 A | 7/1999 | Richardson et al. | 333/17.3 |
| 5,936,481 A | 8/1999 | Fiji | 333/17.3 |
| 5,939,886 A | 8/1999 | Turner et al. | 324/464 |
| 5,942,074 A | 8/1999 | Lenz et al. | 156/345 |
| 5,945,008 A | 8/1999 | Kisakibaru et al. | 216/71 |
| 5,958,140 A | 9/1999 | Arami et al. | 118/725 |
| 5,971,591 A | 10/1999 | Vona et al. | 364/478.08 |
| 5,997,962 A | 12/1999 | Ogasawara et al. | 427/535 |
| 6,000,360 A | 12/1999 | Koshimizu | 118/723 E |
| 6,014,943 A | 1/2000 | Arami et al. | 118/723 |
| 6,015,476 A | 1/2000 | Schlueter et al. | 156/345.46 |
| 6,016,131 A | 1/2000 | Sato et al. | 343/895 |
| 6,030,486 A | 2/2000 | Loewenhardt et al. | 156/345 |
| 6,043,608 A | 3/2000 | Samukawa et al. | 315/111.51 |
| 6,051,151 A | 4/2000 | Keller et al. | 216/68 |
| 6,063,236 A | 5/2000 | Sakai | 156/345 |
| 6,076,482 A | 6/2000 | Ding et al. | 118/723 |
| 6,085,688 A | 7/2000 | Lymberopoulos et al. | 118/723 |
| 6,089,182 A | 7/2000 | Hama | 118/723 |
| 6,093,457 A | 7/2000 | Okumura et al. | 427/569 |
| 6,095,084 A | 8/2000 | Shamouilian et al. | 118/723 E |
| 6,096,160 A | 8/2000 | Kadomura | 156/345 |

(56) References Cited

U.S. PATENT DOCUMENTS

| | | | |
|---|---|---|---|
| 6,106,663 A | 8/2000 | Kuthi et al. | 156/345 |
| 6,110,395 A | 8/2000 | Gibson, Jr. | 216/67 |
| 6,113,731 A | 9/2000 | Shan et al. | 156/345 |
| 6,142,096 A | 11/2000 | Sakai et al. | 118/723 |
| 6,152,071 A | 11/2000 | Akiyama et al. | 118/723 |
| 6,155,200 A | 12/2000 | Horijke et al. | 118/723 |
| 6,162,709 A | 12/2000 | Raoux et al. | 438/513 |
| 6,174,450 B1 | 1/2001 | Patrick et al. | 216/61 |
| 6,188,564 B1 | 2/2001 | Hao | 361/234 |
| 6,190,495 B1 | 2/2001 | Kubota et al. | 156/345.46 |
| 6,213,050 B1 | 4/2001 | Liu et al. | 118/723 |
| 6,218,312 B1 | 4/2001 | Collins et al. | 438/723 |
| 6,228,235 B1 | 5/2001 | Tepman et al. | 204/298.2 |
| 6,245,190 B1 | 6/2001 | Masuda et al. | 156/345 |
| 6,247,425 B1 | 6/2001 | Lymberopoulos et al. | 118/723 |
| 6,251,216 B1 | 6/2001 | Okamura et al. | 156/345 |
| 6,251,242 B1 | 6/2001 | Fu et al. | 204/298.19 |
| 6,255,220 B1 | 7/2001 | Kisakibaru et al. | 438/707 |
| 6,262,538 B1 | 7/2001 | Keller | 315/111.21 |
| 6,274,008 B1 | 8/2001 | Gopalraja et al. | 204/192.17 |
| 6,277,249 B1 | 8/2001 | Gopalraja et al. | 204/192.12 |
| 6,290,806 B1 | 9/2001 | Donohoe | 156/345 |
| 6,291,999 B1 | 9/2001 | Nishimori et al. | 324/464 |
| 6,294,026 B1 | 9/2001 | Roithner et al. | 118/715 |
| 6,296,747 B1 | 10/2001 | Tanaka | 204/298.07 |
| 6,300,227 B1 | 10/2001 | Liu et al. | 438/513 |
| 6,337,292 B1 | 1/2002 | Kim et al. | 438/787 |
| 6,346,915 B1 | 2/2002 | Okumura et al. | 343/701 |
| RE37,580 E | 3/2002 | Barnes et al. | 361/234 |
| 6,376,388 B1 | 4/2002 | Hashimoto et al. | 438/728 |
| 6,382,129 B1 | 5/2002 | Nikulin | 118/723 |
| 6,392,350 B1 | 5/2002 | Amano | 315/111.21 |
| 6,404,088 B1 | 6/2002 | Barada et al. | 310/90.5 |
| 6,415,736 B1 | 7/2002 | Hao et al. | 118/723 E |
| 6,431,297 B1 | 8/2002 | Nakazawa | 180/65.6 |
| 6,432,259 B1 | 8/2002 | Noorbakhsh et al. | 118/723 |
| 6,436,230 B1 | 8/2002 | Kondu et al. | 156/345.46 |
| 6,436,388 B2 | 8/2002 | Kudo et al. | 424/85.1 |
| 6,444,039 B1 | 9/2002 | Nguyen | 118/715 |
| 6,444,104 B2 | 9/2002 | Gopalraja et al. | 204/298.13 |
| 6,449,568 B1 | 9/2002 | Gerrish | 702/60 |
| 6,451,177 B1 | 9/2002 | Gopalraja et al. | 204/192.12 |
| 6,451,703 B1 | 9/2002 | Liu et al. | 438/710 |
| 6,462,481 B1 | 10/2002 | Holland et al. | 315/111.21 |
| 6,485,617 B2 | 11/2002 | Fu et al. | 204/192.17 |
| 6,485,618 B2 | 11/2002 | Gopalraja et al. | 204/192.17 |
| 6,488,807 B1 | 12/2002 | Collins et al. | 156/345.49 |
| 6,491,801 B1 | 12/2002 | Gung | 204/298.2 |
| 6,495,009 B1 | 12/2002 | Gung | 204/298.2 |
| 6,507,155 B1 | 1/2003 | Barnes et al. | 315/111.51 |
| 6,521,082 B1 | 2/2003 | Barnes et al. | 156/345.46 |
| 6,528,751 B1 | 3/2003 | Hoffman et al. | 219/121.43 |
| 6,545,580 B2 | 4/2003 | Hegde et al. | 335/296 |
| 6,579,421 B1 | 6/2003 | Fu | 204/192.12 |
| 6,586,886 B1 | 7/2003 | Katz et al. | 315/111.21 |
| 6,599,399 B2 | 7/2003 | Xu et al. | 204/192.12 |
| 6,610,184 B2 | 8/2003 | Ding et al. | 204/298.17 |
| 6,613,689 B2 | 9/2003 | Liu et al. | 438/712 |
| 6,627,050 B2 | 9/2003 | Miller et al. | 304/192.22 |
| 6,639,950 B1 | 10/2003 | Lagerblom et al. | 375/297 |
| 6,652,712 B2 | 11/2003 | Wang et al. | 156/345.48 |
| 6,663,754 B2 | 12/2003 | Gung | 204/298.19 |
| 6,673,199 B1 | 1/2004 | Yamartino et al. | 156/345.49 |
| 6,674,241 B1 | 1/2004 | Strang et al. | 315/111.41 |
| 6,700,376 B2 | 3/2004 | Goto et al. | 324/318 |
| 6,716,302 B2 | 4/2004 | Carducci et al. | 156/345.47 |
| 6,761,804 B2 | 7/2004 | Perrin | 204/192.12 |
| 6,764,575 B1 | 7/2004 | Yamasaki et al. | 156/345.46 |
| 6,767,429 B2 | 7/2004 | Amano | 156/345.29 |
| 6,787,006 B2 | 9/2004 | Gopalraja et al. | 204/192.3 |
| 6,797,639 B2 | 9/2004 | Carducci et al. | 438/710 |
| 6,805,770 B1 | 10/2004 | Oster | 156/345.42 |
| 6,853,141 B2 | 2/2005 | Hoffman et al. | 215/111.21 |
| 6,872,259 B2 | 3/2005 | Strang | 118/715 |
| 6,894,245 B2 | 5/2005 | Hoffman et al. | 219/121.43 |
| 6,937,127 B2 | 8/2005 | Oster | 335/296 |
| 7,030,335 B2 | 4/2006 | Hoffman et al. | 219/121.43 |
| 7,163,641 B2 | 1/2007 | Donohoe et al. | 216/67 |
| 7,218,503 B2 | 5/2007 | Howald | 361/234 |
| 7,422,654 B2 | 9/2008 | Lindley et al. | 156/345.46 |
| 7,458,335 B1 | 12/2008 | Bjorkman | 118/723 R |
| 7,481,886 B2 | 1/2009 | Kato et al. | 118/115 |
| 7,955,986 B2 | 6/2011 | Hoffman et al. | |
| 2002/0108933 A1 | 8/2002 | Hoffman et al. | 219/121.43 |
| 2002/0139477 A1 | 10/2002 | Ni et al. | 156/345.44 |
| 2002/0179443 A1 | 12/2002 | Hada et al. | 204/408 |
| 2003/0085000 A1 | 5/2003 | Horioka et al. | 156/345.49 |
| 2003/0132195 A1 | 7/2003 | Edamura et al. | 216/59 |
| 2003/0168427 A1 | 9/2003 | Flamm et al. | 216/2 |
| 2003/0218427 A1 | 11/2003 | Hoffman et al. | 315/111.41 |
| 2004/0011467 A1 | 1/2004 | Hemker et al. | 156/345.49 |
| 2004/0056602 A1 | 3/2004 | Yang et al. | 315/111.21 |
| 2004/0182516 A1* | 9/2004 | Lindley et al. | 156/345.46 |
| 2004/0233027 A1 | 11/2004 | Oster | 335/306 |
| 2005/0001556 A1 | 1/2005 | Hoffman et al. | 215/111.91 |
| 2005/0167051 A1 | 8/2005 | Hoffman et al. | 156/345.46 |
| 2006/0157201 A1 | 7/2006 | Hoffman et al. | 156/345.56 |
| 2007/0251920 A1 | 11/2007 | Hoffman | 216/67 |
| 2008/0023143 A1 | 1/2008 | Hoffman | 156/345.33 |
| 2009/0250432 A1 | 10/2009 | Hoffman et al. | |
| 2011/0201134 A1 | 8/2011 | Hoffman et al. | |

FOREIGN PATENT DOCUMENTS

| | | |
|---|---|---|
| EP | 0 719 447 | 7/1998 |
| EP | 1686612 A | 8/2006 |
| JP | 60094725 A | 5/1985 |
| JP | 01-218106 | 8/1989 |
| JP | 02224239 A | 9/1990 |
| JP | 4-247878 | 9/1992 |
| JP | 05021391 | 1/1993 |
| JP | 07235396 A | 9/1995 |
| JP | 08167588 A * | 6/1996 |
| JP | 11016893 A | 1/1999 |
| JP | 2001-185542 | 7/2001 |
| JP | 2001-319920 | 11/2001 |
| JP | 2002-203840 | 7/2002 |
| TW | 497173 | 8/2002 |
| TW | 589659 | 6/2004 |
| WO | WO 0137315 A1 | 5/2001 |
| WO | WO 01/71765 | 9/2001 |
| WO | WO 0175188 A2 | 10/2001 |
| WO | WO 03/100318 A1 | 12/2003 |
| WO | WO 2004/022238 A2 | 3/2004 |
| WO | WO 2004/022238 A3 | 3/2004 |

OTHER PUBLICATIONS

U.S. Appl. No. 10/007,367, filed Oct. 22, 2001, entitled "Merie Plasma Reactor With Overhead RF Electrode Tuned to the Plasma With Arcing Suppression", by Daniel Hoffman, et al.

Japanese Notice of Reasons for Rejection Dated Nov. 24, 2009 Issued in Japanese Patent Application No. P2006-109588.

Official Action Dated Oct. 8, 2003 Issued in Co-Pending Patent U.S. Appl. No. 10/192,271.

Official Action Dated Mar. 29, 2004 Issued in Co-Pending Patent U.S. Appl. No. 10/192,271.

Official Action Dated Jun. 22, 2006 Issued in Co-Pending Patent U.S. Appl. No. 10/841,116.

Office Action Dated Oct. 12, 2006 Issued in Co-Pending Patent U.S. Appl. No. 10/841,116.

Official Action Dated May 1, 2007 Issued in Co-Pending Patent U.S. Appl. No. 10/841,116.

Official Action Dated Jul. 10, 2008 in Co-Pending Patent U.S. Appl. No. 11/360,944.

Official Action Dated Dec. 15, 2008 Issued in Co-Pending Patent U.S. Appl. No. 11/360,944.

Official Action Dated Apr. 14, 2009 Issued in Co-Pending Patent U.S. Appl. No. 11/360,944.

Official Action Dated Oct. 29, 2009 Issued in Co-Pending Patent U.S. Appl. No. 11/360,944.

(56) References Cited

OTHER PUBLICATIONS

Official Action Dated Jan. 4, 2010 Issued in Co-Pending Patent U.S. Appl. No. 11/360,944.
Official Action Dated Oct. 26, 2009 Issued in Co-Pending Patent U.S. Appl. No. 11/807,194.
Official Action Dated Feb. 5, 2009 Issued in Co-Pending Patent U.S. Appl. No. 11/881,801.
Official Action Dated Jul. 23, 2009 Issued in Co-Pending Patent U.S. Appl. No. 11/881,801.
Official Action Dated Oct. 19, 2009 Issued in Co-Pending Patent U.S. Appl. No. 11/881,801.
Official Action Dated Jan. 25, 2010 Issued in Co-Pending Patent U.S. Appl. No. 11/881,801.
Official Action Dated Jun. 22, 2010 Issued in Co-Pending Patent U.S. Appl. No. 11/360,944.
Official Action Dated Nov. 23, 2010 Issued in Co-Pending Patent U.S. Appl. No. 11/360,944.
Offical Action dated Sep. 4, 2012 issued in co-pending U.S. Appl. No. 13/081,005.

* cited by examiner

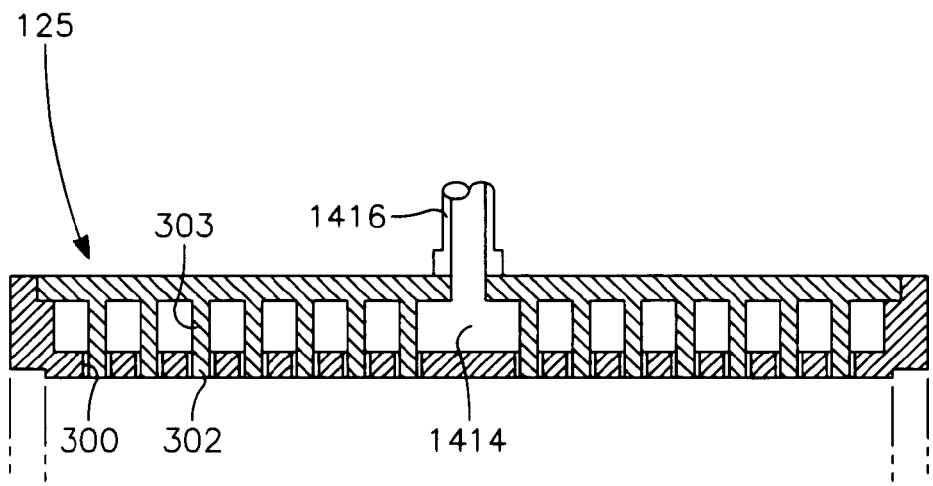
FIG. 26
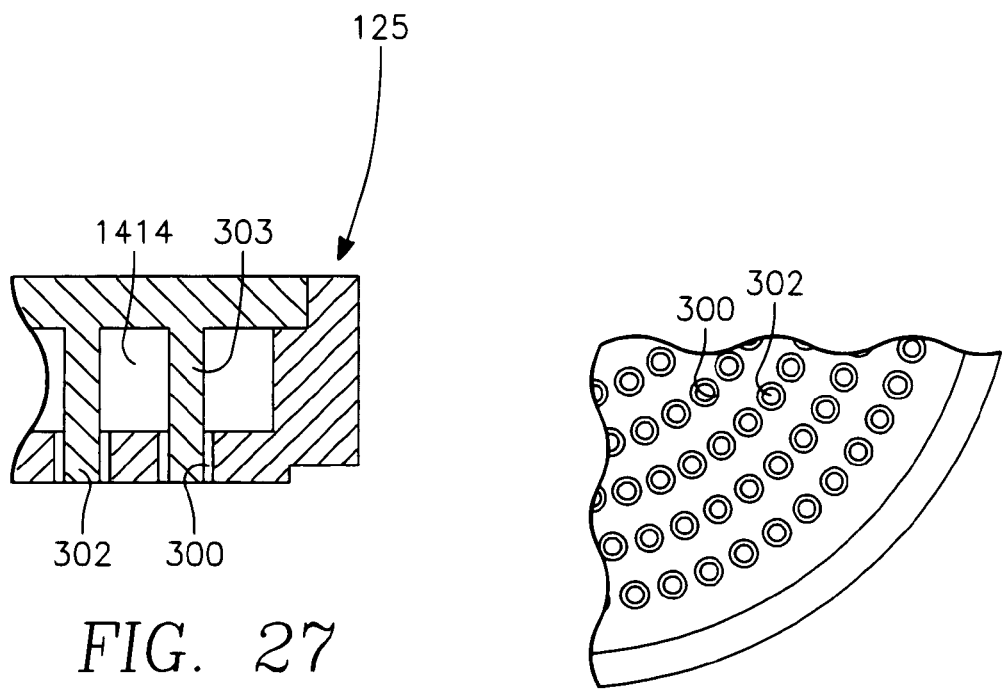
FIG. 27
FIG. 28

| Etch Rate ||| 
|---|---|---|
| Magnetic Field | Non-Uniformity | Damage |
| Solenoid | 2.0% | Bad 15V 3mA |
| Mirror (Axial) | 1.7% | Bad 11V 7mA |
| 100% Cusp (Radial) | 7.9% | Good 3.3V 0.04mA |
| 160% Cusp | 2.4% | Good 4V 0.4mA |

PLASMA REACTOR WITH MINIMAL D.C. COILS FOR CUSP, SOLENOID AND MIRROR FIELDS FOR PLASMA UNIFORMITY AND DEVICE DAMAGE REDUCTION

CROSS-REFERENCE TO RELATED APPLICATIONS

This application is a continuation-in-part of U.S. application Ser. No. 10/841,116, filed May 7, 2004 now abandoned entitled CAPACITIVELY COUPLED PLASMA REACTOR WITH MAGNETIC PLASMA CONTROL by Daniel Hoffman, et al., which is divisional of U.S. application Ser. No. 10/192,271, filed Jul. 9, 2002 entitled CAPACITIVELY COUPLED PLASMA REACTOR WITH MAGNETIC PLASMA CONTROL by Daniel Hoffman et al., now U.S. Pat. No. U.S. 6,853,141, all of which are assigned to the present assignee.

BACKGROUND

Capacitively coupled plasma reactors are used in fabricating semiconductor microelectronic structures with high aspect ratios. Such structures typically have narrow, deep openings through one or more thin films formed on a semiconductor substrate. Capacitively coupled plasma reactors are used in various types of processes in fabricating such devices, including dielectric etch processes, metal etch processes, chemical vapor deposition and others. Such reactors are also employed in fabricating photolithographic masks and in fabricating semiconductor flat panel displays. Such applications depend upon plasma ions to enhance or enable desired processes. The density of the plasma ions over the surface of the semiconductor workpiece affects the process parameters, and is particularly critical in the fabrication of high aspect ratio microelectronic structures. In fact, a problem in fabricating high aspect ratio microelectronic integrated circuits is that non-uniformities in the plasma ion density across the workpiece surface can lead to process failure due to non-uniform etch rates or deposition rates.

A typical capacitively coupled reactor has a wafer support pedestal in the reactor chamber and a ceiling overlying the wafer support. The ceiling may include a gas distribution plate that sprays process gas into the chamber. An RF power source is applied across the wafer support and ceiling or wall to strike and maintain a plasma over the wafer support. The chamber is generally cylindrical, while the ceiling and wafer support are circular and coaxial with the cylindrical chamber to enhance uniform processing. Nevertheless, such reactors have non-uniform plasma density distributions. Typically, the radial density distribution of plasma ions is high over the center of the wafer support and low near the periphery, a significant problem. Various approaches are used to control the plasma ion density distribution so as to improve process uniformity across the wafer or workpiece surface, and at least partially overcome this problem.

One such approach is to provide a set of magnetic coils spaced circumferentially around the side of the reactor chamber, the coils all facing the center of the chamber. A relatively low frequency sinusoidal current is supplied to each coil, the sinusoidal currents in adjacent coils being offset in phase so as to produce a slowly rotating magnetic field over the wafer support. This feature tends to improve the radial distribution of plasma ion density over the wafer support. Where this approach is employed in reactive ion etching, it is called magnetically enhanced reactive ion etching (MERIE). This approach has certain limitations. In particular, the strength of the magnetic field may need to be limited in order to avoid device damage to microelectronic structures on the semiconductor workpiece associated with the strength of the magnetic field. The strength must also be limited to avoid chamber arcing associated with the rate of change of magnetic field strength. As a result, the total MERIE magnetic field may need to be substantially reduced and therefore may face substantial limitations in plasma ion density uniformity control.

Another approach is called configurable magnetic fields (CMF) and employs the same circumferentially spaced coils referred to above. But, in CMF the coils are operated so as to impose a magnetic field that extends across the plane of the workpiece support, from one side to the other. In addition, the magnetic field rotates about the axis of the wafer support, to produce a time-averaged magnetic field that is radial. This is all accomplished, in the case of a reactor having four side-by-side coils, by furnishing one D.C. current to one pair of adjacent coils and a different (or opposite) D.C. current to the opposite pair of adjacent coils. The coils are switched to rotate this pattern so that the magnetic field rotates, as mentioned above. This approach is vulnerable to chamber or wafer arcing problems due to the abrupt switching of the CMF magnetic fields, and therefore the magnetic field strength must be limited. As a result, in some applications the magnetic field cannot be sufficient to compensate for plasma ion density non-uniformities produced by the reactor.

Thus, what is needed is a way of compensating for plasma ion density distribution non-uniformities more efficiently (so that the magnetic field strength can be less) and with less (or with no) time fluctuations in the magnetic field.

SUMMARY OF THE INVENTION

A plasma reactor for processing a workpiece, includes a vacuum chamber defined by a sidewall and ceiling, and a workpiece support pedestal having a workpiece support surface in the chamber and facing the ceiling and including a cathode electrode. An RF power generator is coupled to the cathode electrode. Plasma distribution is controlled by an external annular inner electromagnet in a first plane overlying the workpiece support surface, an external annular outer electromagnet in a second plane overlying the workpiece support surface and having a greater diameter than the inner electromagnet, and an external annular bottom electromagnet in a third plane underlying the workpiece support surface. D.C. current supplies are connected to respective ones of the inner, outer and bottom electromagnets. The workpiece support pedestal and the inner, outer and bottom magnets can be generally coaxial. In one embodiment, the first plane overlies the second plane and both the first and second planes overlie the third plane, the first, second and third planes being parallel with the workpiece support surface.

The reactor can include a processor controlling D.C. currents from the inner, outer and bottom D.C. current supplies. The processor may be operable in three modes, namely:

a cusp mode wherein the D.C. currents cause the bottom electromagnet and one of the inner and outer electromagnets to generate equal and opposite magnetic fields at the workpiece support surface, a mirror mode wherein the D.C. currents cause the bottom electromagnet and one of the inner and outer electromagnets to generate like magnetic fields at the workpiece support surface, and a solenoid mode wherein the D.C. current cause at least one of the electromagnets to generate both radial and axial magnetic fields at the workpiece support surface.

The processor can be programmed to search for the best combination of D.C. currents for the three magnets to improve plasma ion density distribution uniformity with radial magnetic fields at the wafer while improving device damage results by controlling (e.g., reducing) axial magnetic fields at the wafer.

BRIEF DESCRIPTION OF THE DRAWINGS

FIGS. 26, 27, 28, 29A and 29B illustrate a gas distribution plate for the reactors of FIGS. 1A, 24 and 25.

DETAILED DESCRIPTION OF THE INVENTION

Figure 1A:
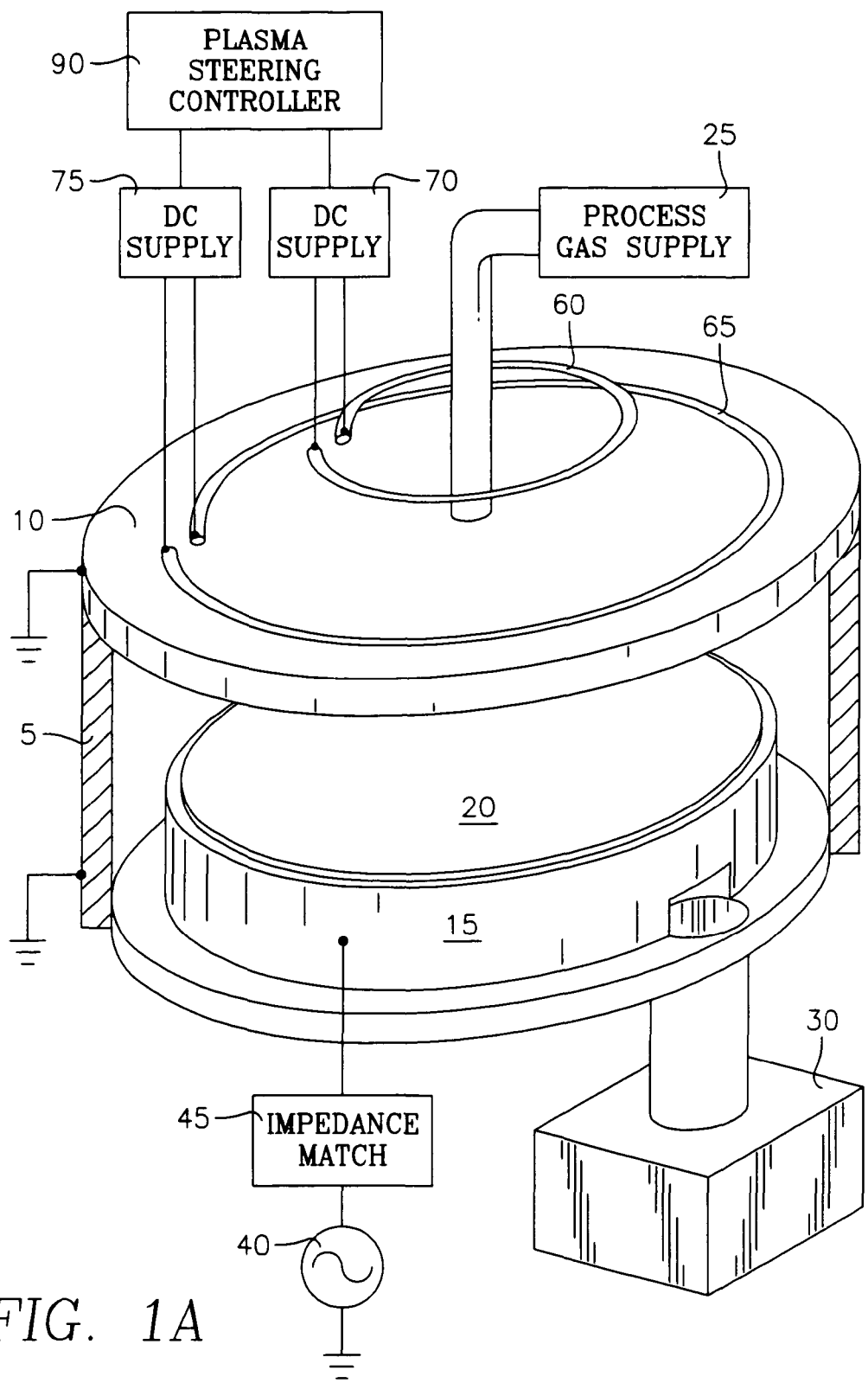
FIGS. 1A, 1B and 1C illustrate a plasma reactor with an overhead VHF electrode and overhead coils for controlling plasma ion uniformity.

The plasma ion density distribution exhibited by a particular plasma reactor is a function of chamber pressure, gas mixture and diffusion, and source power radiation pattern. In the present reactor, this distribution is magnetically altered to approximate a selected or ideal distribution that has been predetermined to improve process uniformity. The magnetically altered or corrected plasma ion density distribution is such that process uniformity across the surface of the wafer or workpiece is improved. For this purpose, the magnetically corrected plasma distribution may be non-uniform or it may be uniform, depending upon the needs determined by the user. We have discovered that the efficiency with which an average magnetic field strength exerts pressure on a plasma to change its distribution to a desired one can be improved. This surprising result can be achieved in accordance with this discovery by increasing the radial component of the gradient of the magnetic field. The radial direction is understood to be about the axis of symmetry of the cylindrical chamber. Thus, what is needed is a magnetic field configuration which has a large radial gradient and a small field strength in other directions. Such a magnetic field is cusp-shaped with its axis of symmetry coinciding with the axis of the cylindrical reactor chamber. One way of producing a cusp-shaped magnetic field is to provide coils above and below the cylindrical chamber and run D.C. currents through these coils in opposite directions.

Depending upon the chamber design, it may be impractical to provide a coil below the wafer pedestal, and therefore in a first case, a top coil suffices for these purposes. In addition, what is needed is for the cusp-shaped magnetic field to be configurable or adjustable for accurate control or alteration of a plasma ion distribution inherent in a given plasma reactor chamber (the "ambient" plasma ion distribution). Since the plasma ion distribution provided in different capacitively coupled reactors can vary widely, such adjustability may be essential in some cases. The radial component of the magnetic field gradient is chosen to apply the magnetic pressure required to alter the ambient distribution to the desired distribution. For example, if the desired distribution is a uniform distribution, then the applied magnetic field is selected to counteract the non-uniformity in the radial distribution of plasma ion density exhibited by the reactor in the absence of the magnetic field. In this case, for example, if the reactor tends to have a center-high distribution of plasma ion density, then the magnetic field gradient is chosen to sustain the plasma density over the center of the wafer support pedestal and enhance it near the periphery to achieve uniformity.

Such adjustability of the cusp-shaped magnetic field is achieved in accordance with our discovery by providing at least a second overhead coil of a different (e.g., smaller) diameter than the first coil. The D.C. currents in the respective coils are independently adjustable so as to permit configuration of the cusp-shaped magnetic field in a highly flexible manner to alter virtually any ambient plasma ion distribution to approximate some desired plasma ion distribution. This choice of field configuration can be designed to modify center-high or center-low plasma ion density distributions.

One advantage that can be realized is two-fold, in that the cusp-shaped magnetic field has a large radial gradient relative to the magnetic field strength (as noted above) and therefore is highly efficient in exerting corrective pressure on the plasma; but, since the magnetic field is constant over time, there is far less tendency to produce arcing, and therefore a somewhat stronger magnetic field may be employed for even greater corrective capacity when required. As will be described later in this specification, this feature can be quite helpful at higher chamber pressures.

FIG. 1A illustrates a capacitively coupled plasma reactor capable of providing an adjustable cusp-shaped magnetic field. The reactor of FIG. 1A includes a cylindrical side wall 5, a ceiling 10 that is a gas distribution plate, and a wafer support pedestal 15 that holds a semiconductor workpiece 20. The ceiling 10 or gas distribution plate may be conductive so as to enable it to serve as an anode or it may have an anode attached to it. The ceiling 10 or gas distribution plate is typically made of aluminum and has an internal gas manifold and gas injection orifices in its interior surface that face into the chamber. A process gas supply 25 furnishes process gas to the gas distribution plate 10. A vacuum pump 30 controls the pressure inside the reactor chamber. Plasma source power for igniting and maintaining a plasma inside the reactor chamber is produced by an RF generator 40 connected through an impedance match circuit 45 to the wafer support pedestal 15 so that the wafer support pedestal serves as an RF electrode. The anode (which may be the ceiling 10 formed of a conductor material) is connected to RF ground so that is serves as the counter electrode. Such a reactor tends to have a very non-uniform plasma ion density distribution, which is typically center-high.

Figure 1B:
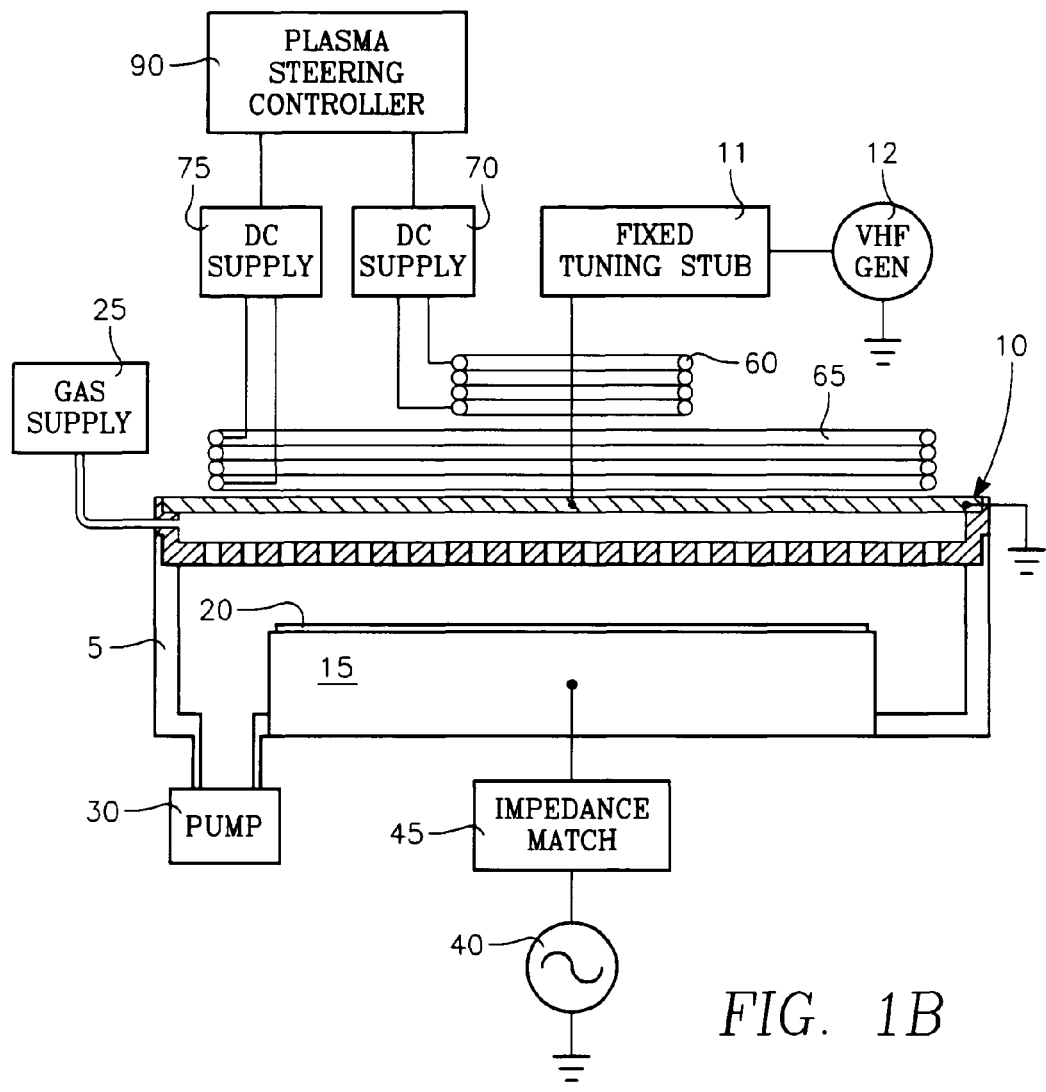

FIG. 1B illustrates a feature in which the ceiling 10, rather than being connected directly to ground as in FIG. 1A, is connected through an RF impedance match element 11 (shown only schematically) to a VHF signal generator 12 that furnishes the plasma source power. In this case, the RF generator 40 merely controls the RF bias on the semiconductor wafer or workpiece 20. (The RF impedance match element 11 may be a fixed tuning element such as for example a coaxial tuning stub or a strip line circuit.) Such a feature is discussed in greater detail in a later portion of this specification.

Figure 1C:
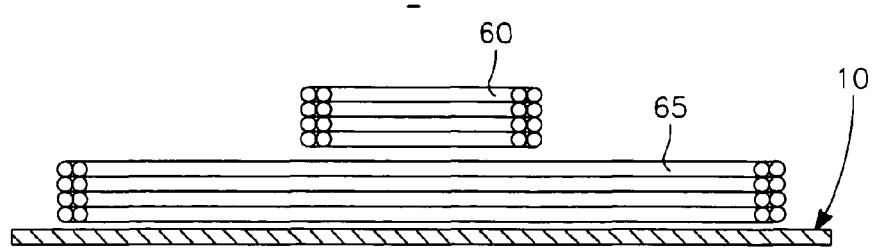

In order to control distribution of plasma ion density, a set of inductive coils are provided above the ceiling 10. In the case of FIG. 1A, the set of coils includes an inner coil 60 and an outer coil 65 which are coaxial with the cylindrical chamber and each constitutes single winding of a conductor. While the windings 60, 65 are illustrated in FIG. 1A as being single turns, they may each consist of plural turns arranged vertically, for example as shown in FIG. 1B. Or, as shown in FIG. 1C, the windings 60, 65 may extend both vertically and horizontally. In the case of FIG. 1A, the inner coil 60 is located farther above the ceiling 10 than the outer coil 65. However, in other cases this arrangement may be reversed, or the two coils 60, 65 may be at the same height above the ceiling 10.

Figure 2:
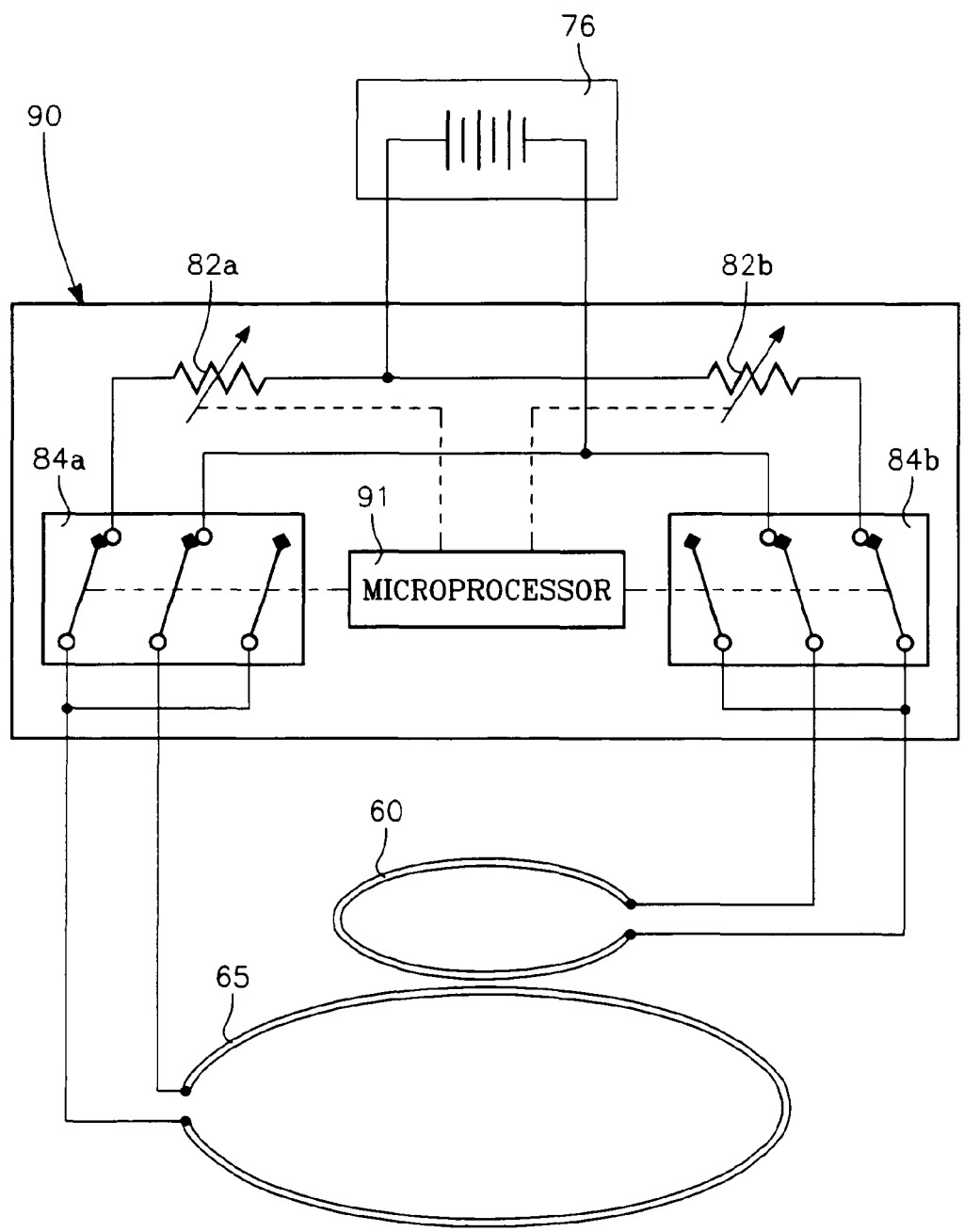
FIG. 2 illustrates an exemplary apparatus for controlling the overhead coils of FIG. 1.

In the case of FIGS. 1A and 1B, a controller 90 determines the magnitude and polarity of currents flowing to the respective overhead coils 60, 65 by controlling respective independent D.C. current supplies 70, 75 that are connected to respective ones of the coils 60, 65. Referring now to FIG. 2, a case is illustrated in which the controller 90 governs the D.C. currents to the coils 60, 65 from a D.C. current supply 76 that furnished current through the controller 90, the controller 90 being connected to respective ones of the coils 60, 65. In either case, the controller 90 is capable of causing D.C. currents of different polarities and magnitudes to flow in different ones of the coils 60, 65. In the case of FIG. 2, the controller 90 includes a pair of potentiometers 82a, 82b that adjust the D.C. current applied to the respective coils 60, 65 and a pair of ganged switches 84a, 84b that independently determine the polarity of the D.C. current applied to each of the coils 60, 65. A programmable device such as a microprocessor 91 can be included in the controller 90 in order to intelligently govern the potentiometers 82a, 82b and the ganged switches 84a, 84b.

The arrangement of the two coils 60, 65 illustrated in FIGS. 1A, 1B and 1C, in which the inner coil 60 is placed at a greater height above the ceiling 10 than the outer coil 65, provides certain advantages. Specifically, the radial component of the magnetic field gradient provided by either coil is, at least roughly, proportional to the radius of the coil and inversely proportional to the axial displacement from the coil. Thus, the inner and outer coils 60, 65 will perform different roles because of their different sizes and displacements: The outer coil 65 will dominate across the entire surface of the wafer 20 because of its greater radius and closer proximity to the wafer 20, while the inner coil 60 will have its greatest effect near the wafer center and can be regarded as a trim coil for finer adjustments or sculpting of the magnetic field. Other arrangements may be possible for realizing such differential control by different coils which are of different radii and placed at different displacements from the plasma. As will be described later in this specification with reference to certain working examples, different changes to the ambient plasma ion density distribution are obtained by selecting not only different magnitudes of the currents flowing in the respective overhead coils (60, 65) but also by selecting different polarities or directions of current flow for the different overhead coils.

Figure 3A:
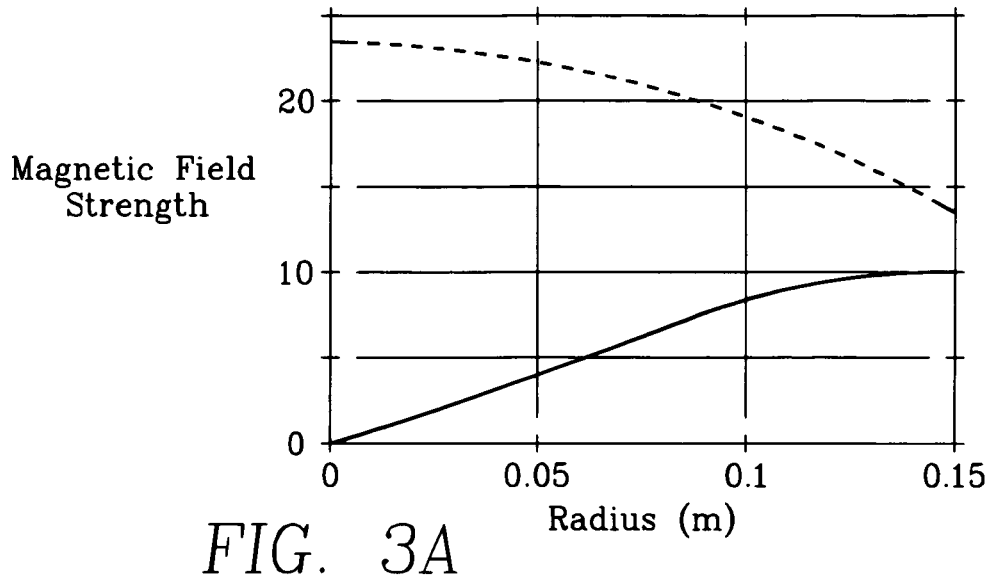
FIGS. 3A and 3B are graphical representations of a magnetic field of the overhead coils of FIG. 1
Figure 3B:
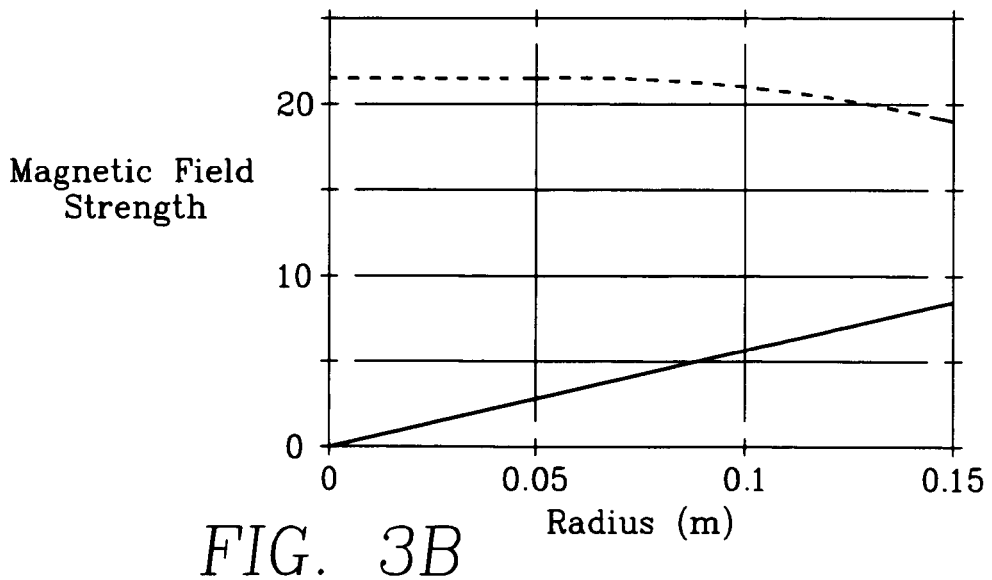
Figure 3C:
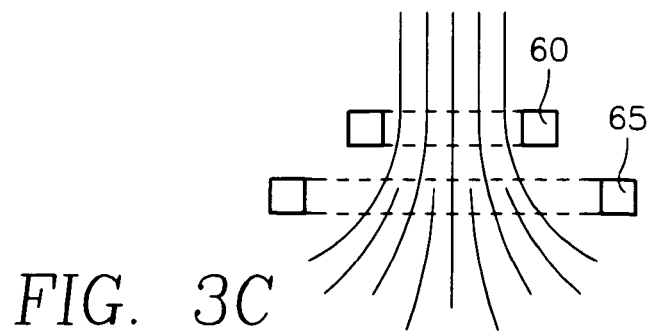
FIG. 3C is a spatial representation of the same field.

FIG. 3A illustrates the radial (solid line) and azimuthal (dashed line) components of the magnetic field produced by the inner coil 60 as a function of radial position on the wafer 20, in the case of FIG. 1A. FIG. 3B illustrates the radial (solid line) and azimuthal (dashed line) components of the magnetic field produced by the outer coil 65 as a function of radial position on the wafer 20. The data illustrated in FIGS. 3A and 3B were obtained in an implementation in which the wafer 20 was 300 mm in diameter, the inner coil 60 was 12 inches in diameter and placed about 10 inches above the plasma, and the outer coil 65 was 22 inches in diameter and placed about 6 inches above the plasma. FIG. 3C is a simplified diagram of the half-cusp shaped magnetic field line pattern produced by the inner and outer overhead coils 60, 65.

The controller 90 of FIG. 2 can change the currents applied to the respective coils 60, 65 in order to adjust the magnetic field at the wafer surface and thereby change the spatial distribution of plasma ion density. What will now be illustrated are the effects of different magnetic fields applied by different ones of the coils 60, 65, in order to illustrate how profoundly the controller 90 can affect and improve plasma ion distribution in the chamber by changing these magnetic fields. In the following examples, the spatial distribution of the etch rate across the wafer surface rather than the plasma ion distribution is measured directly. The etch rate distribution changes directly with changes in the plasma ion distribution and therefore changes in one are reflected by changes in the other.

Figure 4A:
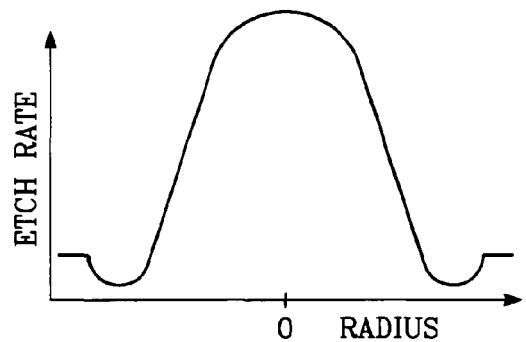
FIGS. 4A, 4B, 4C and 4D are graphs of the etch rate (vertical axis) on the wafer surface as a function of radial location (horizontal axis) for various modes of operation of the reactor of FIG. 1.

FIGS. 4A, 4B, 4C and 4D illustrate the beneficial effects realized using the inner coil 60 only at a low chamber pressure (30 mT). FIG. 4A illustrates measured etch rate (vertical Z axis) as a function of location (horizontal X and Y axes) on the surface of the wafer 20. FIG. 4A thus illustrates the spatial distribution of the etch rate in the plane of the wafer surface. The center-high non-uniformity of the etch rate distribution is clearly seen in FIG. 4A. FIG. 4A corresponds to the case in which no magnetic field is applied, and therefore illustrates a non-uniform etch rate distribution that is inherent in the reactor and needs correction. The etch rate has a standard deviation of 5.7% in this case. In FIGS. 4 and 5, the magnetic field strength will be described as the axial field near the center of the wafer although it is to be understood that the radial field is the one that works on the radial distribution of plasma ion density to improve uniformity. The axial field is chosen in this description because it is more readily measured. The radial field at the edge of the wafer typically is about one third the axial field at this location.

Figure 4B:
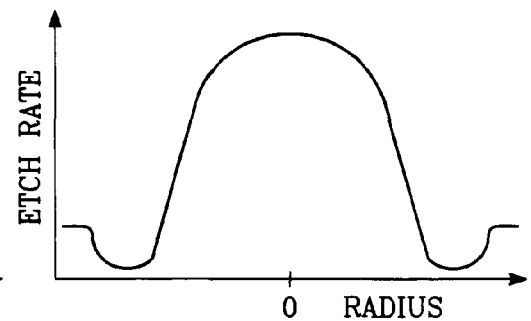

FIG. 4B illustrates how the etch rate distribution changes when the inner coil 60 has been energized to generate a magnetic field of 9 Gauss. The non-uniformity decreases to a standard deviation of 4.7%.

Figure 4C:
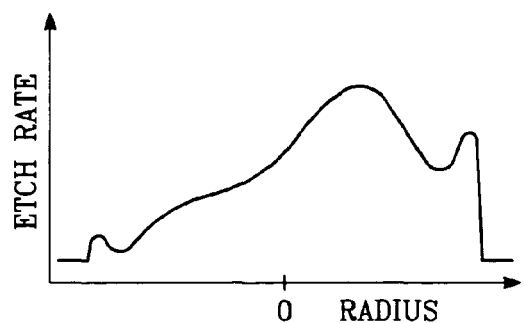

In FIG. 4C the magnetic field of the inner coil 60 has been increased to 18 Gauss, and it can be seen that the peak at the center has been greatly diminished, with the result that the etch rate standard deviation across the wafer is reduced to 2.1%.

Figure 4D:
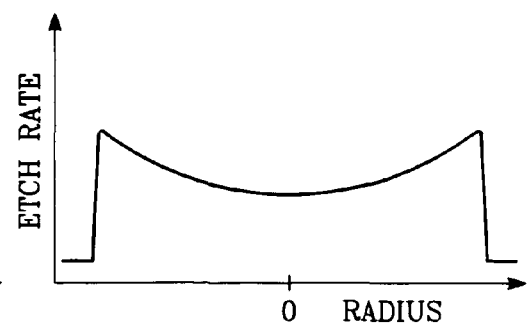

In FIG. 4D the magnetic field of the inner coil 60 has been further increased to 27 Gauss, so that the center high pattern of FIG. 4A has been nearly inverted to a center low pattern. The standard deviation of the etch rate across the wafer surface in the case of FIG. 4D was 5.0%.

Figure 5A:
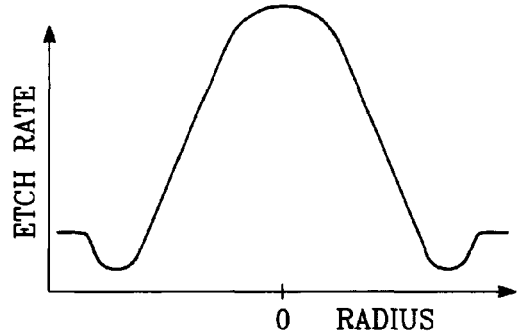
FIGS. 5A, 5B, 5C and 5D are graphs of the etch rate (vertical axis) on the wafer surface as a function of radial location (horizontal axis) for further modes of operation of the reactor of FIG. 1.

FIGS. 5A, 5B, 5C and 5D illustrate the beneficial effects of using both the coils 60, 65 at higher chamber pressures (200 mT). FIG. 5A corresponds to FIG. 4A and depicts the center-high etch rate non-uniformity of the reactor uncorrected by a magnetic field. In this case, the standard deviation of the etch rate across the wafer surface was 5.2%.

Figure 5B:
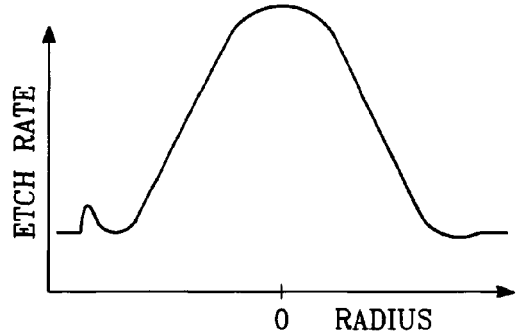

In FIG. 5B, the outer coil 65 has been energized to produce a 22 Gauss magnetic field, which decreases somewhat the center peak in the etch rate distribution. In this case, the etch rate standard deviation has been decreased to 3.5%.

Figure 5C:
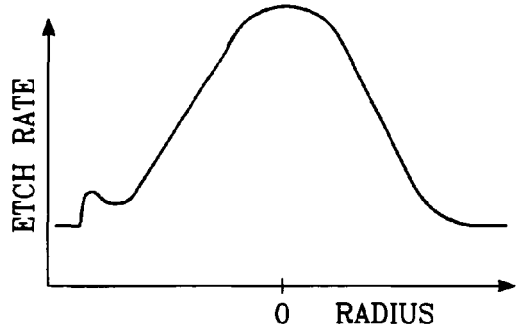

In FIG. 5C, both coils 60, 65 are energized to produce a 24 Gauss magnetic field. The result seen in FIG. 5C is that the center peak in the etch rate distribution has been significantly decreased, while the etch rate near the periphery has increased. The overall effect is a more uniform etch rate distribution with a low standard deviation of 3.2%.

Figure 5D:
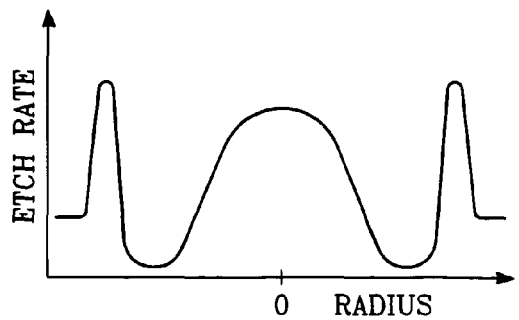

In FIG. 5D, both coils are energized to produce a 40 Guass magnetic field, producing an over-correction, so that the etch rate distribution across the wafer surface has been transformed to a center-low distribution. The etch rate standard deviation in this latter case has risen slightly (relative to the case of FIG. 5C) to 3.5%.

Comparing the results obtained in the low pressure tests of FIGS. 4A-4D with the high pressure tests of FIGS. 5A-5D, it is seen that the higher chamber pressure requires a much greater magnetic field to achieve a similar correction to etch rate non-uniform distribution. For example, at 30 mT an optimum correction was obtained using only the inner coil 60 at 18 Gauss, whereas at 300 mT a magnetic field of 24 Gauss using both coils 60, 65 was required to achieve an optimum correction.

Figure 6:
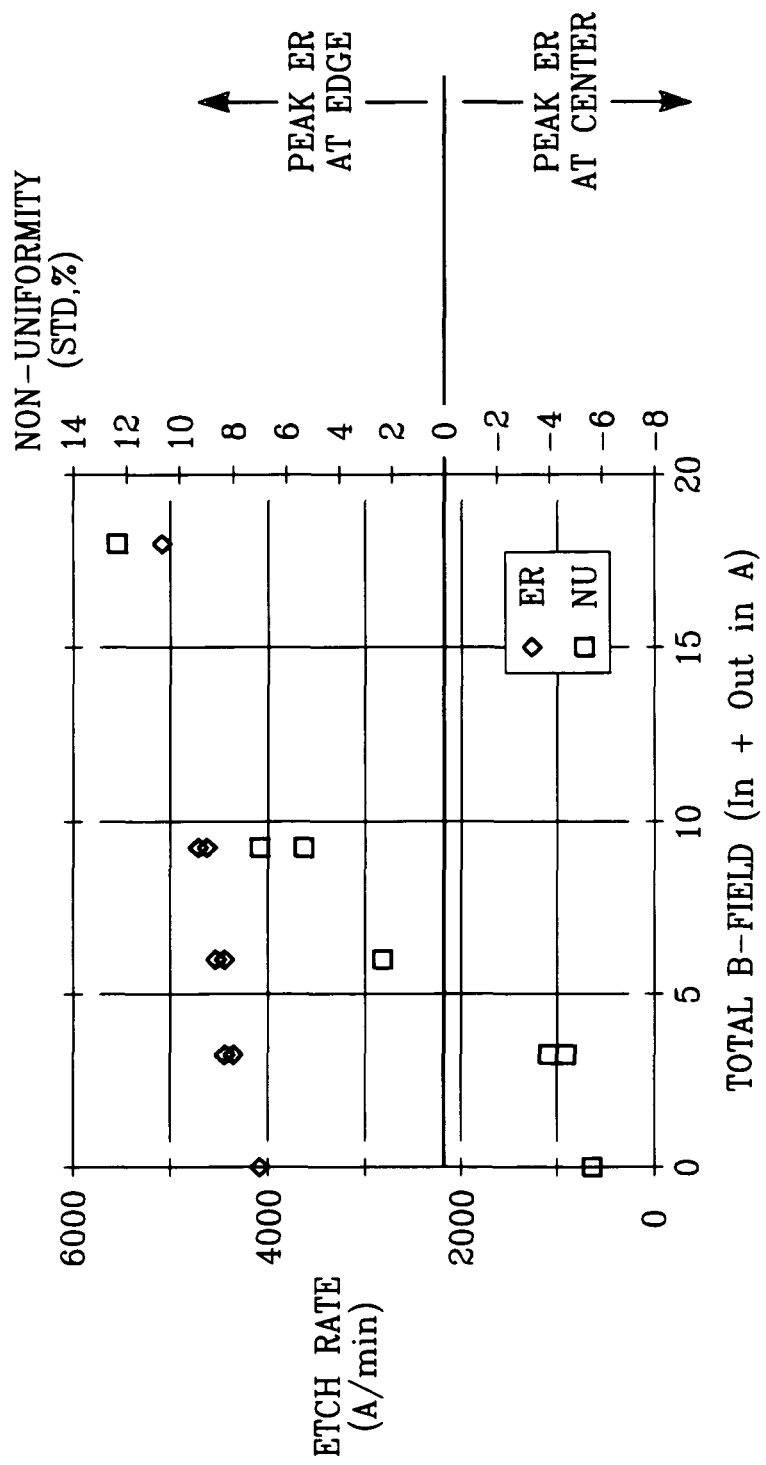
FIG. 6 is a graph depicting etch rate as a function of magnetic field.

FIG. 6 shows that the magnetic fields of the overhead coils greatly affect the uniformity of plasma ion density or etch rate distribution, but do not greatly affect etch rate itself. This is an advantage because, while it is desirable to improve uniformity of etch rate distribution, it is preferable to not change the etch rate chosen for a particular semiconductor process. In FIG. 6, the diamond symbols depict measured etch rate (left-hand vertical axis) as a function of magnetic field (horizontal axis), while the square symbols depict standard deviation (non-uniformity) of the etch rate (right-hand vertical scale) as a function of the magnetic field. The change in non-uniformity over the illustrated range is about one order of magnitude, the change in etch rate is only about 25%.

Figure 7:
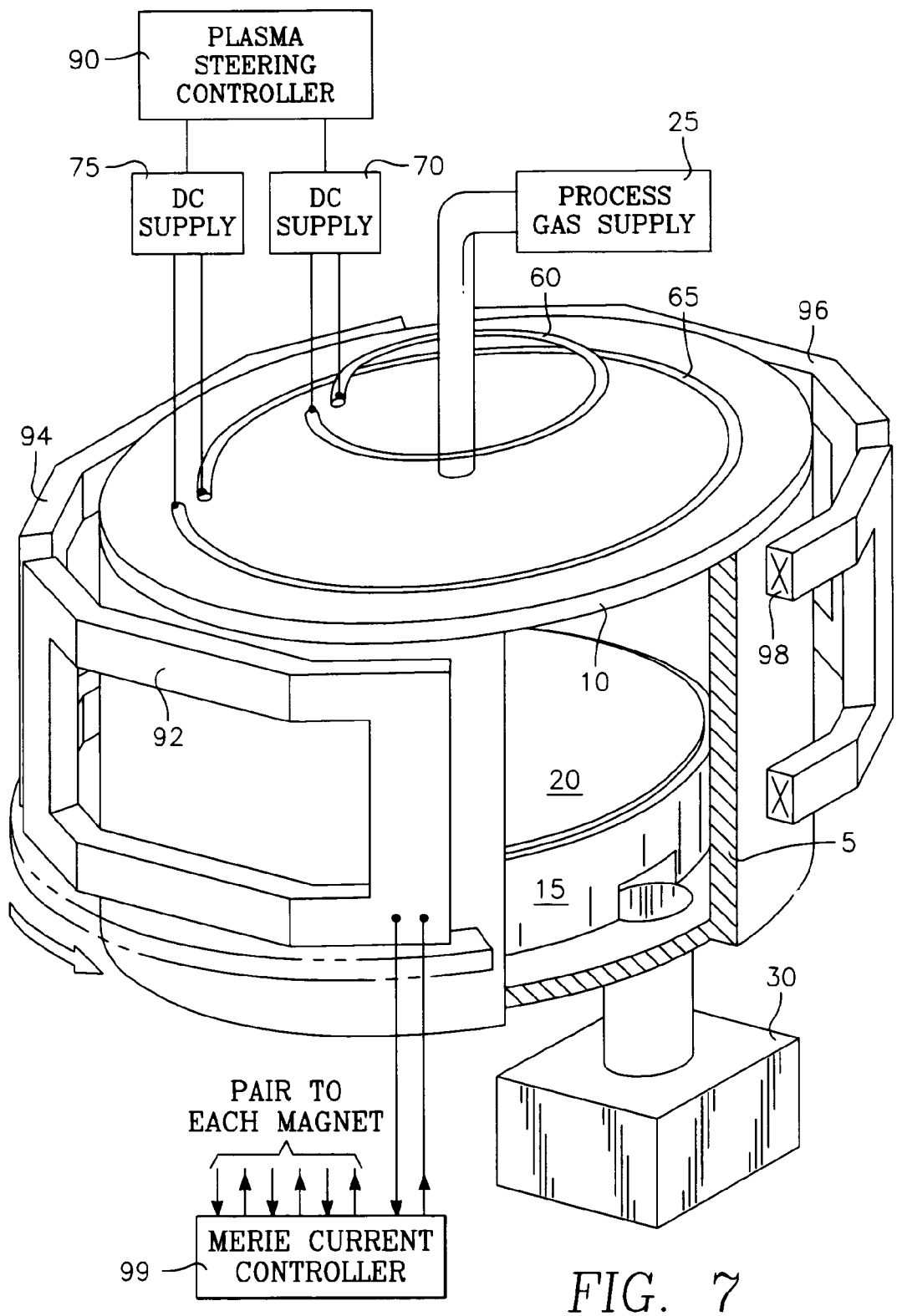
FIGS. 7 and 8 illustrate the reactor of FIG. 1A with MERIE magnets.
Figure 8:
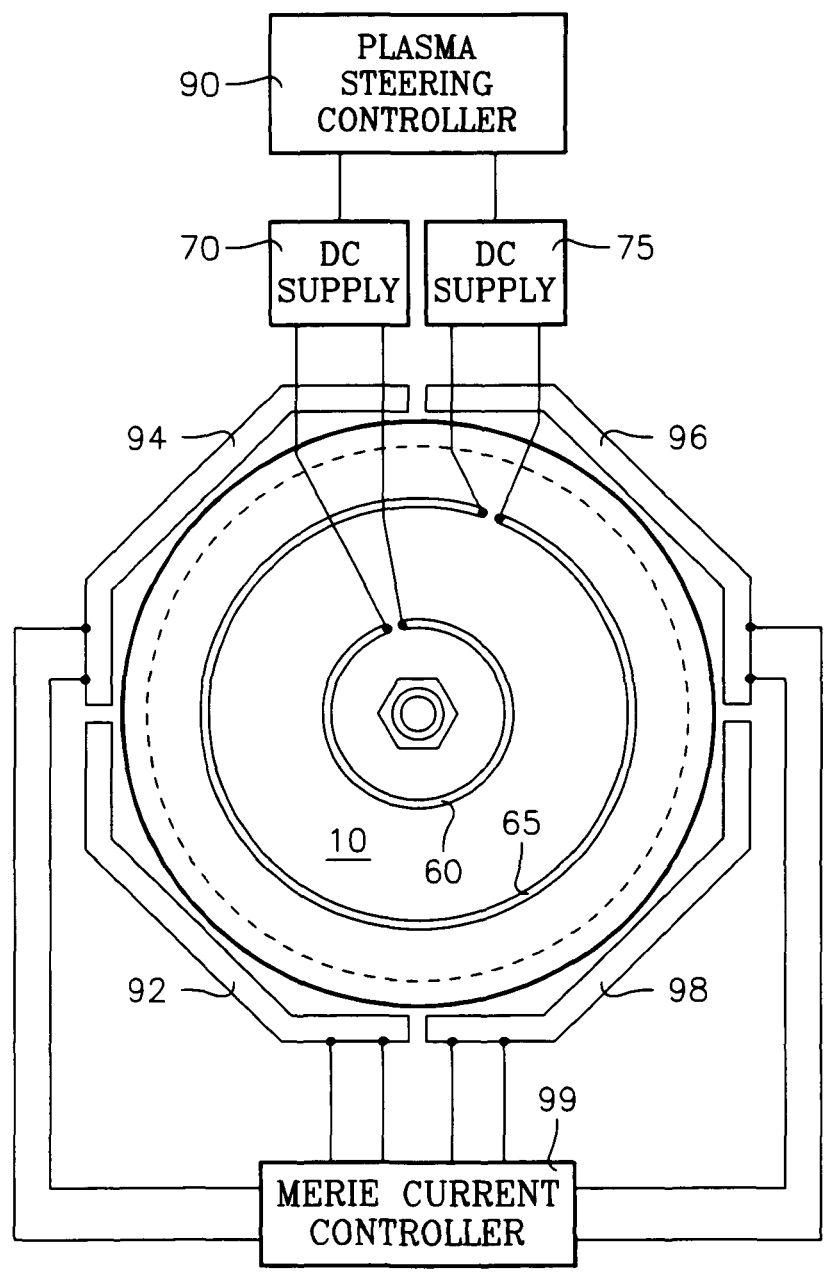

The overhead coil inductors 60, 65 of FIGS. 1A, 1B and 1C may be used with a conventional MERIE reactor. FIGS. 7 and 8 illustrate an case corresponding to FIG. 1A with the additional feature of four conventional MERIE electromagnets 92, 94, 96, 98 and an MERIE current controller 99. The current controller 99 provides A.C. currents to the respective MERIE electromagnets 92, 94, 96, 98. The respective currents are of the same low frequency but have their phases offset by 90 degrees so as to produce a slowly rotating magnetic field within the chamber in the conventional way.

Controlling Plasma Distribution With The Overhead Coils:

In accordance with a method of the reactor, plasma ion density distribution across the wafer surface that is inherent in a particular reactor is tailored in a particular way by selecting a particular the magnetic field produced by the overhead coils 60, 65. For example, the plasma distribution may be tailored to produce a more uniform etch rate distribution across the wafer surface. This tailoring is accomplished, for example, by programming the controller 90 to select optimum polarities and amplitudes of the D.C. current flow in the overhead coils. While the present example concerns a reactor with only two concentric overhead coils (i.e., the coils 60 and 65), the method can be carried out with more than two coils, and may provide more accurate results with a greater number of overhead coils. The magnetic field is tailored by the controller 90 to change the plasma ion density distribution across the wafer surface, which in turn affects the etch rate distribution.

A first step is to measure the etch rate distribution across the wafer surface in the absence of any corrective magnetic field from the overhead coils 60, 65. A next step is to determine a change in the plasma ion density distribution that renders the etch rate distribution more uniform. A final step is to determine a magnetic field that would produce the desired change in plasma ion density distribution. Given this magnetic field, the magnitudes and directions of the currents in the overhead coils 60, 65 necessary to produce such a field can be computed from well-known static magnetic field equations.

We have found a way of computing, from the magnetic field, pressure exerted by the magnetic field of the overhead coils 60, 65 on the plasma (the so-called "magnetic pressure"). This will be discussed below. The magnetic pressure on the plasma produces a change in plasma ion density distribution. This change in plasma ion density distribution produces a proportional change in etch rate distribution across the wafer surface, which can be directly observed. The plasma ion density distribution across the wafer surface and the etch rate distribution are therefore at least roughly related by a factor of proportionality.

Initially, the spatial distribution of the etch rate across the wafer surface is measured prior to the application of magnetic fields from the overhead coils 60, 65. From this, a desired change in etch rate distribution (to achieve a uniform distribution) can be determined. Next, the spatial distribution of the magnetic field produced by each overhead coil 60, 65 as a function of location within the chamber and current flow in the coil is determined analytically from the geometry of each coil. Then, by applying a known set of currents to the coils and then measuring the resulting change in etch rate distribution across the wafer surface, a linear scale factor can be deduced that relates the vector sum of the magnetic fields from all the coils at the wafer surface to the change in etch rate distribution at the wafer surface. (This scale factor is generally a function of neutral pressure in the plasma and is operative up to about 500 mT chamber pressure.) Therefore, given a desired change or correction in etch rate distribution (to achieve better uniformity), the necessary magnetic fields can be found (in a manner described later in this specification), and the corresponding coil currents can be inferred therefrom using the magnetic field spatial distribution function previously determined analytically.

The desired correction to the non-uniformity in etch rate distribution can be established in a variety of ways. For example, the 2-dimensional etch rate distribution across the wafer surface can be subtracted from a uniform or average etch rate to produce a "difference" distribution. The non-uniformities in etch rate distribution to be corrected in this method are the result of various factors in the reactor chamber, including non-uniform application of the capacitively coupled source power, non-uniform process gas distribution as well as non-uniform plasma ion density distribution. In the foregoing method, the non-uniformities are corrected by changing the plasma ion density distribution by magnetic pressure.

The following method can also be employed to establish a "corrected" plasma distribution that is non-uniform in some desired way. In this case, the correction to be made is the difference between the "uncorrected" or ambient plasma ion density distribution and the desired distribution (that is itself non-uniform). Thus, the method is useful for making the plasma density distribution either more uniform or of a particular selected density distribution pattern that is not necessarily uniform.

A series of steps for carrying out the foregoing method will now be described with reference to FIG. 9.

The first step (block 910 of FIG. 9) is to analytically determine, for each one of the overhead coils 60, 65, the expression for the magnetic field at the wafer surface as a function of current flow in the coil and radial location on the wafer surface. Using cylindrical coordinates, this expression may be written, for the $i^{th}$ coil, as $B_i(r, z=\text{wafer}, I_i)$. It is determined from the Biot-Savart law in a very straight-forward manner.

The next step (block 920 of FIG. 9) is carried out with no current flowing in the overhead coils 60, 65. In this step, the spatial distribution of plasma ion density across the wafer surface is measured. This spatial distribution may be written as $n(r, z=\text{wafer})$. In this step, the plasma ion density distribution can be measured indirectly by measuring the etch rate distribution across the surface of a test wafer. The skilled worker can readily infer the plasma ion density distribution from the etch rate distribution.

Next, in the step of block 930, a correction, $c(r)$, to the measured plasma ion density spatial distribution function $n(r, z=\text{wafer})$ measured in the previous step is determined. The correction $c(r)$ may be defined in any number of appropriate ways. For example, it may be defined as the maximum value $n(r, z=\text{wafer})_{max}$ minus $n(r, z=\text{wafer})$. In this way, adding $c(r)$ to $n(r, z=\text{wafer})$ produces a "corrected" distribution with a uniform amplitude equal to $n(r)_{max}$. Of course, the correction function c(r) may be defined differently to produce a different uniform amplitude. Or, as briefly noted above, if the desired distribution is non-uniform, then the correction is the difference between the desired distribution and n(r, z=wafer).

The next step (block 940) is to select a "test" current $I_i$ for each of the overhead coils 60, 65 and apply that current to the appropriate coil and measure the resulting plasma ion distribution, which may be written n(r, z=wafer)$_{test}$. The change in ion distribution $\Delta$n(r) is obtained by subtracting the ion distributions measured with and without the magnetic field:

$$\Delta n(r) = n(r, z=\text{wafer}) - n(r, z=\text{wafer})_{test}$$

The next step (block 950) is to compute a scale factor S relating the pressure gradient exerted by the magnetic field (i.e., the magnetic pressure) to the change in ion distribution $\Delta$n(r). This computation is performed by dividing the magnetic pressure gradient by $\Delta$n(r). The magnetic pressure gradient of the magnetic field B(r, z=wafer, $I_i$) of the $i^{th}$ coil is computed individually for each of the coils in accordance with the magneto-hydrodynamics equation:

$$\nabla_r P \approx -\nabla_r [B(r, z=\text{wafer}, I_i)^2/2\mu_0]$$

where the subscript r denotes radial component. The results thus obtained for each coil individually are then summed together. Therefore, the total magnetic pressure gradient is:

$$-\nabla_r \{\Sigma_i [B(r, z=\text{wafer}, I_i)^2/2\mu_0]\}$$

Therefore, the scale factor S is:

$$S = \{-\nabla_r \{\Sigma_i [B(r, z=\text{wafer}, I_i)^2/2\mu_0]\}\}/\Delta n(r)$$

This division operation may be carried out at different values of r and the results averaged to obtain S in scalar form. Otherwise, the scale factor S will be a function of r and used in the appropriate manner.

The scale factor S found in the step of block 950 is a link between the coil currents $I_i$ that determine the magnetic pressure and a resulting change in ion distribution. Specifically, given a set of coil currents $I_i$, a corresponding change in ion distribution n(r) can be computed by multiplying the magnetic pressure determined from the set of $I_i$ by the scale factor S:

$$\Delta n(r) = \{-\nabla_r \{\Sigma_i [B(r, z=\text{wafer}, I_i)^2/2\mu_0]\}\}/S$$

This fact provides the basis for the following step (block 960) in which a computer (such as the microprocessor 91) uses the foregoing equation to search for a set of coil currents $I_i$ that produces the best approximation to previously specified or desired change in plasma ion density distribution, $\Delta$n(r). In this case, the desired change is equal to the correction function c(r) computed in the step of block 930. In other words, the computer searches for a set of coil currents $I_i$ that satisfies the following condition:

$$\{-\nabla_r \{\Sigma_i [B(r, z=\text{wafer}, I_i)^2/2\mu_0]\}\} = c(r)S$$

This search may be carried out by well-known optimization techniques involving, for example, the method of steepest descents. Such techniques are readily carried out by the worker skilled in this field and need not be described here.

The magnitudes and polarities of the set of coil currents $I_i$ discovered by the search are then sent to the controller 90, which in turn applies these currents to the respective coils 60, 65.

Figure 10:
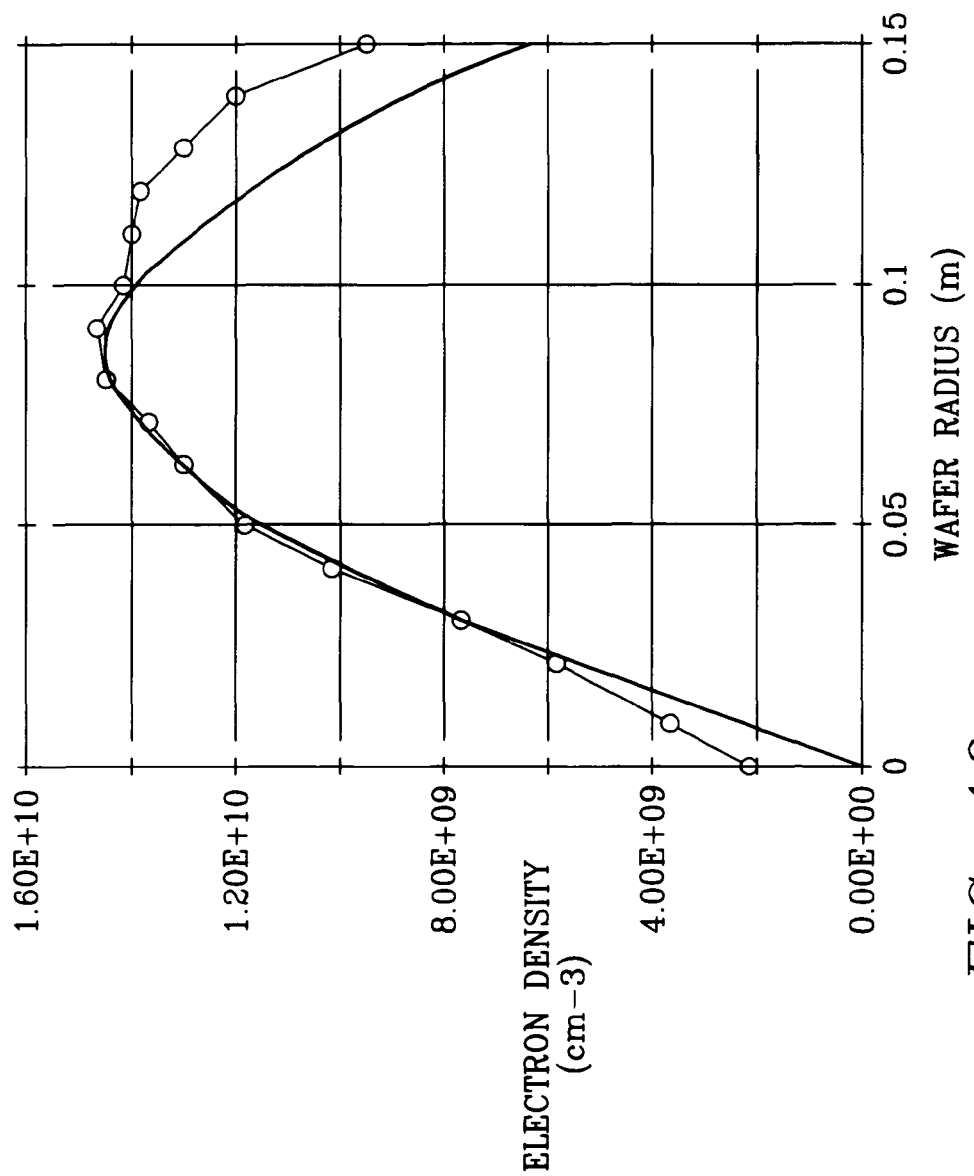
FIG. 10 is a graph illustrating a comparative example of magnetic pressure and ion or electron density as functions of radial location on the wafer surface in the reactor of FIG. 1A.

FIG. 10 compares magnetic pressure (solid line) with the measured change in plasma ion distribution (dotted line) as a function of radial position at the wafer surface. As discussed above, the magnetic pressure is the gradient of the square of the magnetic fields of the overhead coils. FIG. 10 indicates that there is good correlation between magnetic pressure and change in ion density distribution.

Figure 11:
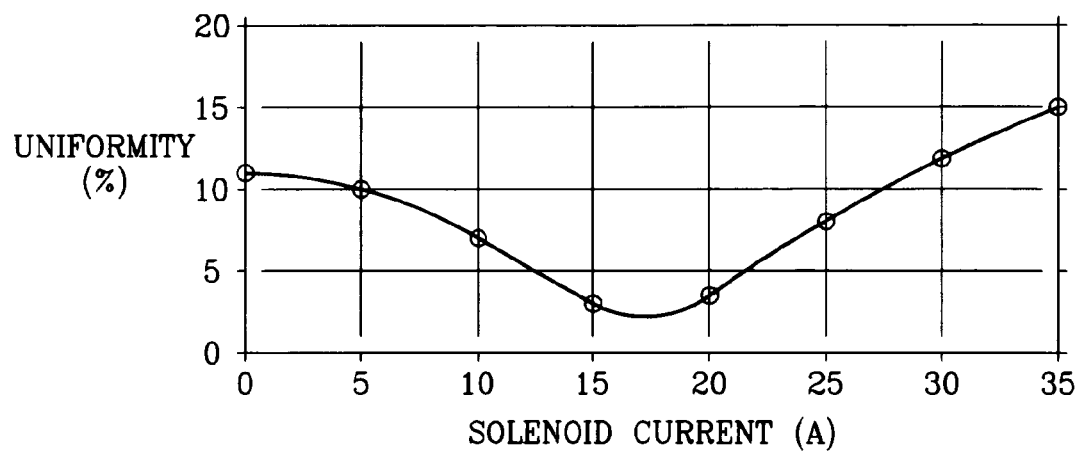
FIG. 11 is a graph depicting etch rate non-uniformity as a function of coil current.
Figure 12:
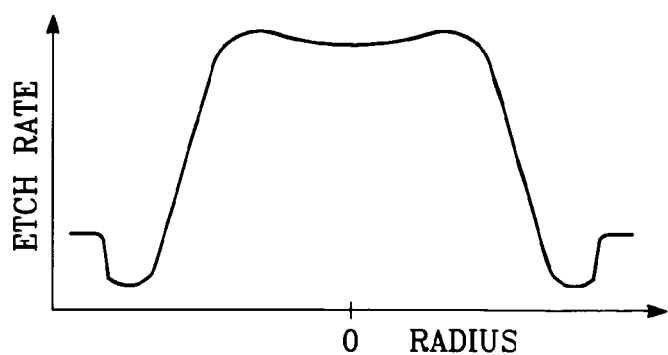
FIG. 12 illustrates radial ion distribution at zero coil current in the example of FIG. 11.

The application of such a method is illustrated in FIGS. 11-14. FIG. 11 illustrates how non-uniformity or the standard deviation (vertical axis) in the etch rate spatial distribution at the wafer surface varied with coil current in one of the overhead coils. At zero coil current, the standard deviation was about 12%, and the ion distribution was center-high as shown in FIG. 12.

Figure 13A:
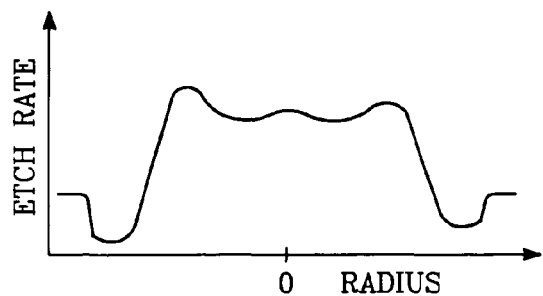
FIGS. 13A and 13B compare measured and predicted etch rate distributions at a coil current of about 11 amperes in the example of FIG. 11.
Figure 13B:
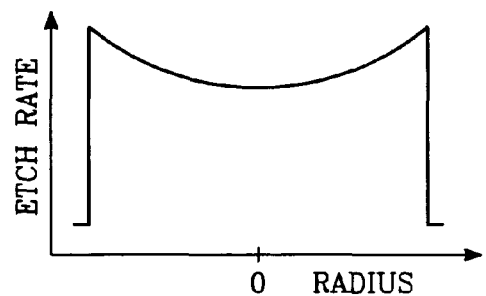

The minimum non-uniformity at about 3% was achieved at a coil current of about 17 amperes. This represents an improvement by about a factor of four (i.e., 12% to 3% standard deviation in the etch rate distribution). The actual or measured etch rate distribution was as shown in FIG. 13A, while the etch rate distribution predicted using the techniques of FIG. 9 was as shown in FIG. 13B.

Figure 14A:
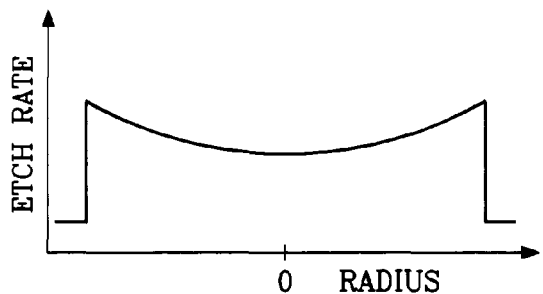
FIGS. 14A and 14B compare measured and predicted etch rate distributions at a coil current of about 35 amperes in the example of FIG. 11.
Figure 14B:
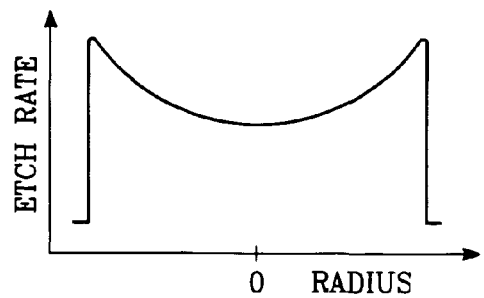

At the high coil current of 35 amperes, the etch rate distribution standard deviation was about 14%. The measured etch rate spatial distribution was as shown in FIG. 14A while the predicted distribution was as shown in FIG. 14B.

Referring again to FIG. 13A, the most uniform ion distribution obtained is certainly not flat and in fact has "bowl" shape, being concave near the periphery and convex near the center. It is possible that with a greater number of independent overhead coils (e.g., three or more), the optimization of currents may be carried out with greater resolution and better uniformity in results. Therefore, the reactor is not limited to the cases having only two coils. The reactor may be implemented with varying results using less than or more than two overhead coils.

Figure 15:
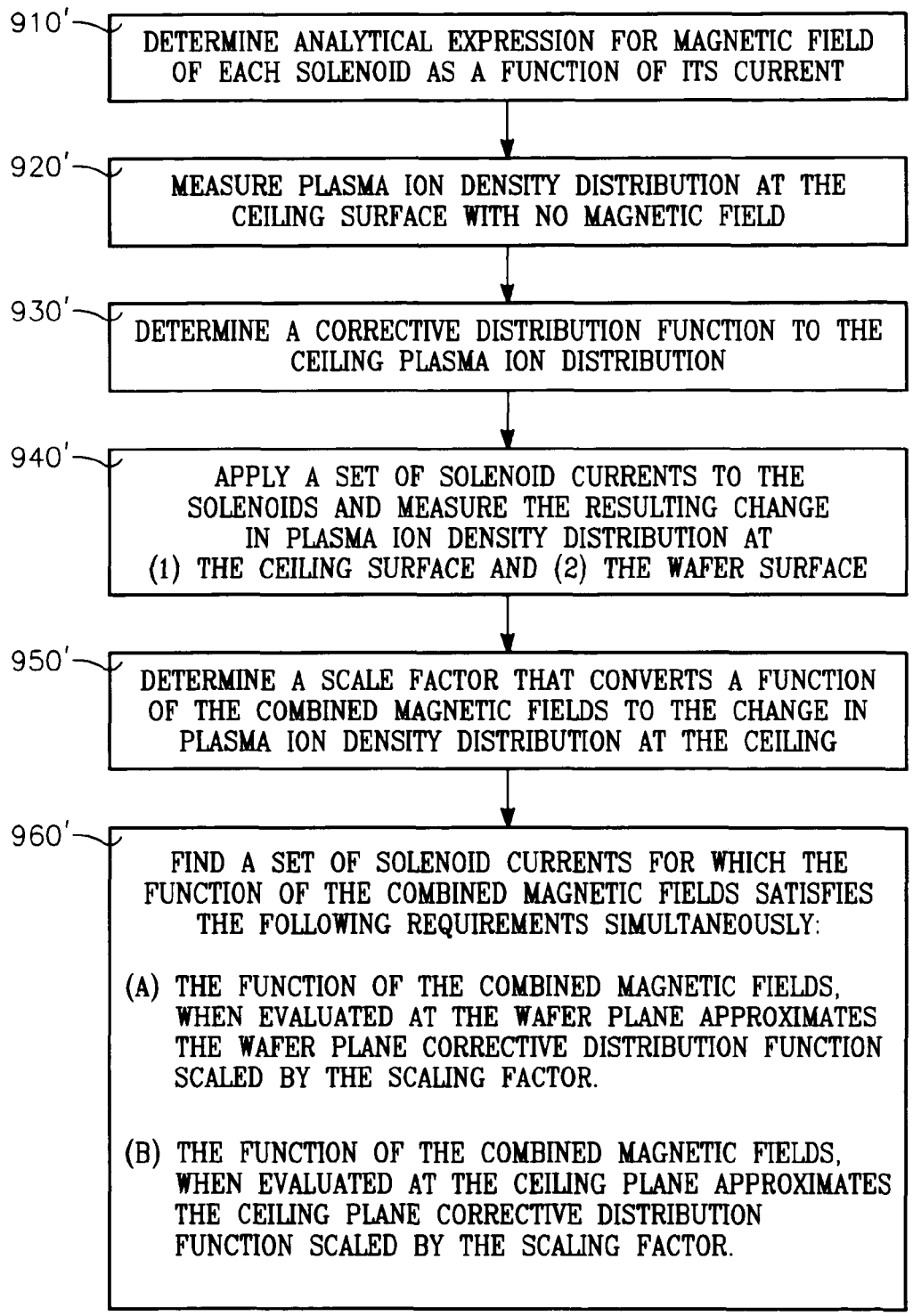
FIG. 15 depicts a further method of operating the reactor of FIG. 1A.

The same method may be applied in order to control plasma ion density distribution or etch rate distribution at the ceiling surface. Such an approach may be useful during chamber cleaning operations, for example. FIG. 15 illustrates a version of the method of FIG. 9 in which uniformity of the spatial distribution of ion density (or, etch rate) is optimized. The steps of FIG. 15, namely blocks 910', 920', 930', 940', 950' and 960' are the same as the steps of FIG. 9, namely blocks 910, 920, 930, 940, 950 and 960, except that they are carried out for the ceiling plane. rather than the wafer plane:

The first step (block 910' of FIG. 15) is to analytically determine, for each one of the overhead coils 60, 65, the expression for the magnetic field at the ceiling surface as a function of current flow in the coil and radial location on the wafer surface. Using cylindrical coordinates, this expression may be written, for the $i^{th}$ coil, as $B_i$(r, z=ceiling, $I_i$). It is determined from simple static magnetic field equations and is a function not only of coil current $I_i$ and radial location r on the ceiling surface but also of certain constants such as the radius of the coil and the distance, z=ceiling, between the coil and the ceiling interior surface.

The next step (block 920' of FIG. 15) is carried out with no current flowing in the overhead coils 60, 65. In this step, the spatial distribution of plasma ion density across the ceiling surface is measured. This spatial distribution may be written as n(r, z=ceiling). In this step, the plasma ion density distribution can be measured by a conventional probe or other indirect techniques.

Next, in the step of block 930', a correction, c'(r), to the measured plasma ion density spatial distribution function n(r, z=ceiling) measured in the previous step is determined. (It should be noted that the prime notation ' is employed here to distinguish the computations of FIG. 15 from those of FIG. 9 described above, and does not connote a derivative as used herein.) The correction c'(r) may be defined in any number of appropriate ways. For example, it may be defined as the maximum value n(r, z=ceiling)$_{max}$ minus n(r, z=ceiling). In this way, adding c'(r) to n(r, z=ceiling) produces a "corrected" distribution with a uniform amplitude equal to $n(r)_{max}$. Of course, the correction function c'(r) may be defined differently to produce a different uniform amplitude. Also, if a particular non-uniform distribution is desired, then the correction is the difference between the uncorrected or ambient plasma distribution n(r, z=ceiling) and the desired non-uniform distribution. Thus, the method can be employed to establish either a desired plasma ion distribution having a particular non-uniform pattern or to establish a uniform plasma ion density distribution.

The next step (block 940') is to select a "test" current $I_i$ for each of the overhead coils 60, 65 and apply that current to the appropriate coil and measure the resulting plasma ion distribution, which may be written $n(r, z=\text{ceiling})_{test}$. The change in ion distribution $\Delta n(r)$ is obtained by subtracting the ion distributions measured with and without the magnetic field:

$$\Delta n'(r) = n(r, z=\text{ceiling}) - n(r, z=\text{ceiling})_{test}$$

The next step (block 950') is to compute a scale factor S' relating the pressure gradient exerted by the magnetic field (i.e., the magnetic pressure) to the change in ion distribution $\Delta n'(r)$. This computation is performed by dividing the magnetic pressure gradient by $\Delta n'(r)$. The magnetic pressure gradient of the magnetic field $B(r, z=\text{ceiling}, I_i)$ of the $i^{th}$ coil is computed individually for each of the coils in accordance with the magneto-hydrodynamics equation:

$$\nabla_r P = -\nabla_r [B(r, z=\text{ceiling}, I_i)^2/2\mu_0]$$

where the subscript r denotes radial component. The results thus obtained for each coil individually are then summed together. Therefore, the total magnetic pressure gradient is:

$$-\nabla_r \{\Delta_i [B(r, z=\text{wafer}, I_i)^2/2\mu_0]\}$$

Therefore, the scale factor S is:

$$S' = \{-\nabla_r \{\Sigma_i [B(r, z=\text{wafer}, I_i)^2/2\mu_0]\}\}/\Delta n'(r)$$

The scale factor S' found in the step of block 950' is a link between the coil currents $I_i$ that determine the magnetic pressure and a resulting change in ion distribution. Specifically, given a set of coil currents $I_i$, a corresponding change in ion distribution n'(r) can be computed by multiplying the magnetic pressure determined from the set of $I_i$ by the scale factor S':

$$\Delta n'(r) = \{-\nabla_r \{\Sigma_i [B(r, z=\text{wafer}, I_i)^2/2\mu_0]\}\}/S'$$

This fact provides the basis for the following step (block 960') in which a computer (such as the microprocessor 91) uses the foregoing equation to search for a set of coil currents $I_i$ that produces the best approximation to previously specified or desired change in plasma ion density distribution, $\Delta n'(r)$. In this case, the desired change is equal to the correction function c'(r) computed in the step of block 930'. In other words, the computer searches for a set of coil currents $I_i$ that satisfies the following condition:

$$\{-\nabla_r \{\Sigma_i [B(r, z=\text{wafer}, I_i)^2/2\mu_0]\}\} = c'(r)S'$$

This search may be carried out by well-known optimization techniques involving, for example, the method of steepest descents. Such techniques are readily carried out by the worker skilled in this field and need not be described here.

The magnitudes and polarities of the set of coil currents $I_i$ discovered by the search are then sent to the controller 90, which in turn applies these currents to the respective coils 60, 65.

With only a single overhead coil, the apparatus can be used to optimize plasma ion distribution uniformity at either the wafer or the ceiling but not both simultaneously. With at least two overhead coils (e.g., the overhead coils 60 and 65), plasma ion distribution uniformity can be at least approximately optimized at both the wafer and the ceiling simultaneously.

Steering Plasma With The Overhead Coils:

We have discovered that the coil currents $I_i$ may be selected in such a manner as to steer the plasma toward the ceiling and/or side walls or to steer it to the wafer surface. The coil currents $I_i$ may also be selected to improve uniformity of plasma density distribution at the ceiling surface in a manner similar to the method of FIG. 9. As a result, the plasma may be concentrated during processing on the wafer, and then during cleaning may be concentrated on the ceiling and/or side walls. By thus concentrating the plasma at the ceiling, cleaning time may be reduced.

Figure 16:
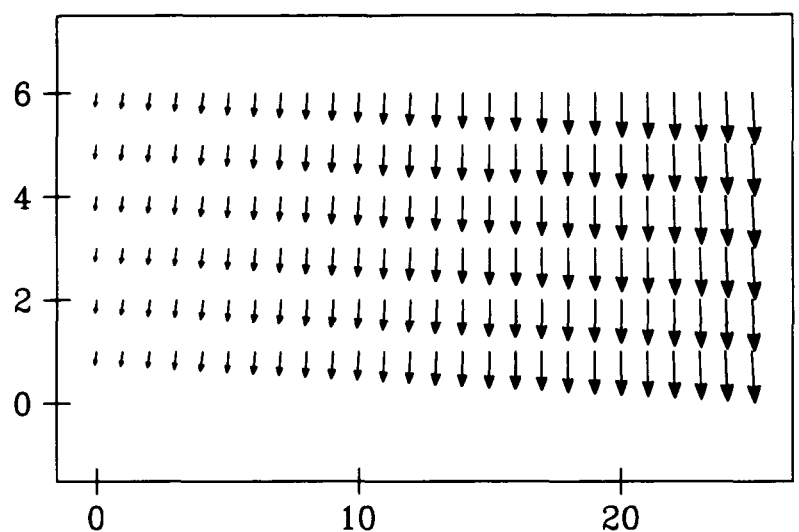
FIG. 16 illustrates a magnetic field distribution obtained in a reactor corresponding to FIG. 1A.
Figure 17:
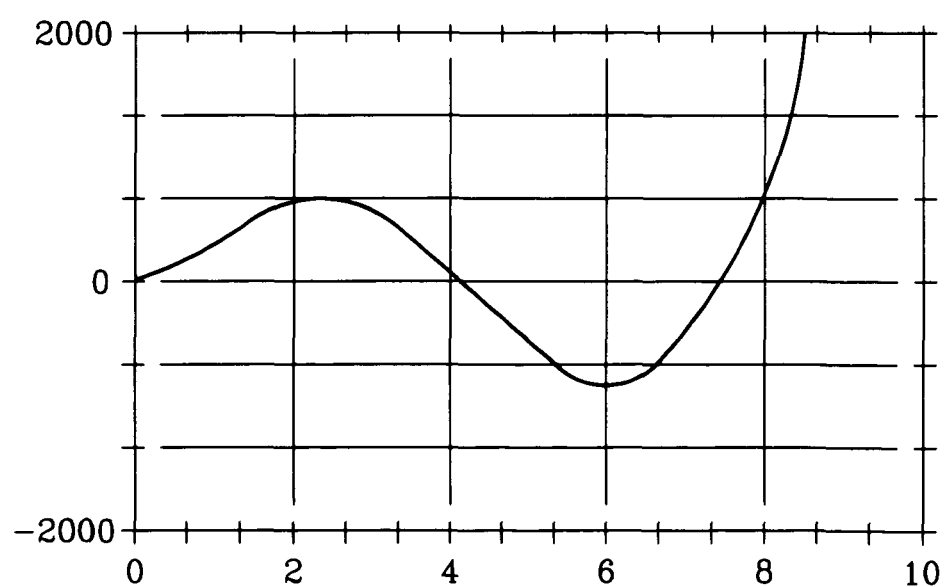
FIG. 17 depicts the gradient of the square of the magnetic field of FIG. 16 in the wafer plane.

In one example, the plasma was steered to the side wall of the chamber by the controller 90 applying a current of −17.5 amperes to the inner coil 60 and a current of +12.5 amperes to the outer coil 65. FIG. 16 illustrates a radial portion of the chamber interior extending along the horizontal axis from zero radius to the periphery of the chamber and extending along the vertical axis from the wafer surface to the ceiling. The small arrows in FIG. 16 indicate the magnitude and direction of the magnetic field at various locations in the chamber when the plasma is steered to the side wall of the chamber by the controller 90 applying a current of −17.5 amperes to the inner coil 60 and a current of +12.5 amperes to the outer coil 65. FIG. 17 illustrates the corresponding gradient of the square of the magnetic field at the wafer surface as a function of radial position.

Figure 18:
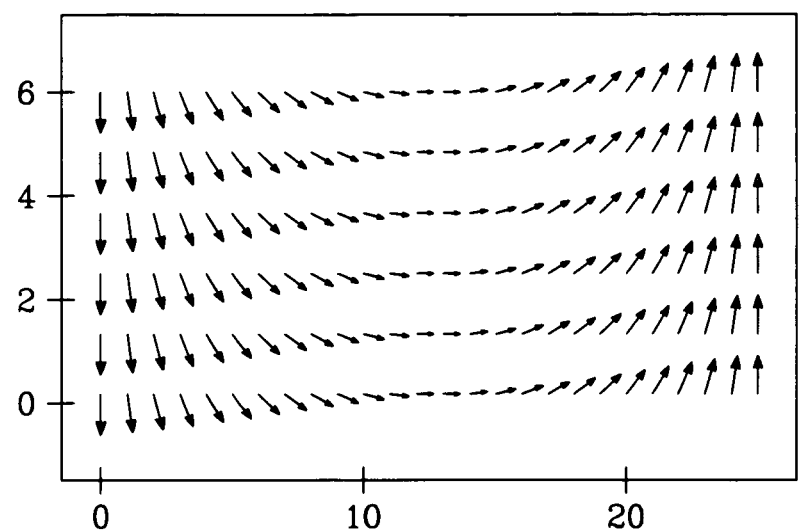
FIG. 18 illustrates another magnetic field distribution obtained in a reactor corresponding to FIG. 1A.
Figure 19:
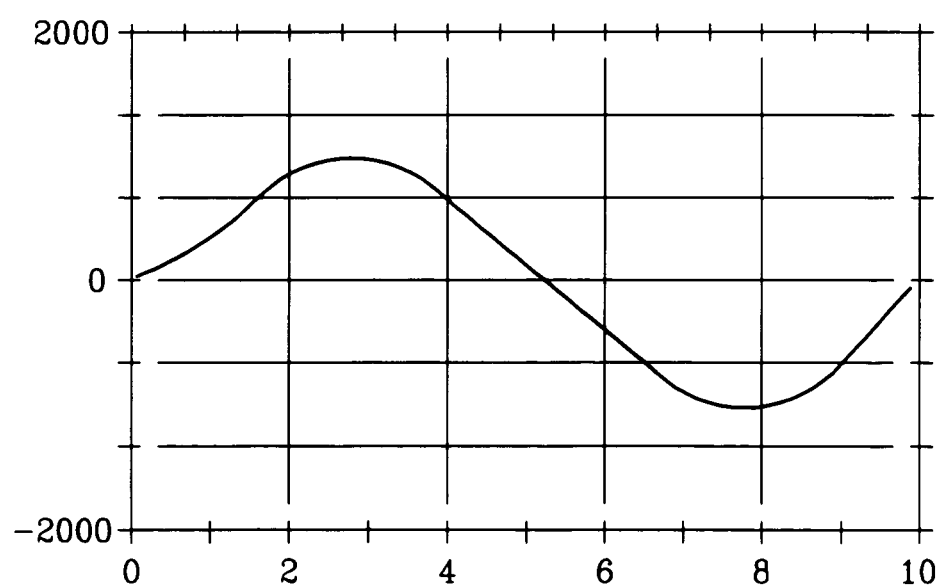
FIG. 19 depicts the gradient of the square of the magnetic field of FIG. 18 in the wafer plane.

In another example, the plasma was steered to the roof of the chamber by the controller 90 applying a current of −12.5 amperes to the inner coil 60 and a current of +5 amperes to the outer coil 65. FIG. 18 illustrates a radial portion of the chamber interior extending along the horizontal axis from zero radius to the periphery of the chamber and extending along the vertical axis from the wafer surface to the ceiling. The small arrows in FIG. 18 indicate the magnitude and direction of the magnetic field at various locations in the chamber when the plasma is steered to the side wall of the chamber by the controller 90 applying a current of −12.5 amperes to the inner coil 60 and a current of +5 amperes to the outer coil 65. FIG. 19 illustrates the corresponding gradient of the square of the magnetic field at the wafer surface as a function of radial position.

Figure 20:
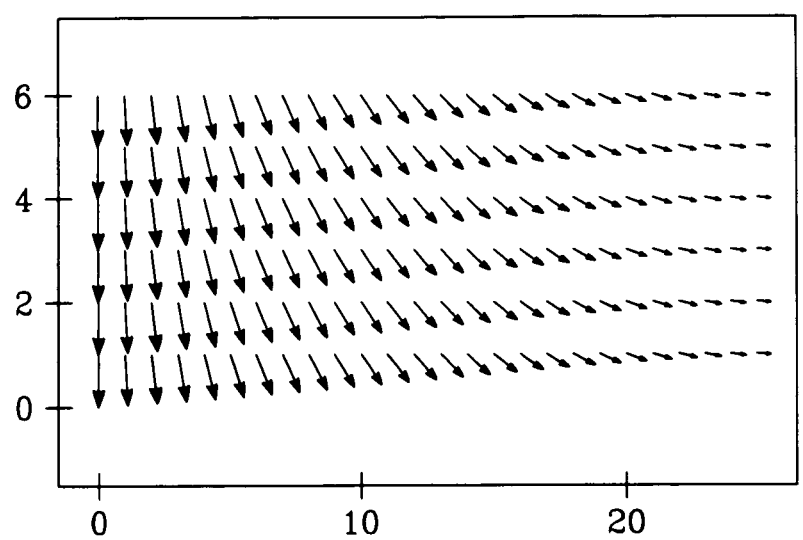
FIG. 20 illustrates a yet further magnetic field distribution obtained in a reactor corresponding to FIG. 1A.
Figure 21:
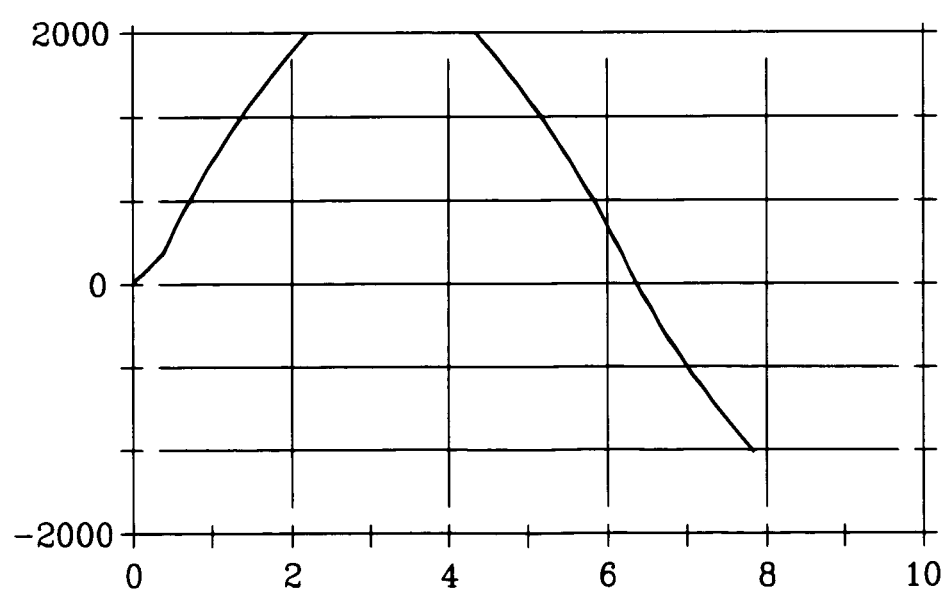
FIG. 21 depicts the gradient of the square of the magnetic field of FIG. 20 in the wafer plane.

In a further example, plasma was steered along field lines extending from the center of the ceiling to the side wall by the controller 90 applying a current of −25 amperes to the inner coil 60 and a current of +2.75 to the outer coil 65. FIG. 20 illustrates a radial portion of the chamber interior extending along the horizontal axis from zero radius to the periphery of the chamber and extending along the vertical axis from the wafer surface to the ceiling. The small arrows in FIG. 20 indicate the magnitude and direction of the magnetic field at various locations in the chamber when the plasma is steered to the side wall of the chamber by the controller 90 applying a current of −25 amperes to the inner coil 60 and a current of +2.5 amperes to the outer coil 65. FIG. 21 illustrates the corresponding gradient of the square of the magnetic field at the wafer surface as a function of radial position.

FIG. 17 shows that a high positive magnetic pressure on the plasma is exerted near the edge of the chamber when the plasma is steered to the edge. FIG. 19 shows that a low magnetic pressure on the plasma is exerted near the edge of the chamber when the plasma is directed to the edge of the ceiling. FIG. 21 shows that a high negative pressure is present near the chamber edge when the field lines extend from the ceiling to the edge.

Thus, the currents in the overhead coils 60, 65 may be chosen to direct the plasma to various locations in the chamber that may require cleaning, such as the ceiling and the side wall. Or, the plasma may be concentrated more near the wafer. In order to steer the plasma to either the wafer or the ceiling, or to apportion the plasma between the wafer and the ceiling in accordance with some steering ratio SR, a method such as that illustrated in FIG. 22 may be carried out.

Figure 22:
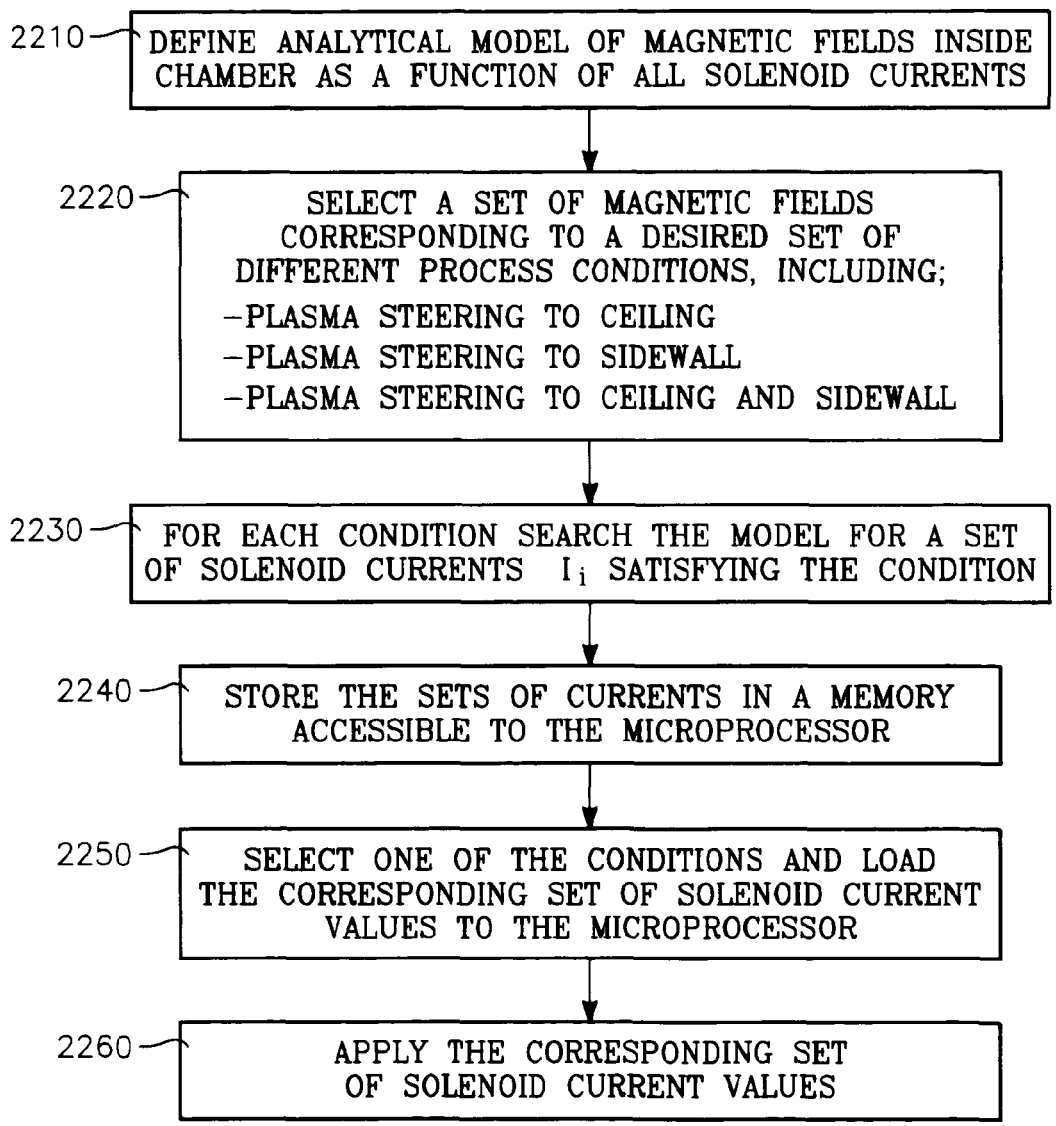
FIG. 22 depicts yet another method of operating the reactor of FIG. 1A.

Referring now to FIG. 22, the first step (block 2210 of FIG. 22) is to define an analytical model of the magnetic field inside the chamber as a function of all coil currents in the overhead coils (e.g., the pair of coils 60, 65). This is readily accomplished using static magnetic field equations by a worker skilled in this field, and need not be described here. The magnetic field is the sum of the individual magnetic fields from each of the coils. Each individual magnetic field is a function of the diameter of the respective coil, the location of each coil, the current flow in the coil and the location in the chamber. Thus, the magnetic field produced by the $i^{th}$ coil may be written as:

$$B(x, y, z, I_i)$$

so that the total magnetic field is:

$$\Sigma_i \{B(x, y, z, I_i)\}$$

The next step (block 2220) is to select a set of magnetic fields that fulfill a set of desired process conditions. For example, to steer plasma to the ceiling, a magnetic field is selected that produces a magnetic pressure on the plasma that pushes the plasma toward the ceiling, as illustrated in the example of FIG. 18. To steer the plasma toward the side wall, a magnetic field is chosen that produces a magnetic pressure on the plasma that pushes the plasma toward the periphery, as illustrated in FIG. 16.

For each magnetic field defined in the step of block 2220 above that fulfills a particular condition, a computer searches the model defined in the step of block 2210 for a set of coil currents that produce the desired magnetic field. This is the next step of block 2230. Each set of currents found in the step of block 2230 is stored along with the name of the corresponding condition in a memory location associated with the corresponding process condition (block 2240 of FIG. 22). Whenever a particular process condition is selected (e.g., steering the plasma to the ceiling), then the microprocessor 91 fetches the set of current values from the corresponding memory location (block 2250) and causes the corresponding currents to be applied to the appropriate coils (block 2260).

Figure 23:
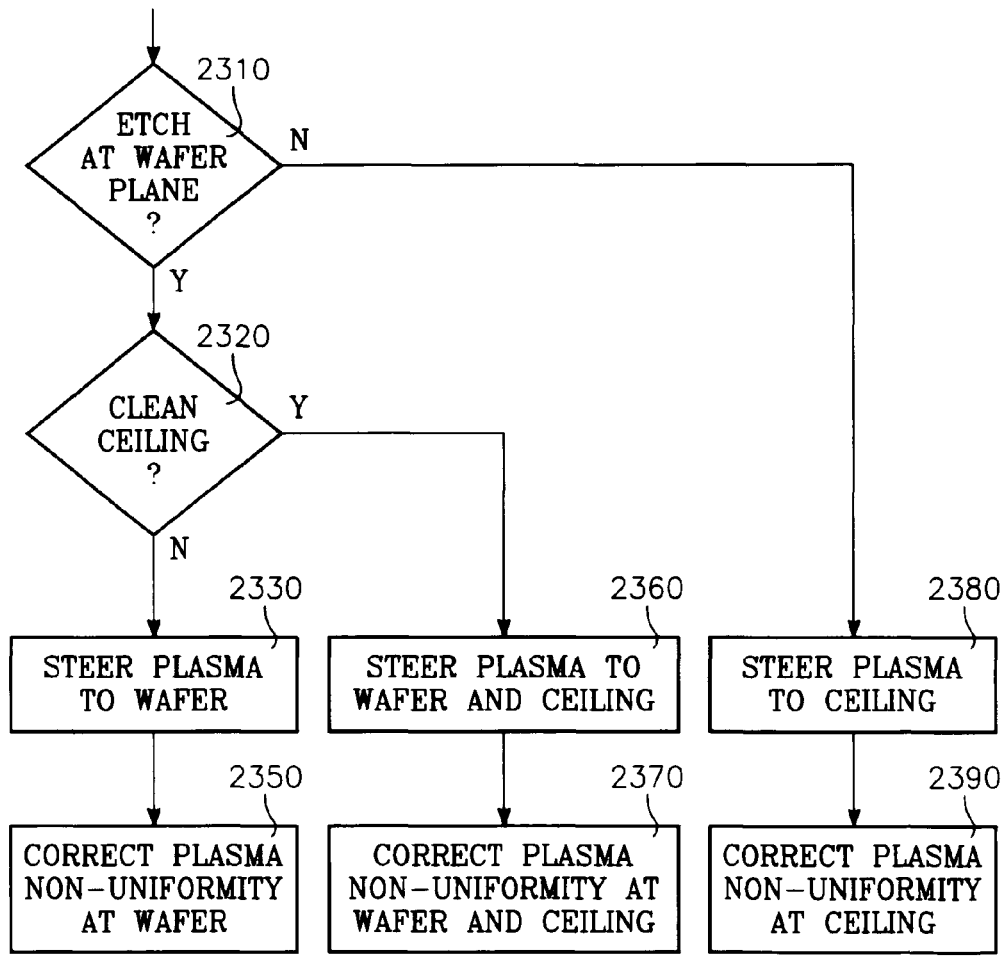
FIG. 23 illustrates an exemplary microcontroller operation for controlling the reactor of FIG. 1A.

FIG. 23 shows how the microprocessor 91 may be programmed to respond to user inputs. A determination is first made whether the processing includes etching of the wafer surface (block 2310 and whether the process includes cleaning (etching) the ceiling (block 2320). If only the wafer is to be etched, then the plasma is steered to the wafer (block 2330) and the plasma distribution uniformity at the wafer surface is optimized (block 2350) using the method of FIG. 9. If the wafer is to etched while the ceiling is to cleaned at the same time, then the plasma density is apportioned between the ceiling and the wafer (block 2360) and plasma density uniformity is optimized at the wafer surface as in FIG. 9 and at the ceiling as in FIG. 15 (block 2370). If only the ceiling is to be cleaned, then the plasma is steered to the ceiling (block 2380) and plasma density uniformity at the ceiling is optimized (block 2390).

Figure 24:
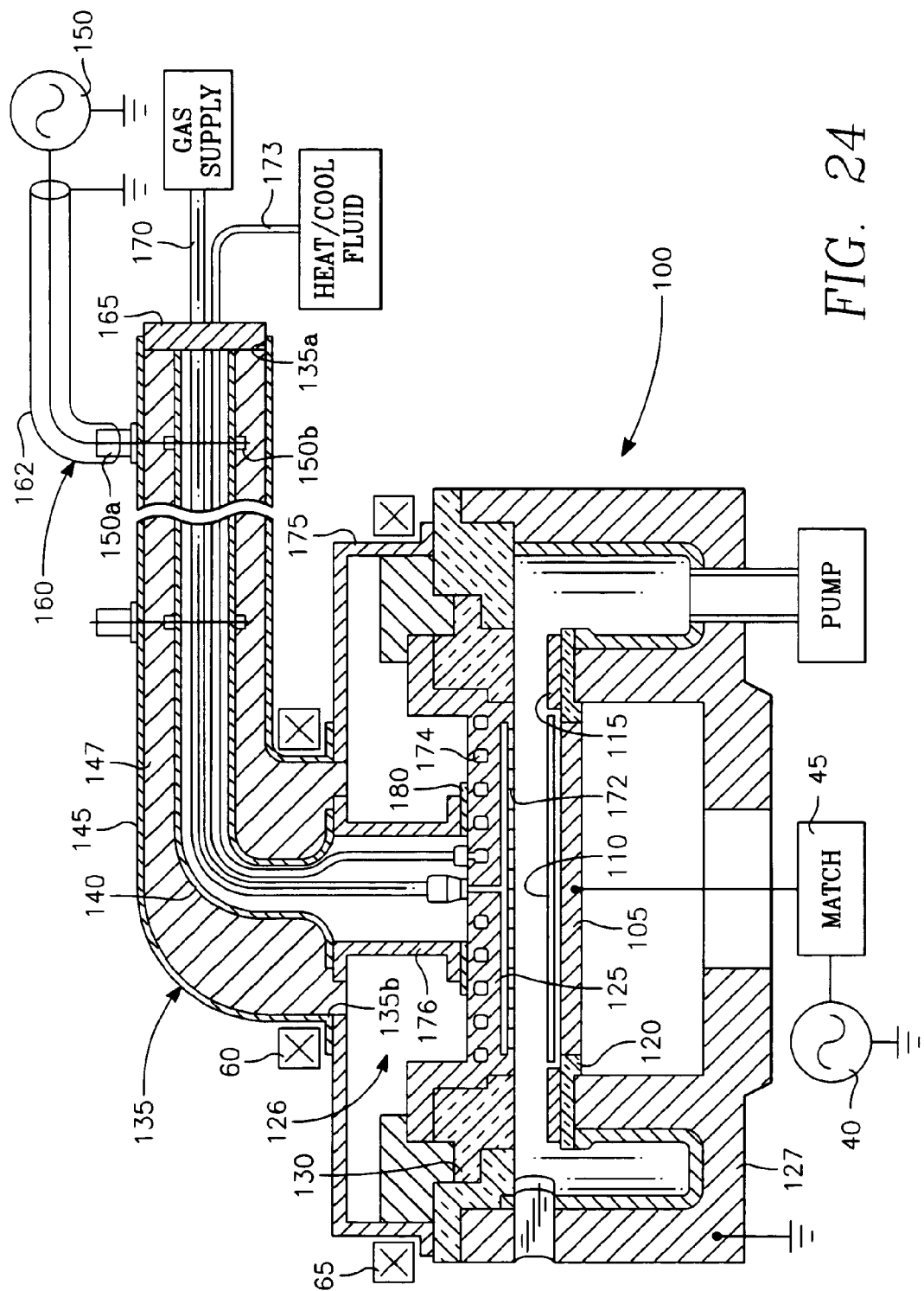
FIG. 24 illustrates a plasma reactor including features contained in the reactor of FIG. 1A.

Use With VHF Overhead Electrode:

FIG. 24 illustrates how the inner and outer coils 60, 65 may be combined with a capacitively coupled reactor that has an overhead electrode connected to a VHF plasma source power generator through a fixed tuning stub. Such a reactor is described in U.S. patent application Ser. No. 10/028,922 filed Dec. 19, 2001 by Daniel Hoffman et al. entitled "Plasma Reactor with Overhead RF Electrode Tuned to the Plasma" and assigned to the present assignee, the disclosure of which is incorporated herein by reference.

Referring to FIG. 24, a plasma reactor includes a reactor chamber 100 with a wafer support 105 at the bottom of the chamber supporting a semiconductor wafer 110. A process kit may include, in an exemplary implementation, a conductive or semi-conductive ring 115 supported by a dielectric ring 120 on a grounded chamber body 127. The chamber 100 is bounded at the top by a disc shaped overhead conductive electrode 125 supported at a gap length above the wafer 110 on grounded chamber body 127 by a dielectric seal. In one implementation, the wafer support 105 is movable in the vertical direction so that the gap length may change. In other implementations, the gap length may be a fixed predetermined length. The overhead electrode 125 may be a metal (e.g., aluminum) which may be covered with a semi-metal material (e.g., Si or SiC) on its interior surface, or it may be itself a semi-metal material. An RF generator 150 applies RF power to the electrode 125. RF power from the generator 150 is coupled through a coaxial cable 162 matched to the generator 150 and into a coaxial stub 135 connected to the electrode 125. The stub 135 has a characteristic impedance, has a resonance frequency, and provides an impedance match between the electrode 125 and the coaxial cable 162 or the output of the RF power generator 150, as will be more fully described below. The chamber body is connected to the RF return (RF ground) of the RF generator 150. The RF path from the overhead electrode 125 to RF ground is affected by the capacitance of the dielectric seal 120 and by the capacitance of the dielectric seal 130. The wafer support 105, the wafer 110 and the process kit conductive or semiconductive ring 115 provide the primary RF return path for RF power applied to the electrode 125.

As in the case of FIG. 1A, the inner coil 60 is less than half the diameter of the outer coil 65 and is in a plane farther away from the chamber than the outer coil 65. The outer coil 65 is located at or close to the plane of the top of the electrode 125, while the inner coil 60 is located well above the electrode 125. As in the case of FIG. 1, the D.C. currents in the coils 60, 65 are controlled by the plasma steering controller 90 governing the current supplies 70, 75 of the coils 60, 65.

The capacitance of the overhead electrode assembly 126, including the electrode 125, the process kit 115, 120 and the dielectric seal 130 measured with respect to RF return or ground was, in one exemplary case, 180 pico farads. The electrode assembly capacitance is affected by the electrode area, the gap length (distance between wafer support and overhead electrode), and by factors affecting stray capacitances, especially the dielectric values of the seal 130 and of the dielectric ring 120, which in turn are affected by the dielectric constants and thicknesses of the materials employed. More generally, the capacitance of the electrode assembly 126 (an unsigned number or scalar) is equal or nearly equal in magnitude to the negative capacitance of the plasma (a complex number) at a particular source power frequency, plasma density and operating pressure, as will be discussed below.

Many of the factors influencing the foregoing relationship are in great part predetermined due to the realities of the plasma process requirements needed to be performed by the reactor, the size of the wafer, and the requirement that the processing be carried out uniformly over the wafer. Thus, the plasma capacitance is a function of the plasma density and the source power frequency, while the electrode capacitance is a function of the wafer support-to-electrode gap (height), electrode diameter, and dielectric values of the insulators of the assembly. Plasma density, operating pressure, gap, and electrode diameter must satisfy the requirements of the plasma process to be performed by the reactor. In particular, the ion density must be within a certain range. For example, silicon and dielectric plasma etch processes generally require the plasma ion density to be within the range of $10^9$ to $10^{12}$ ions/cc. The wafer electrode gap provides an optimum plasma ion distribution uniformity for 8 inch wafers, for example, if the gap is about 2 inches. The electrode diameter is preferably at least as great as, if not greater than the diameter of the wafer. operating pressures similarly have practical ranges for typical etch and other plasma processes.

But it has been found that other factors remain which can be selected to achieve the above preferred relationship, particularly choice of source frequency and choice of capacitances for the overhead electrode assembly 126. Within the foregoing dimensional constraints imposed on the electrode and the constraints (e.g., density range) imposed on the plasma, the electrode capacitance can be matched to the magnitude of the negative capacitance of the plasma if the source power frequency is selected to be a VHF frequency, and if the dielectric values of the insulator components of electrode assembly 126 are selected properly. Such selection can achieve a match or near match between source power frequency and plasma-electrode resonance frequency.

Accordingly in one exemplary case, for an 8-inch wafer the overhead electrode diameter is approximately 11 inches, the gap is about 2 inches, the plasma density and operating pressure is typical for etch processes as above-stated, the VHF source power frequency is 210 MHz (although other VHF frequencies could be equally effective), and the source power frequency, the plasma electrode resonance frequency and the stub resonance frequency are all matched or nearly matched.

More particularly, these three frequencies are slightly offset from one another, with the source power frequency being 210 MHz, the electrode-plasma resonant frequency being approximately 200 MHz, and the stub frequency being about 220 MHz, in order to achieve a de-tuning effect which advantageously reduces the system Q. Such a reduction in system Q renders the reactor performance less susceptible to changes in conditions inside the chamber, so that the entire process is much more stable and can be carried out over a far wider process window.

A currently preferred mode has chamber and pedestal diameters suitable for accommodating a 12 inch diameter wafer, a wafer-to-ceiling gap of about 1.25 inch and an VHF source power frequency of 162 MHz (rather than the 210 MHz referred to above).

The coaxial stub 135 is a specially configured design which further contributes to the overall system stability, its wide process window capabilities, as well as many other valuable advantages. It includes an inner cylindrical conductor 140 and an outer concentric cylindrical conductor 145. An insulator 147 (denoted by cross-hatching in FIG. 24), having a relative dielectric constant of 1 for example, fills the space between the inner and outer conductors 140, 145. The inner and outer conductors 140, 145 may be formed, for example, of nickel-coated aluminum. In an exemplary case, the outer conductor 145 has a diameter of about 4 inches and the inner conductor 140 has a diameter of about 1.5 inches. The stub characteristic impedance is determined by the radii of the inner and outer conductors 140, 145 and the dielectric constant of the insulator 147. The stub 135 of the case described above has a characteristic impedance of 65☐. More generally, the stub characteristic impedance exceeds the source power output impedance by about 20%-40% and preferably by about 30%. The stub 135 has an axial length of about 29 inches (a half wavelength at 220 MHz) in order to have a resonance in the vicinity of 220 MHz to generally match while being slightly offset from the VHF source power frequency of 210 MHz.

A tap 160 is provided at a particular point along the axial length of the stub 135 for applying RF power from the RF generator 150 to the stub 135, as will be discussed below. The RF power terminal 150*b* and the RF return terminal 150*a* of the generator 150 are connected at the tap 160 on the stub 135 to the inner and outer coaxial stub conductors 140, 145, respectively. These connections are made via a generator-to-stub coaxial cable 162 having a characteristic impedance that matches the output impedance of the generator 150 (typically, 50 ☐) in the well-known manner. A terminating conductor 165 at the far end 135*a* of the stub 135 shorts the inner and outer conductors 140, 145 together, so that the stub 135 is shorted at its far end 135*a*. At the near end 135*b* (the unshorted end) of the stub 135, the outer conductor 145 is connected to the chamber body via an annular conductive housing or support 175, while the inner conductor 140 is connected to the center of electrode 125 via a conductive cylinder or support 176. A dielectric ring 180 is held between and separates the conductive cylinder 176 and the electrode 125.

The inner conductor 140 provides a conduit for utilities such as process gases and coolant. The principal advantage of this feature is that, unlike typical plasma reactors, the gas line 170 and the coolant line 173 do not cross large electrical potential differences. They therefore may be constructed of metal, a less expensive and more reliable material for such a purpose. The metallic gas line 170 feeds gas outlets 172 in or adjacent the overhead electrode 125 while the metallic coolant line 173 feeds coolant passages or jackets 174 within the overhead electrode 125.

An active and resonant impedance transformation is thereby provided by this specially configured stub match between the RF generator 150, and the overhead electrode assembly 126 and processing plasma load, minimizing reflected power and providing a very wide impedance match space accommodating wide changes in load impedance. Consequently, wide process windows and process flexibility is provided, along with previously unobtainable efficiency in use of power, all while minimizing or avoiding the need for typical impedance match apparatus. As noted above, the stub resonance frequency is also offset from ideal match to further enhance overall system Q, system stability and process windows and multi-process capability.

Matching the Electrode-Plasma Resonance Frequency and the VHF Source Power Frequency:

As outlined above, a principal feature is to configure the overhead electrode assembly 126 for resonance with the plasma at the electrode-plasma resonant frequency and for the matching (or the near match of) the source power frequency and the electrode-plasma frequency. The electrode assembly 126 has a predominantly capacitive reactance while the plasma reactance is a complex function of frequency, plasma density and other parameters. (As will be described below in greater detail, a plasma is analyzed in terms of a reactance which is a complex function involving imaginary terms and generally corresponds to a negative capacitance.)

The electrode-plasma resonant frequency is determined by the reactances of the electrode assembly 126 and of the plasma (in analogy with the resonant frequency of a capacitor/inductor resonant circuit being determined by the reactances of the capacitor and the inductor). Thus the electrode-plasma resonant frequency may not necessarily be the source power frequency, depending as it does upon the plasma density. The problem, therefore, is to find a source power frequency at which the plasma reactance is such that the electrode-plasma resonant frequency is equal or nearly equal to the source power frequency, given the constraints of practical confinement to a particular range of plasma density and electrode dimensions. The problem is even more difficult, because the plasma density (which affects the plasma reactance) and the electrode dimensions (which affect electrode capacitance) must meet certain process constraints. Specifically, for dielectric and conductor plasma etch processes, the plasma density should be within the range of $10^9$-$10^{12}$ ions/cc, which is a constraint on the plasma reactance. Moreover, a more uniform plasma ion density distribution for processing 8-inch diameter wafers for example, is realized by a wafer-to-electrode gap or height of about 2 inches and an electrode diameter on the order of the wafer diameter, or greater, which is a constraint on the electrode capacitance. On the other hand, a different gap may be utilized for a 12-inch diameter wafer.

Accordingly, by matching (or nearly matching) the electrode capacitance to the magnitude of the negative capacitance of the plasma, the electrode-plasma resonant frequency and the source power frequency are at least nearly matched. For the general conductor and dielectric etch process conditions enumerated above (i.e., plasma density between $10^9$-$10^{12}$ ions/cc, a 2-inch gap and an electrode diameter on the order of roughly 11 inches), the match is possible if the source power frequency is a VHF frequency. Other conditions (e.g., different wafer diameters, different plasma densities, etc.) may dictate a different frequency range to realize such a match in carrying out this feature of the reactor. As will be detailed below, under favored plasma processing conditions for processing 8-inch wafers in several principal applications including dielectric and metal plasma etching and chemical vapor deposition, the plasma capacitance in one typical working example having plasma densities as set forth above was between −50 and −400 pico farads. In an exemplary case, the capacitance of the overhead electrode assembly 126 was matched to the magnitude of this negative plasma capacitance by using an electrode diameter of 11 inches, a gap length (electrode to pedestal spacing) of approximately 2 inches, choosing a dielectric material for seal 130 having a dielectric constant of 9, and a thickness of the order of one inch, and a dielectric material for the ring 120 having a dielectric constant of 4 and thickness of the order of 10 mm.

The combination of electrode assembly 126 and the plasma resonates at an electrode-plasma resonant frequency that at least nearly matches the source power frequency applied to the electrode 125, assuming a matching of their capacitances as just described. We have discovered that for favored etch plasma processing recipes, environments and plasmas, this electrode-plasma resonant frequency and the source power frequency can be matched or nearly matched at VHF frequencies; and that it is highly advantageous that such a frequency match or near-match be implemented. In an exemplary case, the electrode-plasma resonance frequency corresponding to the foregoing values of plasma negative capacitance is approximately 200 MHz, as will be detailed below. The source power frequency is 210 MHz, a near-match in which the source power frequency is offset slightly above the electrode-plasma resonance frequency in order to realize other advantages to be discussed below.

The plasma capacitance is a function of among other things, plasma electron density. This is related to plasma ion density, which needs, in order to provide good plasma processing conditions, to be kept in a range generally $10^9$ to $10^{12}$ ions/cc. This density, together with the source power frequency and other parameters, determines the plasma negative capacitance, the selection of which is therefore constrained by the need to optimize plasma processing conditions, as will be further detailed below. But the overhead electrode assembly capacitance is affected by many physical factors, e.g. gap length (spacing between electrode 125 and the wafer); the area of electrode 125; the range of the dielectric loss tangent for the dielectric seal 130; the choice of dielectric constant of the dielectric seal 130 between electrode 125 and grounded chamber body 127; the choice of dielectric constant for the process kit dielectric seal 130; and the thickness of the dielectric seals 130 and 120 and the thickness and dielectric constant of the ring 180. This permits some adjustment of the electrode assembly capacitance through choices made among these and other physical factors affecting the overhead electrode capacitance. We have found that the range of this adjustment is sufficient to achieve the necessary degree of matching of the overhead electrode assembly capacitance to the magnitude of the negative plasma capacitance. In particular, the dielectric materials and dimensions for the seal 130 and ring 120 are chosen to provide the desired dielectric constants and resulting dielectric values. Matching the electrode capacitance and the plasma capacitance can then be achieved despite the fact that some of the same physical factors influencing electrode capacitance, particularly gap length, will be dictated or limited by the following practicalities: the need to handle larger diameter wafers; to do so with good uniformity of distribution of plasma ion density over the full diameter of the wafer; and to have good control of ion density vs. ion energy.

Given the foregoing range for the plasma capacitance and the matching overhead electrode capacitance, the electrode-plasma resonance frequency was approximately 200 MHz for a source power frequency of 210 MHz.

A great advantage of choosing the capacitance of the electrode assembly 126 in this manner, and then matching the resultant electrode-plasma resonant frequency and the source power frequency, is that resonance of the electrode and plasma near the source power frequency provides a wider impedance match and wider process window, and consequently much greater immunity to changes in process conditions, and therefore greater performance stability. The entire processing system is rendered less sensitive to variations in operating conditions, e.g., shifts in plasma impedance, and therefore more reliable along with a greater range of process applicability. As will be discussed later in the specification, this advantage is further enhanced by the small offset between the electrode-plasma resonant frequency and the source power frequency.

Figure 25:
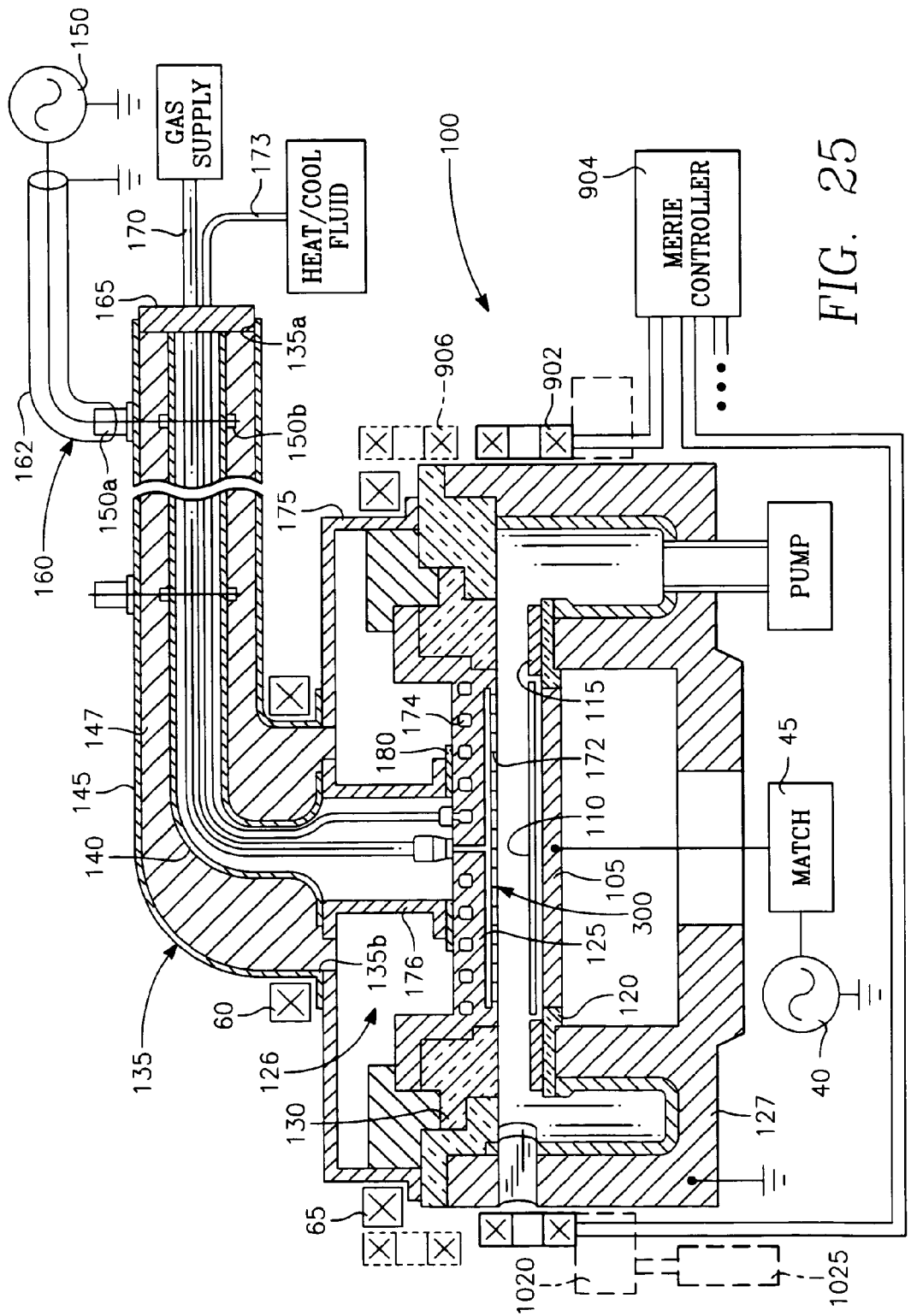
FIG. 25 illustrates another plasma reactor including features contained in the reactor of FIG. 1A.

FIG. 25 illustrate how the inner and outer coils 60, 65 may be combined with a capacitively coupled reactor that has an overhead electrode connected to a VHF plasma source power generator through a fixed tuning stub, and has MERIE electromagnets around its periphery. Such a reactor is described in U.S. patent application Ser. No. 10/028,922 filed Dec. 19, 2001 by Daniel Hoffman et al. entitled "Plasma Reactor with Overhead RF Electrode Tuned to the Plasma" and assigned to the present assignee, the disclosure of which is incorporated herein by reference.

Referring to FIG. 25, a VHF capacitively coupled plasma reactor includes the following elements found in the reactor of FIG. 1A: a reactor chamber 100 with a wafer support 105 at the bottom of the chamber supporting a semiconductor wafer 110. A process kit in the illustrated case consists of a semi-conductive or conductive ring 115 supported by a dielectric ring 120 on the grounded chamber body 127. The chamber 100 is bounded at the top by a disc shaped overhead aluminum electrode 125 supported at a predetermined gap length above the wafer 110 on grounded chamber body 127 by a dielectric seal 130. The overhead electrode 125 also may be a metal (e.g., aluminum) which may be covered with a semi-metal material (e.g., Si or SiC) on its interior surface, or it may be itself a semi-metal material. An RF generator 150 applies RF power to the electrode 125. RF power from the generator 150 is coupled through a coaxial cable 162 matched to the generator 150 and into a coaxial stub 135 connected to the electrode 125. The stub 135 has a characteristic impedance, resonance frequency, and provides an impedance match between the electrode 125 and the coaxial cable 162/RF power generator 150, as will be more fully described below. The chamber body is connected to the RF return (RF ground) of the RF generator 150. The RF path from the overhead electrode 125 to RF ground is affected by the capacitance of the process kit dielectric ring 120 and the dielectric seal 130. The wafer support 105, the wafer 110 and the process kit semiconductive (or conductive) ring 115 provide the primary RF return path for RF power applied to the electrode 125.

As in the case of FIG. 1A, the inner coil 60 is less than half the diameter of the outer coil 65 and is in a plane farther away from the chamber than the outer coil 65. The outer coil 65 is located at or close to the plane of the top of the electrode 125, while the inner coil 60 is located well above the electrode 125. As in the case of FIG. 1, the D.C. currents in the coils 60, 65 are controlled by the plasma steering controller 90 governing the current supplies 70, 75 of the coils 60, 65.

The improvement in plasma density distribution uniformity is achieved by the introduction of a set of MERIE electromagnets 902 spaced equally about the periphery of the wafer support pedestal and outside of the reactor chamber (like those shown in FIGS. 7 and 8). These MERIE magnets are adapted to produce a magnetic field that slowly rotates about the axis of symmetry of the cylindrical chamber generally across the surface of the wafer support pedestal. In one case this feature is realized by the MERIE magnets 902 having electromagnet windings wound about respective axes tangent to the circumference of the wafer support pedestal. In this case, an MERIE current controller 904 controls the individual current to each MERIE magnet. A circulating magnetic field is generated in the plane of the workpiece support by the controller 904 providing individual AC currents to each of the individual magnet windings of the same frequency but offset in phase by 90 degrees (or by 360 degrees divided by the number of MERIE magnets). In an alternative case, the feature of a rotating magnetic field is realized by a support frame 1020 (dashed line) supporting all of the MERIE magnets that is rotated about the axis of symmetry by a rotor 1025 (dashed line). In this alternative case, the MERIE magnets are permanent magnets.

A second array of MERIE magnets 906 (shown in dashed line) equally spaced about the workpiece or wafer support pedestal but in a higher plane than the first set of MERIE magnets 902 may be provided as well. Both sets of magnets lie in respective planes that are near the plane of the workpiece support.

The controller 910 applies a low frequency (0.5-10 Hz) AC current to each of the electromagnets 902, 906, the phases of the currents applied to neighboring magnets being offset as described above by 90 degrees. The result is a magnetic field that rotates about the axis of symmetry of the workpiece support at the low frequency of the AC current. The magnetic field causes the plasma to be drawn toward the magnetic field near the workpiece surface and to circulate with the field. This stirs the plasma so that its density distribution becomes more uniform. As a result, reactor performance is significantly improved because more uniform etch results are obtained across the entire surface of the wafer.

Combination Overhead Electrode and Gas Distribution Plate:

It is desirable to feed the process gas from the overhead ceiling to improve uniformity of gas distribution within the chamber. For this purpose, the overhead electrode 125 in the cases of FIGS. 24 and 25 can be a gas distribution showerhead, and therefore has a large number of gas injection ports or small holes 300 in its bottom surface facing the workpiece support 105. In an exemplary case, the holes 300 were between 0.01 and 0.03 inch in diameter and their centers were uniformly spaced apart by about ⅜ inch.

The overhead electrode/gas distribution plate 125 (hereinafter referred to as the gas distribution plate 125) has improved resistance to arcing. This is due to the introduction of an arc suppression feature that excludes process gas and/or plasma from the center of each opening or hole 300. This arc suppressing feature is a set of center pieces or disks 302 in the centers of the holes 300 supported at the ends of respective cylindrical fingers or thin rods 303 as shown in the cross-sectional view of FIG. 26 and the enlarged cross-sectional view of FIG. 27. Arcing within a typical gas distribution plate tends to occur near the center of the gas injection holes. Therefore, placing the center pieces 302 at the center of each hole 300 prevents process gas from reaching the center of each hole 300 and therefore reduces the occurrence of arcing. As shown in the plan view of FIG. 28, introduction of the center pieces 302 in the holes 300 transforms the otherwise circular openings or holes 300 into annular openings.

Figure 29A:
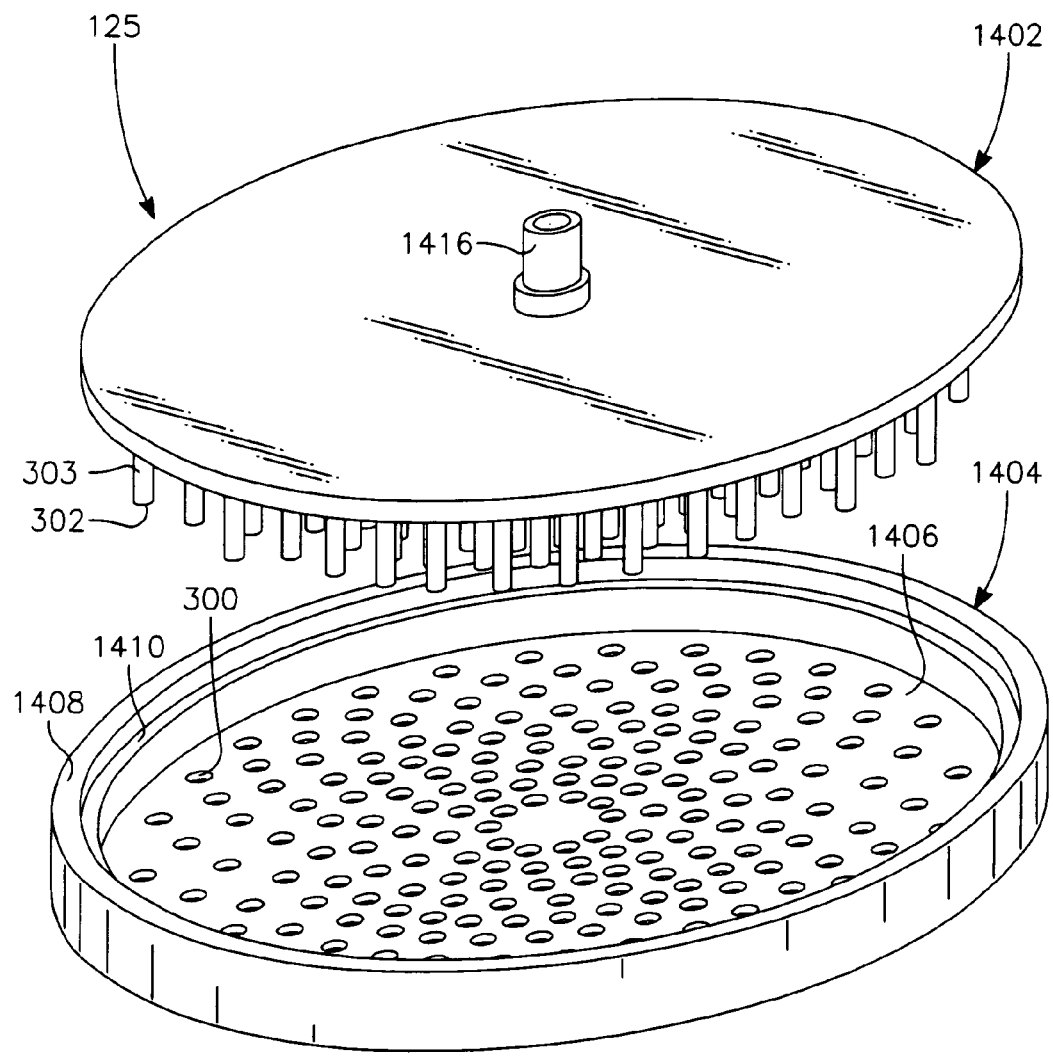

Referring to FIG. 29A, the gas distribution plate 125 with improved arc suppression constitutes a cover 1402 and a base 1404. The base 1404 is a discoid plate 1406 with the gas injection openings formed therethrough surrounded by an annular wall 1408 having an interior shoulder 1410. The cover 1402 is also a discoid plate. The disks 302 are the end sections of the cylindrical fingers 303 attached to and extending downwardly from the bottom surface of the cover 1402. The outer edge of the cover 1402 rests on the shoulder 1410 of the base 1404 to form a gas manifold 1414 (FIG. 26) between the cover 1402 and the base 1404. Process gas flows into the manifold 1414 from a gas inlet 1416 in the center of the cover 1402.

Figure 29B:
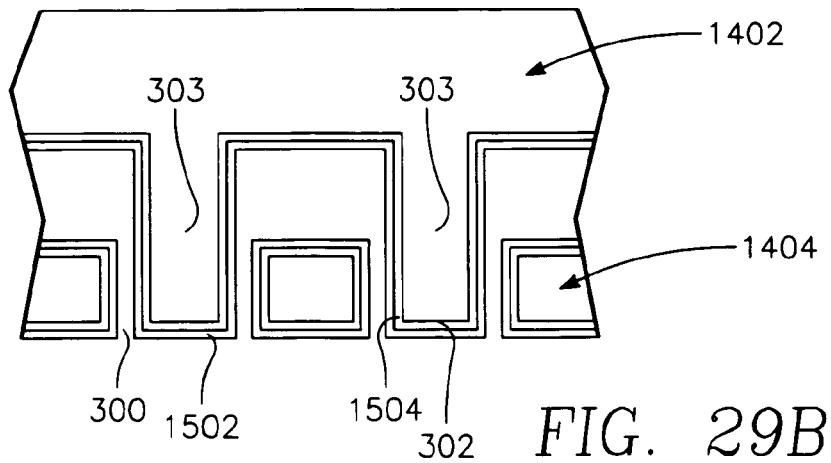
Figure 30:
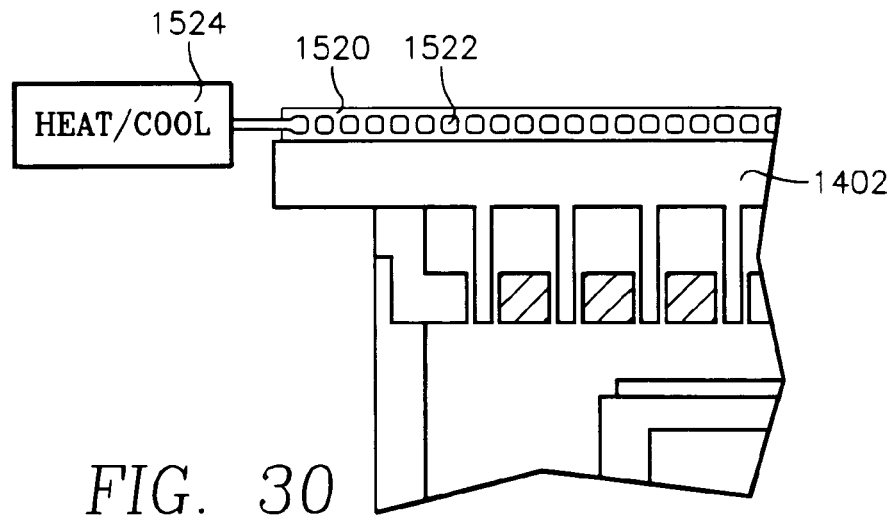
FIGS. 30 and 31 illustrate thermal control features in gas distribution plate like that of FIG. 26.
Figure 31:
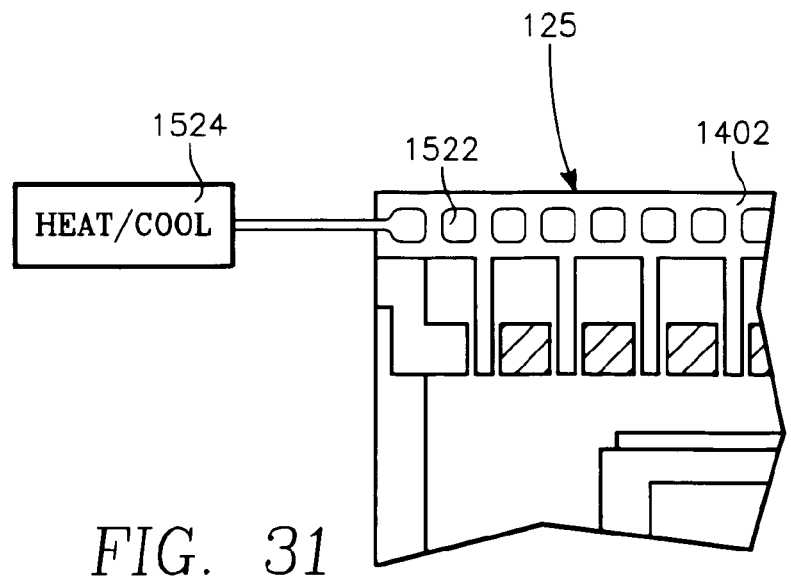

The portions of the gas distribution plate 125 that contact process gas or plasma in the chamber can be formed of a metal such as aluminum coated with a semiconductor processing compatible material such as silicon carbide. In this example, all surfaces of the gas distribution plate, with the exception of the top surface of the cover 1402, are covered with a silicon carbide coating 1502 as indicated in the enlarged partial cross-sectional view of FIG. 29B. As shown in FIG. 30, the aluminum top surface of the cover 1402 is in contact with a temperature-controlled member 1520 that may be water-cooled by water jackets 1522 with coolant circulated by a heat exchanger 1524, so that the thermally conductive aluminum material of the gas distribution plate 125 has a controlled temperature. Alternatively, as shown in FIG. 31, the water jackets may be within the gas distribution plate 125.

However, in order for the silicon carbide coating 1502 to have the same controlled temperature, there must be a thermally conductive bond between the silicon carbide coating and the aluminum. Otherwise, the temperature of the silicon carbide coating could fluctuate uncontrollably. In order to achieve good thermal conductivity between the aluminum material of the gas distribution plate 125 and the silicon carbide coating, a polymer bonding layer 1504 is formed between the aluminum gas distribution plate and the silicon carbide coating 1502, as shown in FIG. 29A. FIG. 29A shows that the polymer bonding layer 1504 is between the silicon carbide coating 1502 and the aluminum base 1404. The polymer bonding layer provides good thermal conductivity between the aluminum and the silicon carbide coating 1502, so that the temperature of the coating 1502 is controlled by the heat exchanger 1524.

Figure 32:
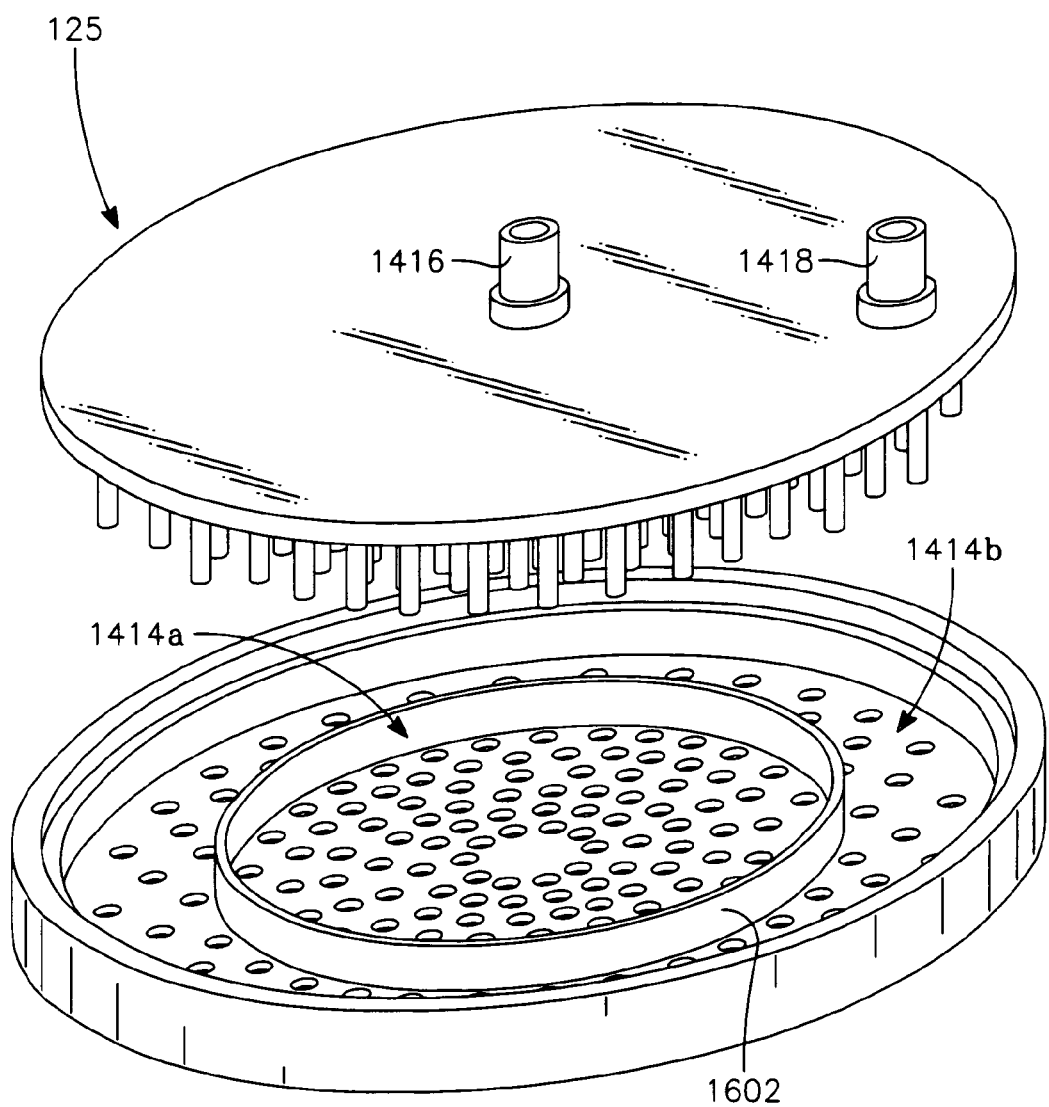
FIGS. 32 and 33 illustrate a gas distribution plate corresponding to FIG. 26 having dual zone gas flow control.
Figure 33:
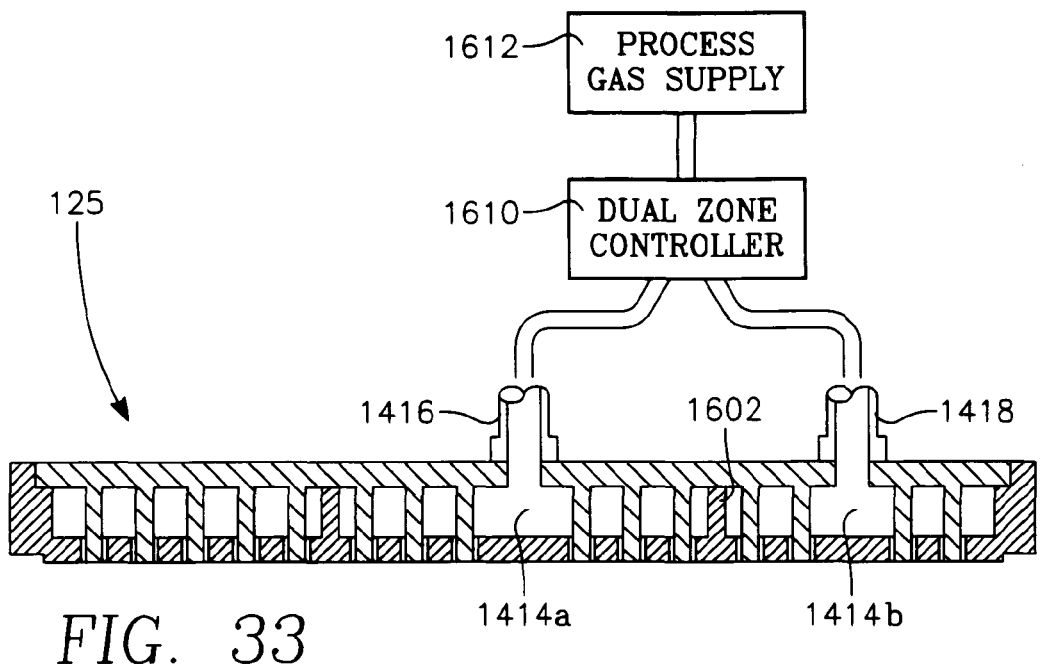
Figure 35:
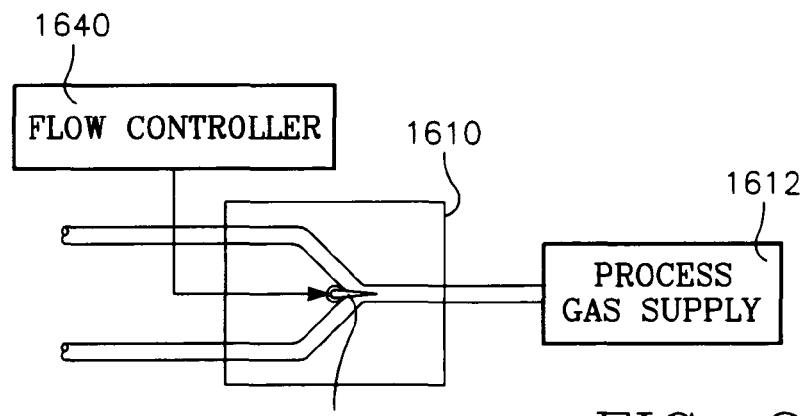
FIGS. 35 and 36 illustrate exemplary dual zone gas flow controllers.
Figure 36:
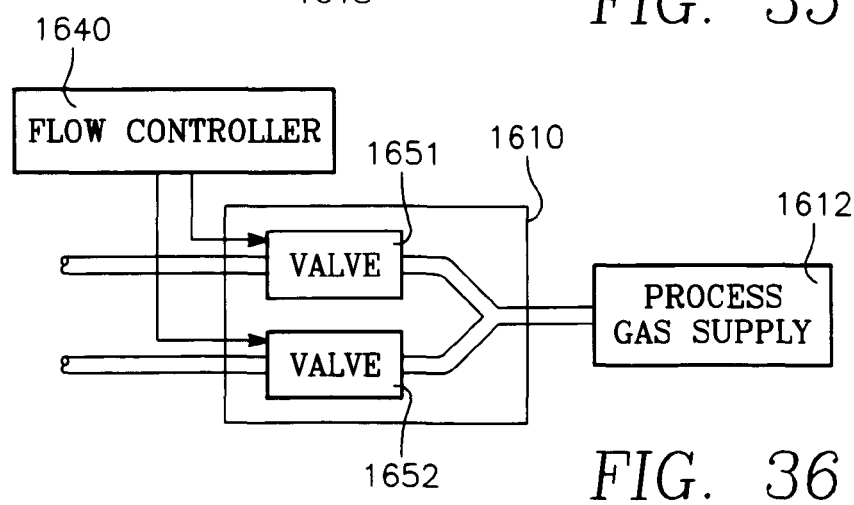
Figure 34:
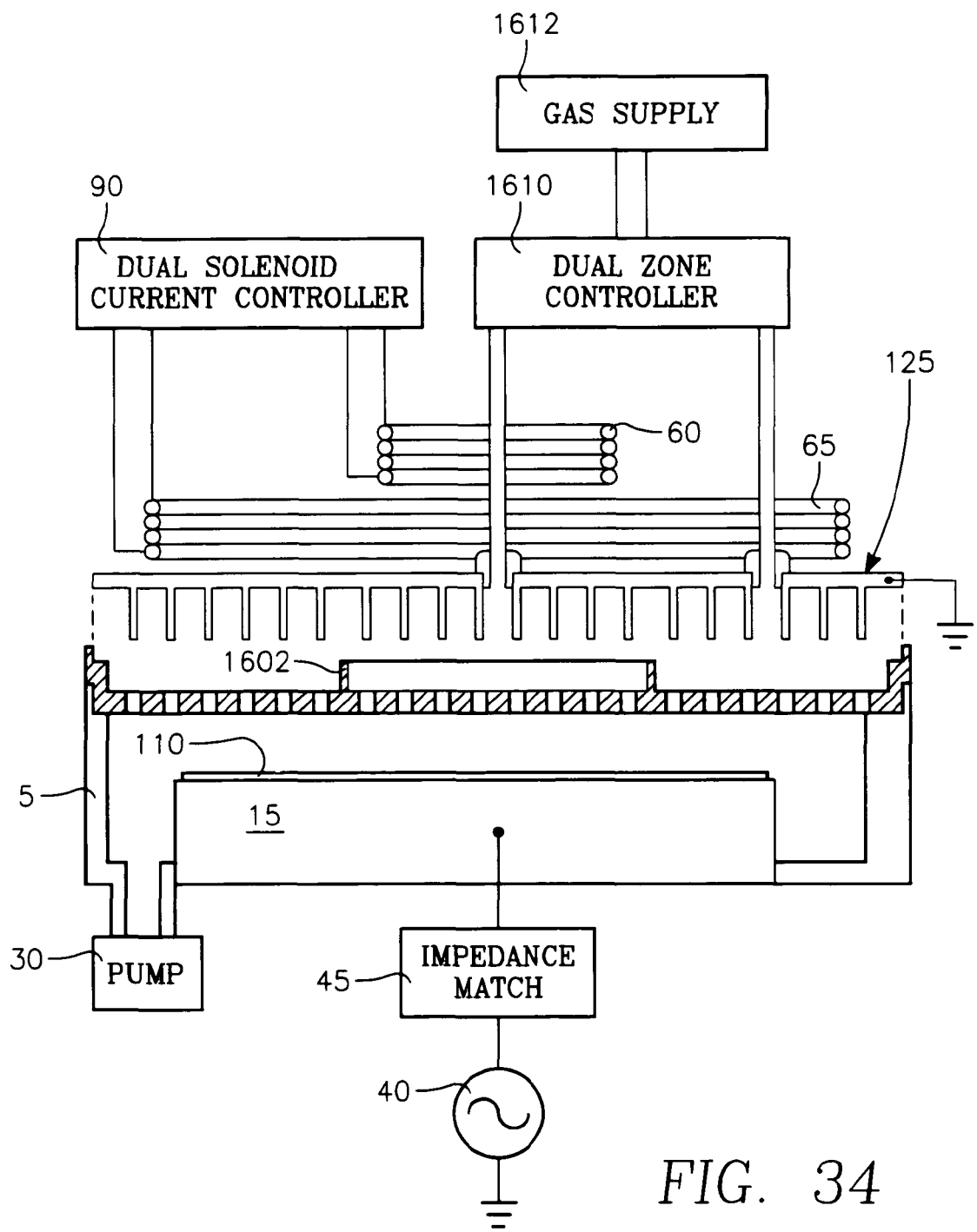
FIG. 34 illustrates a plasma reactor corresponding to FIG. 1A having the dual zone gas distribution plate.

FIGS. 32, 33 and 34 illustrate how the gas distribution plate 125 of FIG. 29A can be modified to provide dual zone gas flow control. Such a feature can be employed to help correct an etch rate or deposition rate spatial distribution that is either center high or center low by selecting a process gas distribution that is complementary. Specifically, an annular partition or wall 1602 divides the gas manifold 1414 into a center manifold 1414a and an outer manifold 1414b. In addition to the center gas feed 1416 that feeds the center manifold 1414a, another gas feed 1418 between the center and periphery of the gas distribution plate 125 feeds the outer manifold 1414b. A dual zone controller 1610 apportions gas flow from a process gas supply 1612 between the inner and outer gas feeds 1416, 1418. FIG. 35 illustrates one implementation of the valve 1610 in which an articulating vane 1618 controls the relative amount of gas flow to the inner and outer manifolds 1414a, 1414b of the gas distribution plate. An intelligent flow controller 1640 governs the position of the vane 1618. In another implementation illustrated in FIG. 36, a pair of valves 1651, 1652 perform individual gas flow control for respective radial zones of the chamber.

Figure 37:
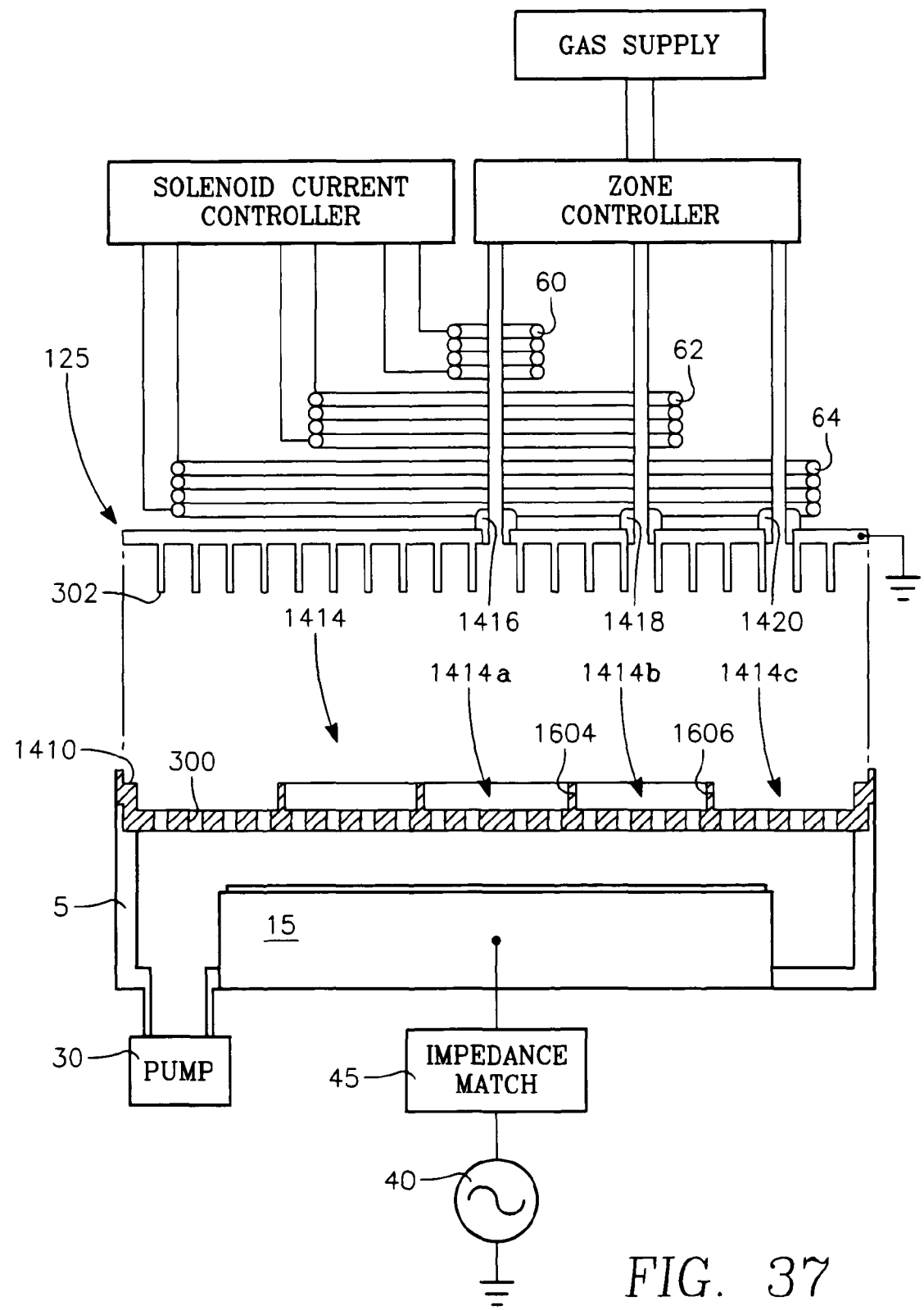
FIG. 37 illustrates a plasma reactor corresponding to FIG. 34 having three overhead coils for controlling plasma ion distribution.

FIG. 37 illustrates an case in which the gas distribution plate 125 has three gas flow zones, the manifold 1414 being separated by inner and outer annular partitions 1604, 1606 into three manifolds 1414a, 1414b and 1414c. Three respective gas feeds 1416, 1418, 1420 provide gas flow to the respective manifolds 1414a, b, c.

While various cases have been described above in this specification as having a pair of overhead coils 60, 65, FIG. 37 shows that there can be more than two overhead coils. In fact, the case of FIG. 37 is illustrated as having three concentric overhead coils or coils 60, 64 and 65. By increasing the number of independently controlled overhead coils, it is felt the resolution with which processing non-uniformities are corrected is increased.

Figure 38:
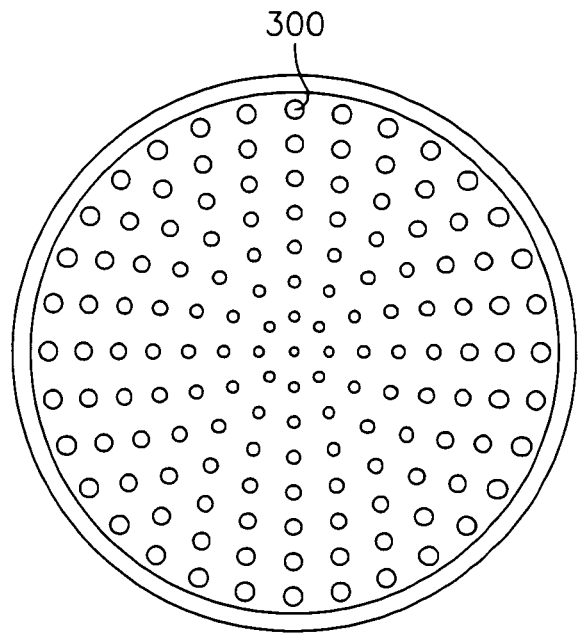
FIGS. 38 and 39 depict different gas injection hole patterns in the gas distribution plate of FIG. 26 for producing center low or center high gas flow distributions, respectively.
Figure 39:
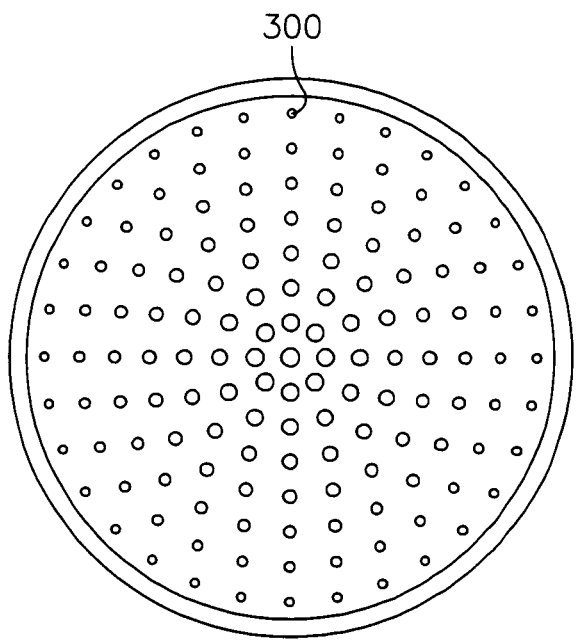

The multiple zone gas distribution plates of FIGS. 34 and 37 enjoy the advantage of flexible control over gas apportionment between inner and outer processing zones of the workpiece. However, another way of customizing gas flow is to do so permanently by providing different gas injection hole sizes at different radii of the gas distribution plate 125. For example, if the reactor tends to exhibit a spatial etch rate distribution that is center high, then less gas would be supplied near the center and more at the periphery of the chamber by using smaller gas injection holes 300 at the center and larger ones near the periphery. Such a gas distribution plate is illustrated in plan view in FIG. 38. For a center low etch distribution, the opposite hole arrangement would be employed as illustrated in FIG. 39.

Figure 9:
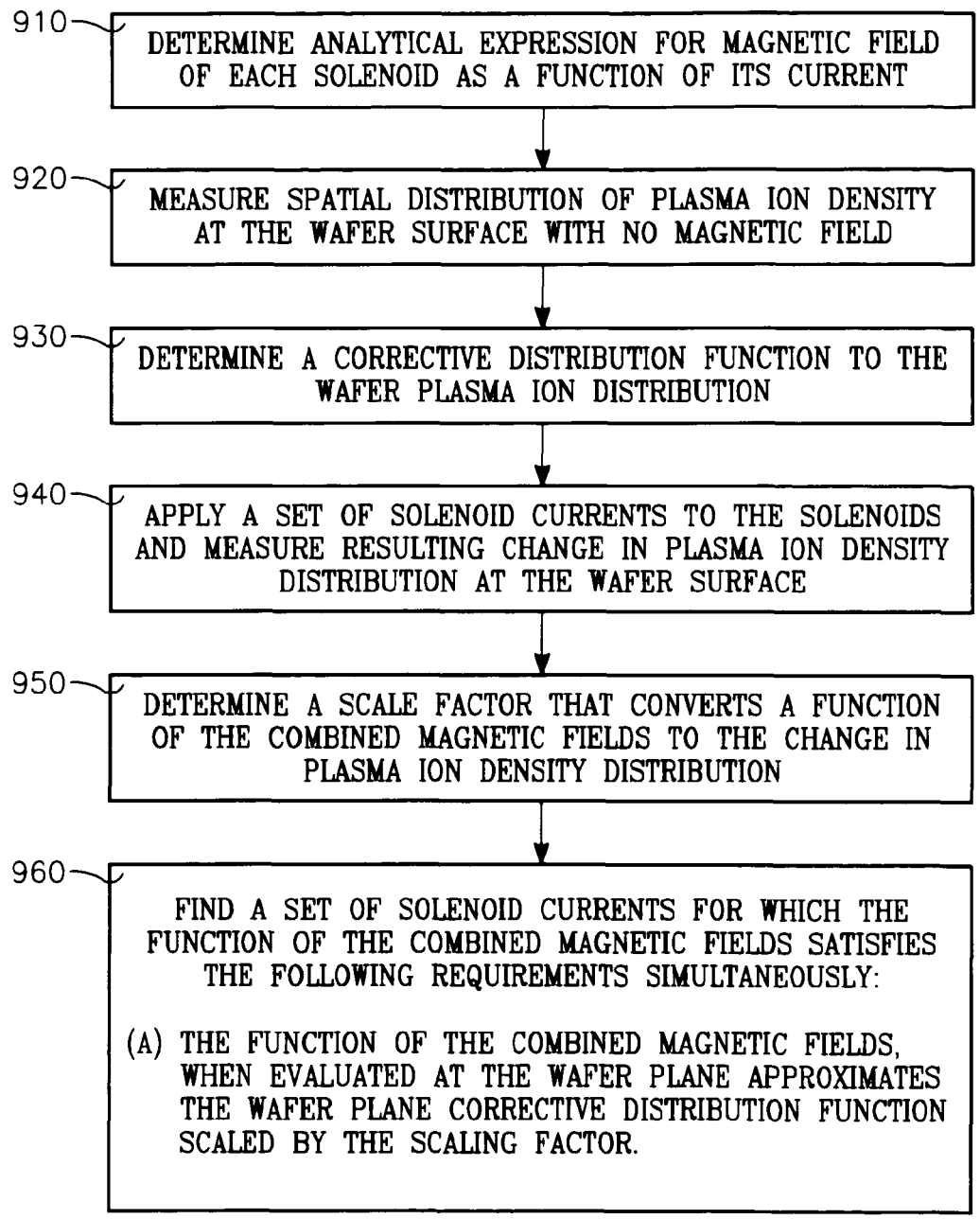
FIG. 9 depicts a method of operating the reactor of FIG. 1A.

Plasma Steering In The Reactor Of FIG. 9:

Plasma steering as described above with reference to FIGS. 11-14 was performed in the case of FIG. 9. A magnetic field pointing to the side wall was produced by applying a current of −13 amperes to the inner coil 60 and a current of +1.4 amperes to the outer coil 65. A magnetic field pointing toward the periphery of the ceiling or electrode 125 was produced by applying a current of −13 amperes to the inner coil 60 and a current of +5.2 amperes to the outer coil 65. A dense magnetic field at the side wall was produced by applying a current of −13 amperes to the inner coil 60 and a current of +9.2 amperes to the outer coil 65. We found that the etch rate of chamber surfaces during cleaning were improved by as much as 40% by applying a magnetic field pointing toward the periphery of the ceiling or electrode 125 in the manner described above.

Figure 40:
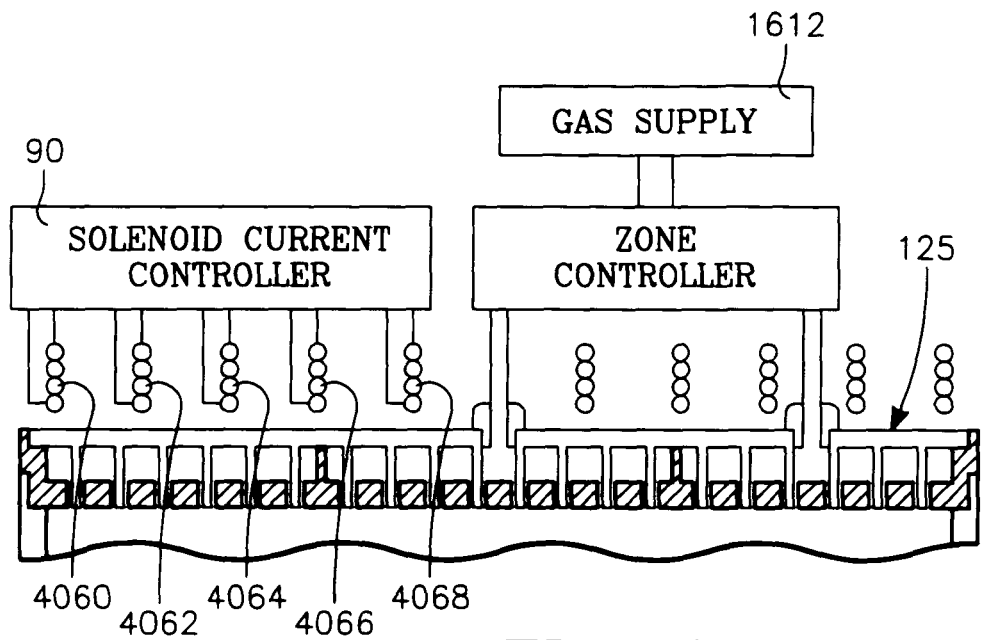
FIGS. 40, 41, 42 and 43 illustrate different arrangements of overhead coils for controlling plasma ion distribution.
Figure 41:
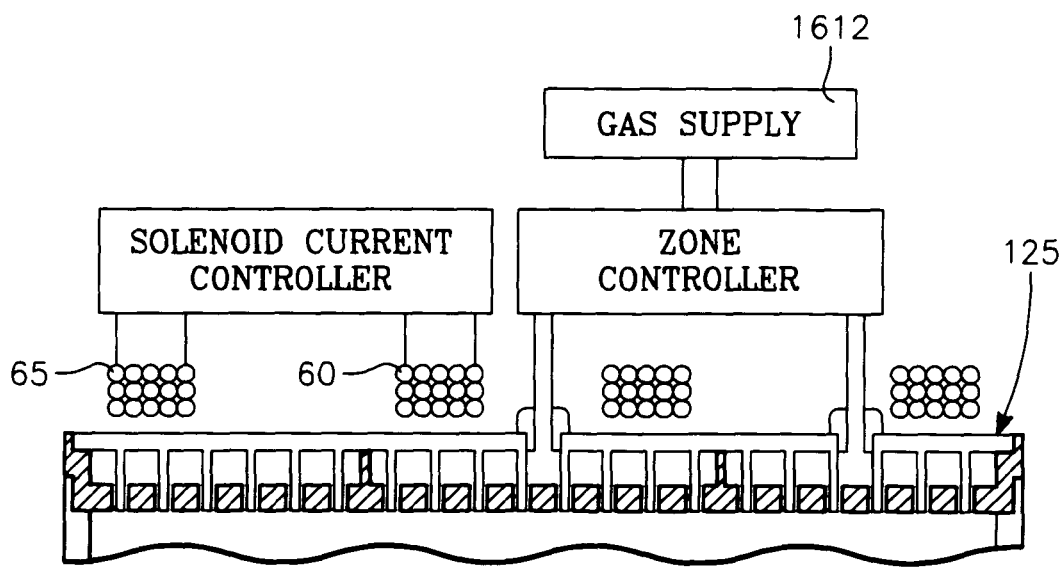
Figure 42:
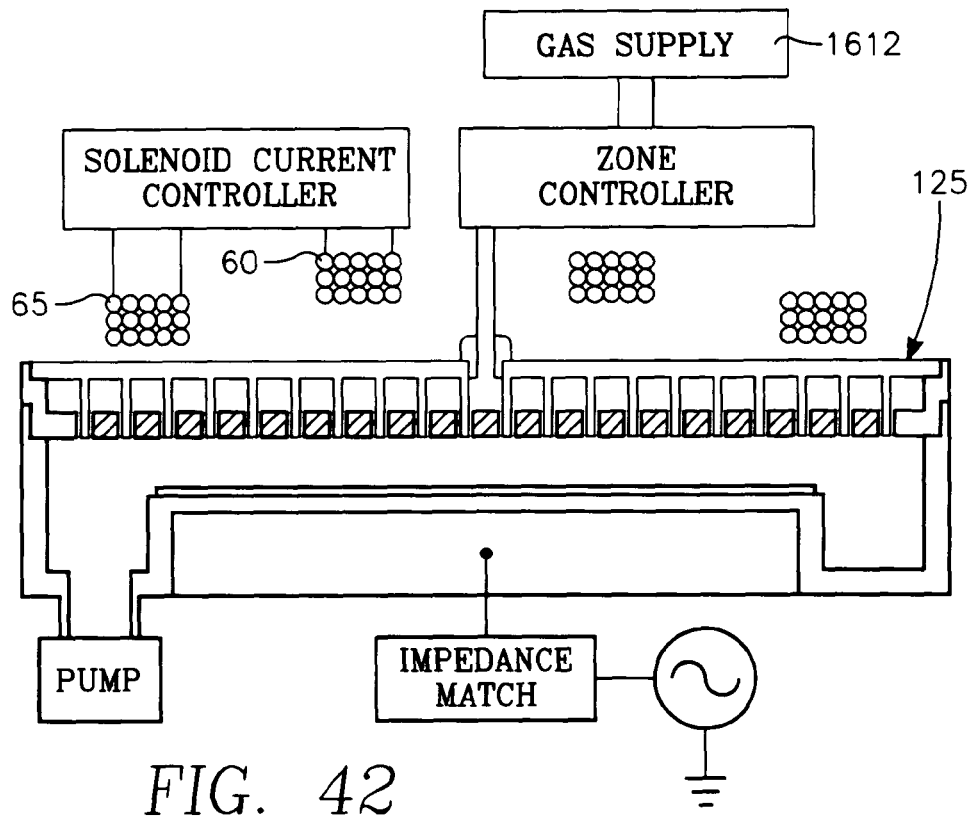
Figure 43:
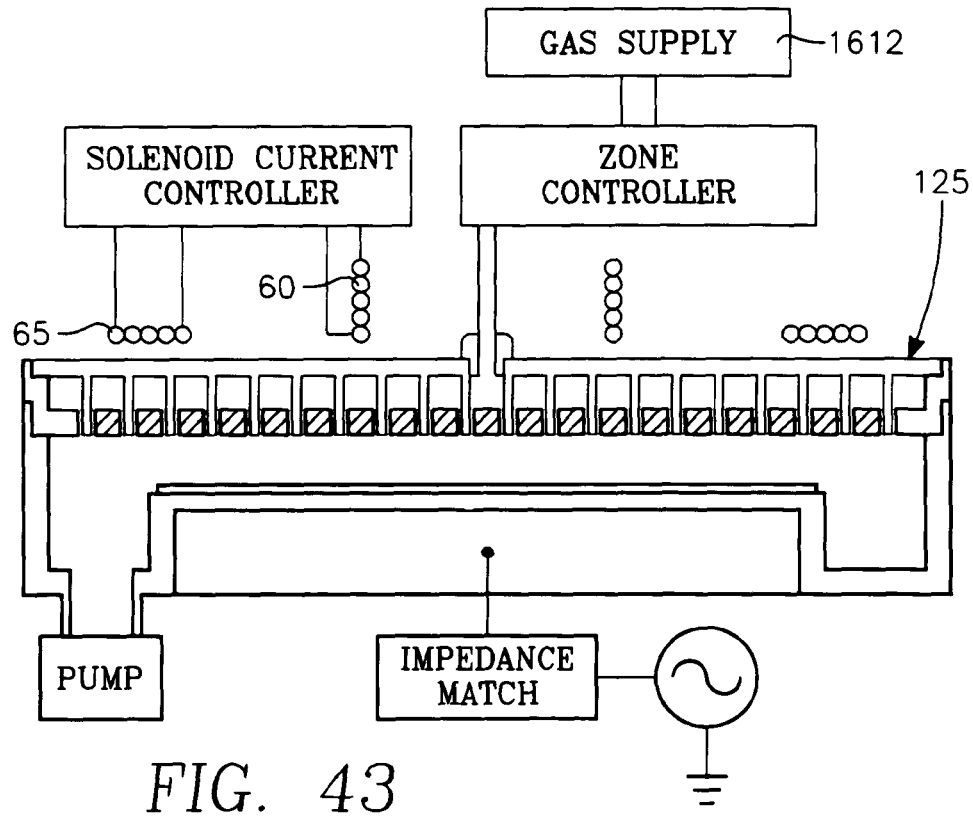

Coil Configurations:

While the foregoing cases have been described with reference to the inner and outer coils 60, 65, a greater number of coils may be employed. For example, the case of FIG. 40 has five overhead coils 4060, 4062, 4064, 4066, 4068, each with its own current separately controlled by the controller 90. The coils 4060, 4062, 4064, 4066, 4068 may be at the same height above the ceiling 125 (as in FIG. 40) or at different heights. FIG. 41 illustrates an case in which the overhead coils 60, 65 are at the same height. In FIG. 41, the windings in each coil 60, 65 are stacked in both vertical and radial directions. FIGS. 42 and 43 illustrate different cases in which the coils 60, 65 have windings extending in the vertical direction and in the radial direction.

Figure 44:
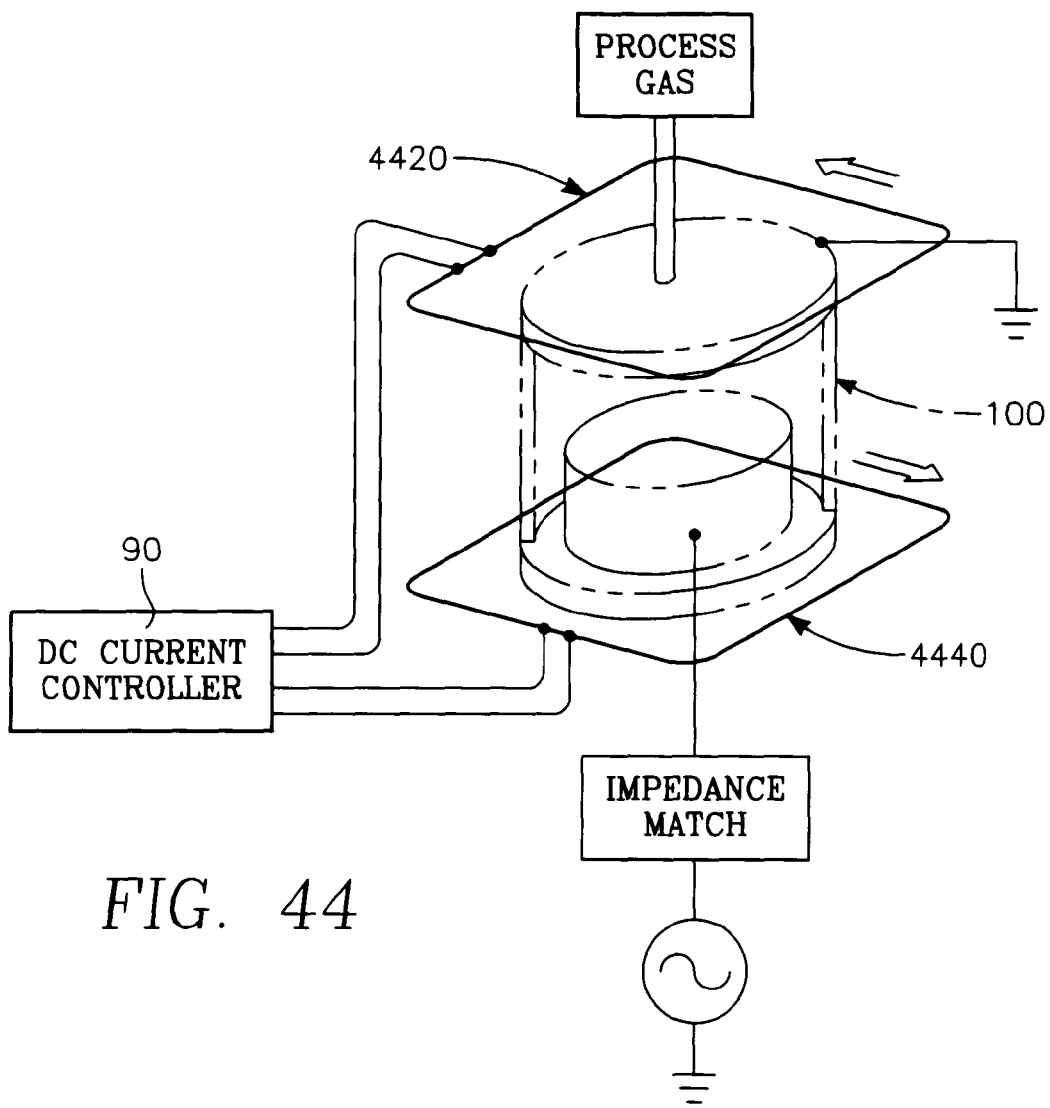
FIGS. 44 and 45 illustrate a plasma reactor corresponding to FIG. 1A in which the overhead coils are replaced by upper and lower magnetic coils above and below the reactor chamber to produce a cusp-shaped magnetic field best seen in FIG. 45.
Figure 45:
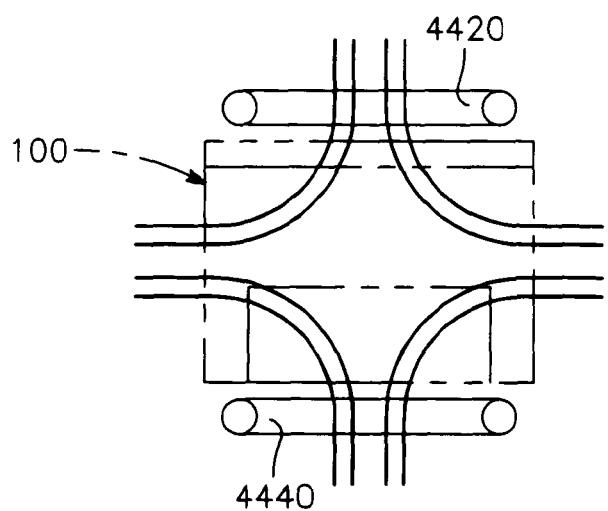

As discussed previously in this specification with reference to FIG. 1A, magnetic pressure on the plasma for correcting non-uniform distribution is proportional to the radial component of the gradient of the square of the magnetic field. Thus, the most efficient approach is to employ a magnetic field having a large radial gradient, such as a cusp-shaped magnetic field. As further discussed above, the greater efficiency of the cusp-shaped magnetic field reduces the required strength of the magnetic field for a given amount of magnetic pressure, thereby reducing or eliminating device damage associated with high magnetic fields. FIG. 44 illustrates an case in which a fully cusp-shaped magnetic field is produced by a pair of coils 4420, 4440 located above and below the chamber, respectively. Current flow in the top and bottom coils 4420, 4440 is clockwise and counter-clockwise, respectively. FIG. 45 is a simplified illustration of the magnetic field line pattern of the fully cusp-shaped magnetic field produced by the pair of coils 4420, 4440.

Figure 46:
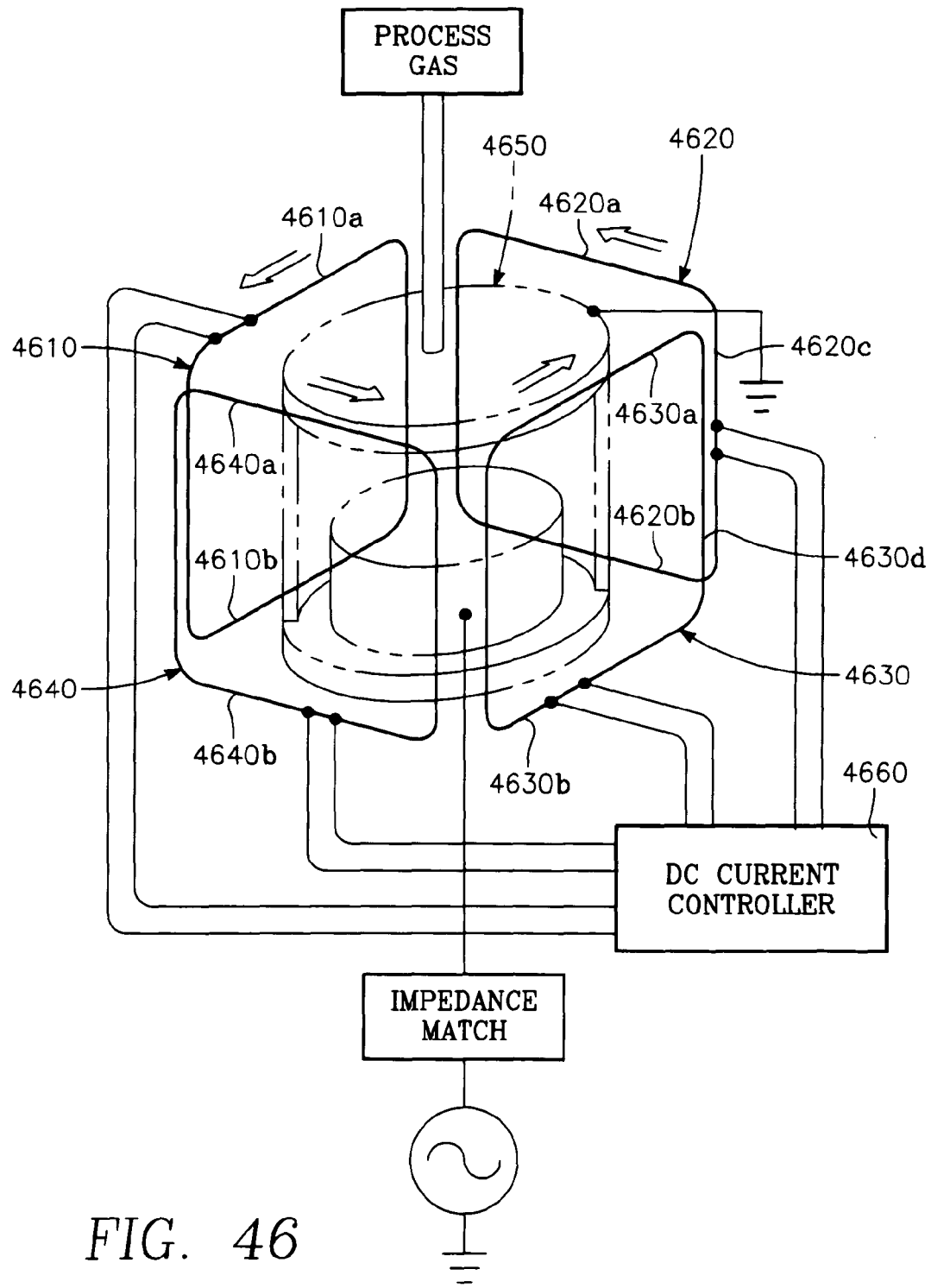
FIG. 46 illustrates how the upper and lower coils of FIGS. 44 can be replaced by configurable magnetic field (CMF) coils operated in such a manner as to produce the cusp-shaped magnetic field of FIG. 45.

FIG. 46 illustrates an case in which the four electromagnets 4610, 4620, 4630, 4640 of a conventional MERIE reactor 4650 are employed to generate the fully cusp-shaped magnetic field of FIG. 45. A current controller 4660 controlling the currents in each of the electromagnets 4610, 4620, 4630, 4640 is programmed to apply D.C. currents flowing in the same (e.g., clockwise) direction in all the electromagnets 4610, 4620, 4630, 4640, as indicated by the arrows in FIG. 46. In this way the D.C. currents in the top conductors 4610a, 4620a, 4630a, 4640a form a clockwise current loop, the D.C. currents in the bottom conductors 4610b, 4620b, 4630b, 4640b form a counter-clockwise current loop, while at each corner of the array the currents in the vertical conductors of adjacent electromagnets (e.g., the pair of vertical conductors 4620c and 4630d) cancel the magnetic fields of one another at the wafer surface. The net effect is to produce clockwise and counter-clockwise current loops at the top and bottom of the chamber, respectively, analogous to the case of FIG. 44, with the same resulting fully cusp-shaped magnetic field illustrated in FIG. 45. The reactor of FIG. 46 is operated in any one of three modes:

magnetic pressure mode, in which the cusp-shaped field is produced;

sine wave mode, in which four sine wave currents are applied in quadrature to the four electromagnets 4610, 4620, 4630, 4640 to produce a slowly rotating magnetic field over the wafer surface;

configurable magnetic field (CMF) mode, in which the four electromagnets 4610, 4620, 4630, 4640 are grouped into to opposing sets of adjacent pairs, one pair having one D.C. current and the opposite pair having the opposite D.C. current, to produce generally straight magnetic field lines extending across the wafer surface in a diagonal direction relative to the orientation of the four electromagnets 4610, 4620, 4630, 4640. This grouping is rotated by switching the currents so that the magnetic field rotates through four diagonal orientations. A time sequence of these orientations are illustrated in FIGS. 47A, 47B, 47C and 47D.

Figure 47A:
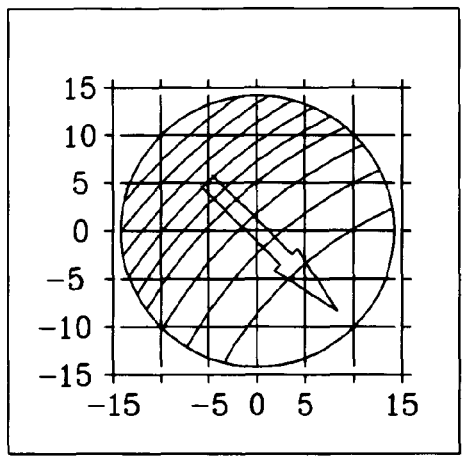
FIGS. 47A-47D illustrate a mode of operation of the CMF coils of FIG. 46 to produce a desired magnetic field configuration.
Figure 47B:
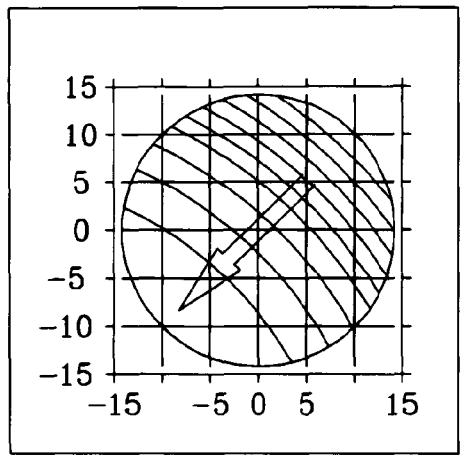
Figure 47C:
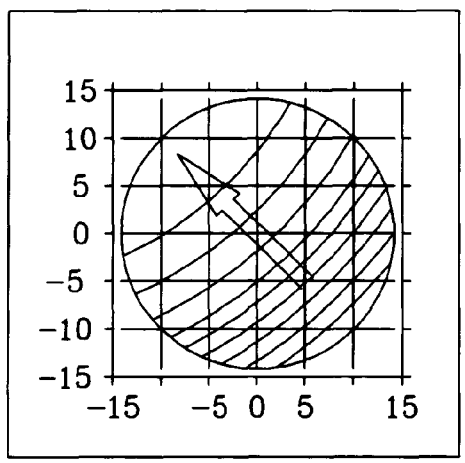
Figure 47D:
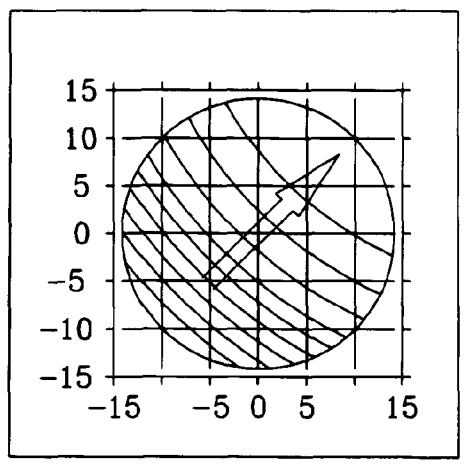

In FIG. 47A, the electromagnets 4610, 4620 have a positive D.C. current flow while the electromagnets 4630, 4640 have negative D.C. current flow, and the resulting average magnetic field direction is generally from the upper left corner to the lower right corner of the drawing. In FIG. 47B, the groupings have been switched so that the electromagnets 4620, 4630 have the positive current flow while the electromagnets 4640, 4610 have the negative current flow, and the average magnetic field has rotated clockwise by 90 degrees. FIGS. 47C and 47D complete the cycle. The strength of the magnetic field lines is determined by the magnitude difference in the positive and negative D.C. currents thus applied, and may be adjusted by programming the controller 4650 as desired.

The method of FIG. 9 may be employed in the CMF mode to accurately select the D.C. currents of the four electromagnets 4610, 4620, 4630, 4640 to produce the best correction for non-uniform etch rate or plasma ion density distribution. In applying the method of FIG. 9 to the CMF mode of FIGS. 47A-D, the coils of each of the electromagnets or coils 4610, 4620, 4630, 4640 are substituted for the overhead coils 60, 65, and all steps of FIG. 9 are performed in accordance with that substitution. The only difference is that the calculation of the magnetic field from each coil is computed as an average over the four time periods corresponding to FIGS. 47A-D.

Figure 48:
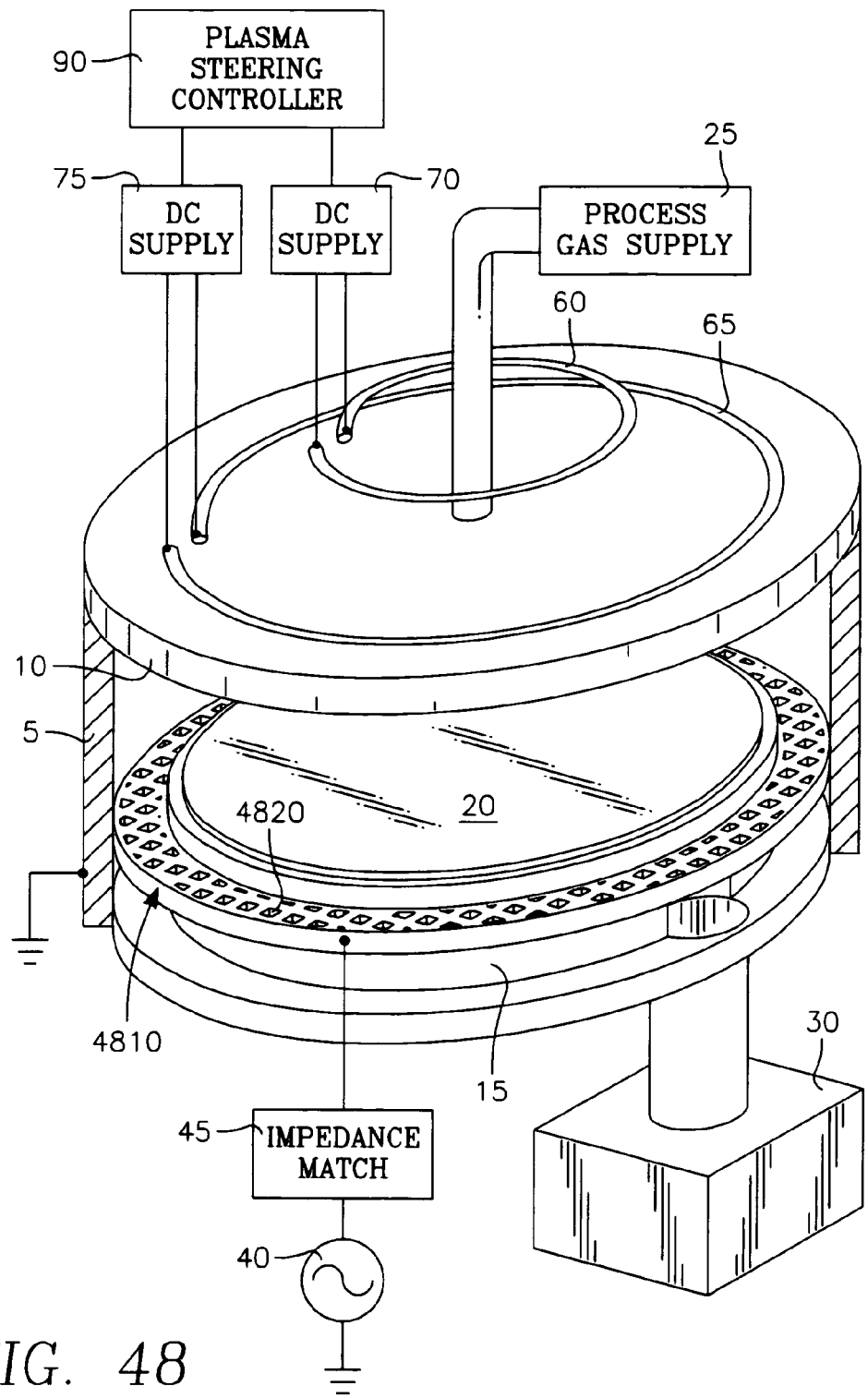
FIGS. 48, 49 and 50 illustrate an annular apertured plate in the reactor of FIG. 1A for preventing plasma ions from entering the reactor's pumping annulus.

FIG. 48 illustrates a reactor including a special grating 4810 inserted over the pumping annulus. The grating 4810 is formed of a semiconductive material such as silicon carbide or of a conductive material such as aluminum and has openings 4820 for permitting gas to be evacuated from the chamber through the pumping annulus. The special grating 4810 excludes plasma from the pumping annulus, providing needed protection and process control. For this purpose, the distance across the interior of each opening 4820 in the radial plane is no greater than twice the plasma sheath thickness. In this way it very difficult if not impossible for a plasma to penetrate through the grating 4810. This reduces or eliminates plasma interaction with chamber surfaces within the pumping annulus.

Figure 49:
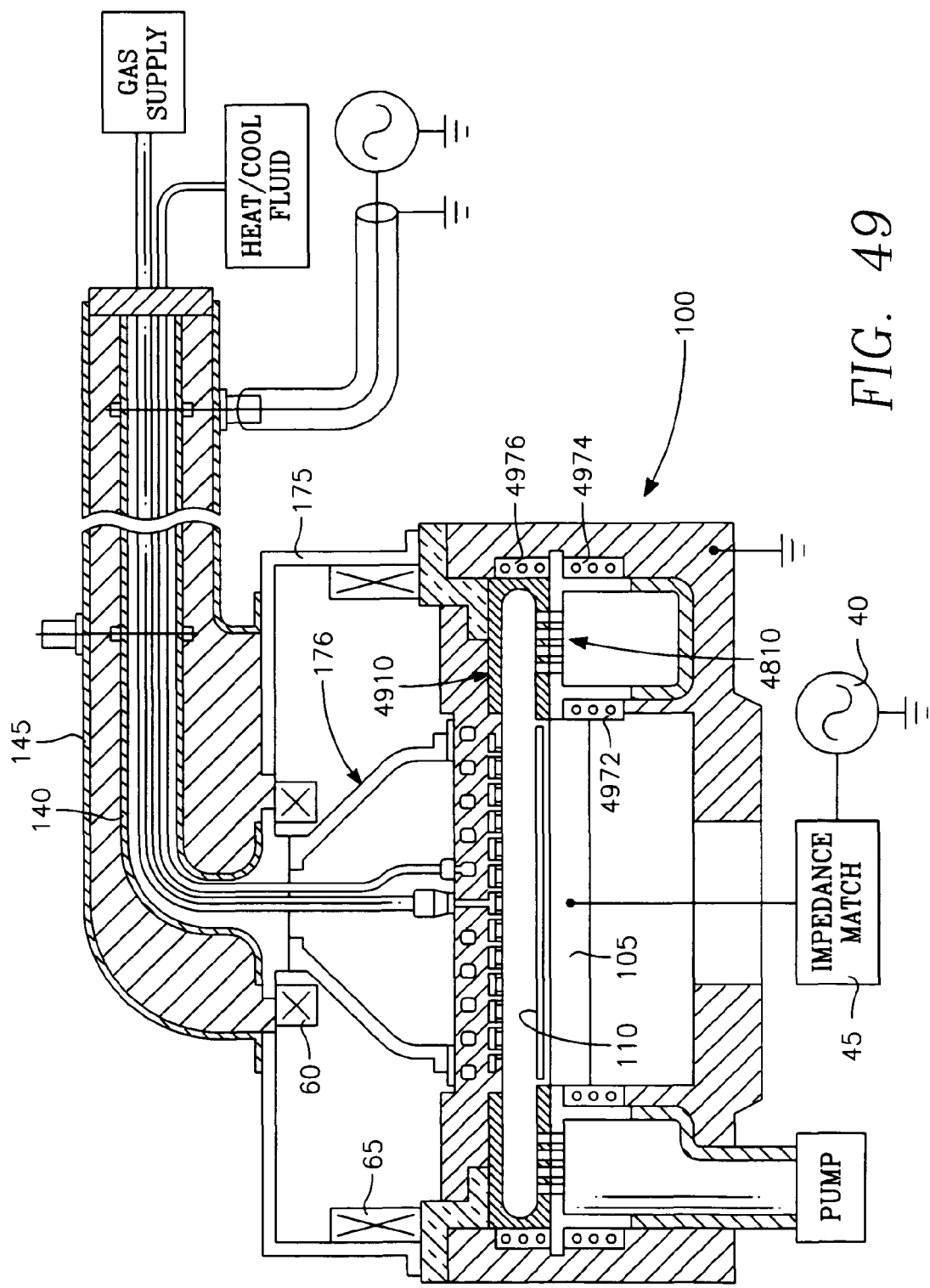
Figure 50:
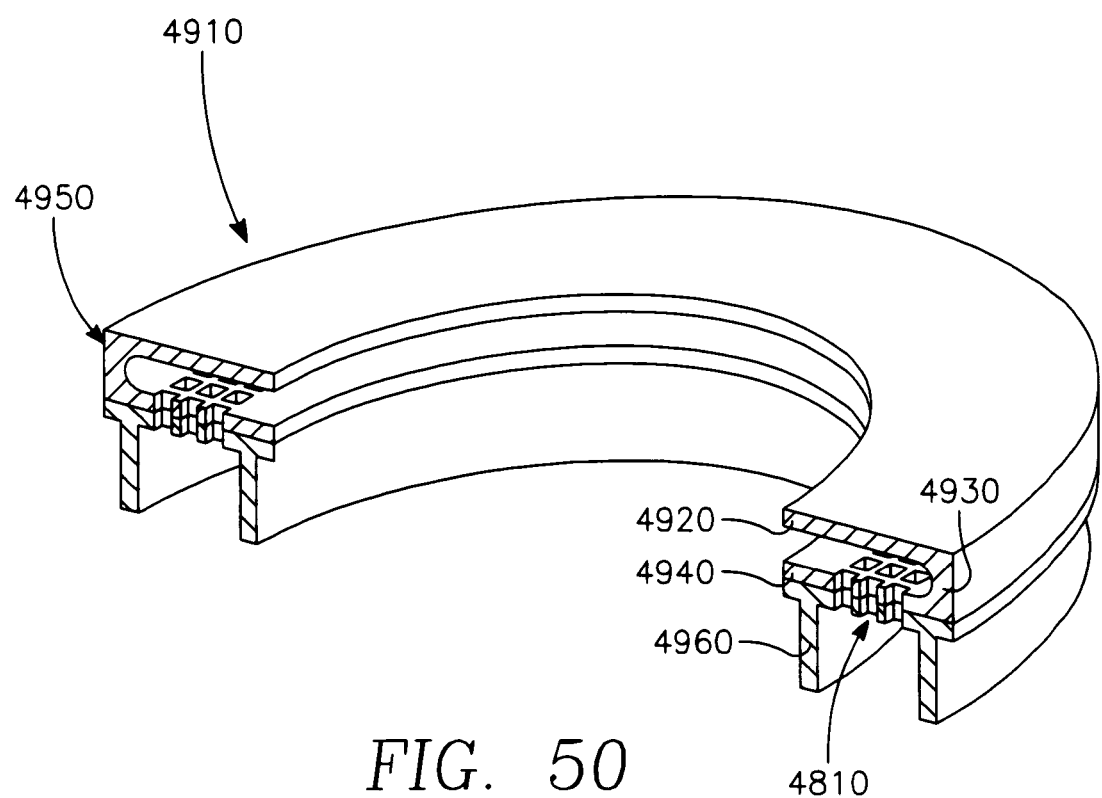

FIGS. 49 and 50 illustrate an integrally formed removable chamber liner 4910 that incorporates the plasma-confining grating 4810 of FIG. 48. The liner 4910 covers the portions of the chamber that are radially outside of the region underlying the electrode 125 and overlying the wafer 110. Thus, the liner 4910 includes an upper horizontal section 4920 covering an outer periphery of the chamber ceiling, a vertical section 4930 covering the chamber side wall and a lower horizontal section 4940 that includes the plasma-confining grating 4810 and covers the pumping annulus as well as an annular surface adjacent the wafer 110. In one case, each of the sections 4920, 4930, 4940 are formed together as a monolithic silicon carbide piece 4950. The liner 4910 further includes an aluminum base 4960 underlying the lower horizontal section 4940 of the silicon carbide piece 4950 and is bonded thereto. The aluminum base 4960 includes a pair of downwardly extending annular rails 4962, 4964 that are relatively long and thin and provide good electrical conductivity to grounded structural elements of the chamber below the wafer support pedestal 105.

The reactor can have temperature control elements 4972, 4974 in thermal contact with the downwardly extending annular rails 4962, 4964 as well as a temperature control element 4976 in thermal contact with the vertical side section 4930. Each of the thermal control elements 4972, 4974, 4976 can include cooling apparatus including coolant passages and heating apparatus including an electric heater. It can be desirable to maintain the liner 4910 at a sufficiently high temperature (e.g., as high as 120 degrees F.) to minimize or prevent deposition of polymer or fluorocarbon compounds on interior surfaces of the liner 4910.

The liner 4910 enhances process stability because it provides a good ground return path. This is due to the fact that the electric potential is uniform along the interior surface of the silicon carbide piece 4950 (including the interior-facing surfaces of the upper horizontal section 4920, the vertical section 4930 and the lower horizontal section 4940). As a result, the liner 4910 provides a uniform RF return path at all of its interior-facing surfaces for power delivered either from the overhead electrode 125 or from the wafer pedestal 105. One advantage is that as plasma fluctuations move the RF return current distribution to concentrate at different parts of the interior surface of the liner 4910, the impedance presented to that current remains fairly constant. This feature promotes process stability.

Figure 51:
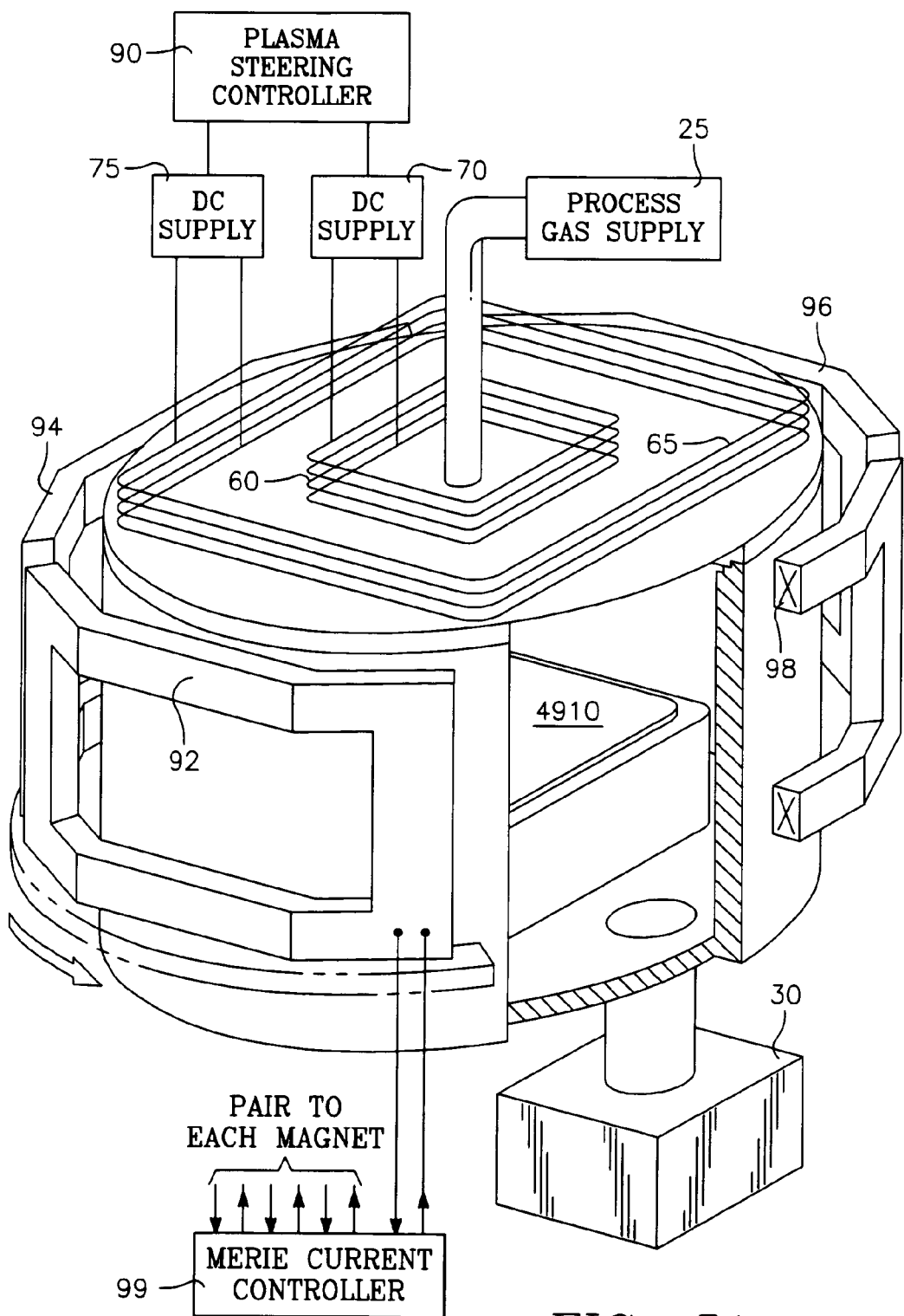
FIG. 51 illustrates a rectangular version of the reactor of FIG. 1A for processing rectangularly shaped workpieces.

FIG. 51 illustrates a modification of the case of FIG. 7 in which the overhead solenoids 60, 65 define a square pattern symmetrical with the square pattern of the MERIE magnets 92, 94, 96, 98, and is particularly suited for uniform processing of a square semiconductor or dielectric workpiece 4910, such as a photolithographic mask.

Figure 52:
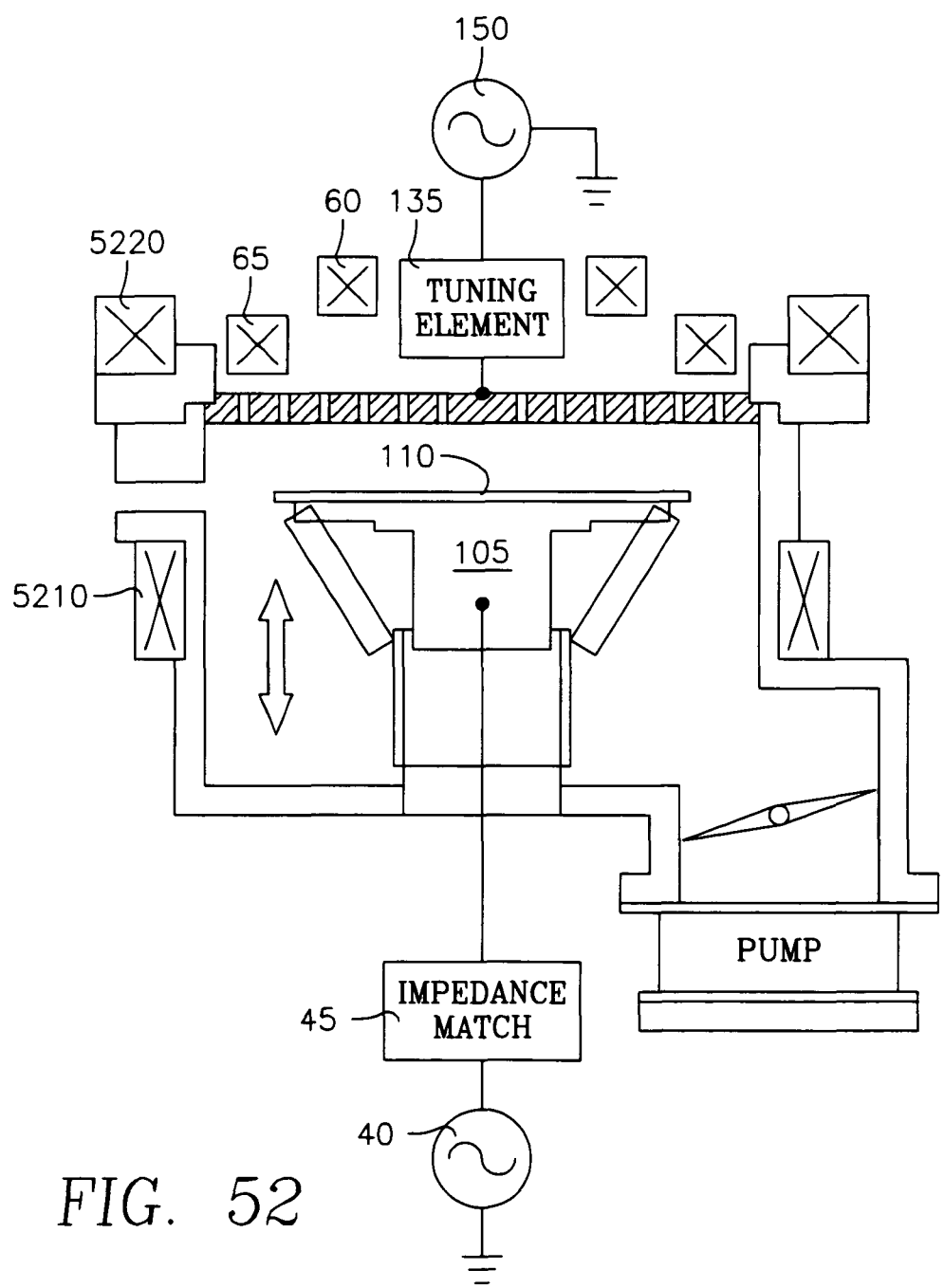
FIG. 52 illustrates a reactor corresponding to FIG. 1A having a retractable workpiece support pedestal.

FIG. 52 illustrates a version of the reactor of FIG. 24 in which the wafer support pedestal 105 may be moved up and down. In addition to the two overhead coils 60, 65 for controlling plasma ion radial distribution, there is a bottom coil 5210 below the plane of the wafer support pedestal 105. In addition, there is an outer coil 5220 at the periphery of the chamber. The outer overhead coil 65 and the bottom coil 5210 can have opposing D.C. currents to form a full cusp magnetic field within the chamber.

While the overhead coils 60, 65 have been described in combination with reactor having an overhead ceiling that serves as both an overhead source power electrode and as a gas distribution plate, the ceiling may be of the type that is not a gas distribution plate, with process gases being introduced in another conventional fashion (e.g., through the side wall). Moreover, the coils 60, 65 may be employed in a reactor in which source power is not capacitively coupled by a ceiling electrode. Also, the impedance match element for the overhead electrode has been described as being a fixed element such as a coaxial tuning stub. However, the impedance match element may be any suitable or conventional impedance match device such as a conventional dynamic impedance match circuit.

Three-Magnet Three-Mode Plasma Distribution Control:

In plasma processes such as plasma enhanced reactive ion etching, the magnetic fields are used to improve the uniformity of the radial distribution of the etch rate across the semiconductor wafer. In most cases, plasma ion density is greater at the wafer center and less elsewhere on the wafer, so that the etch rate tends to be higher at the wafer center and lower at the wafer periphery. Magnetic fields can be generated by the inner and outer magnets 60, 65 to change the radial distribution of the plasma ion density. Typically, the desired effect is to reduce plasma ion density at the center and increase it at the wafer periphery. The inner and outer electromagnets (FIG. 1B) can be used to accomplish such an improvement in plasma ion density distribution uniformity. The magnetic field they generate together can be analyzed by decomposing it into two components, such as a radial component $B_r$ (whose lines of flux are parallel to the planar wafer surface) and an axial component $B_z$ (whose lines of flux are perpendicular to the planar wafer surface). The radial component $B_r$ of the magnetic field is the most effective in changing or correcting radial distribution of plasma ion density (e.g., to achieve a uniform radial distribution of etch rate in an etch process or deposition in a CVD process). However, changing the radial component $B_r$ using only the inner and outer electromagnets 60, 65 necessarily changes the axial component $B_z$ of the magnetic field in a manner dictated by the change in the radial component $B_r$. For example, an increase in $B_r$ will typically cause an unavoidable increase in $B_z$. Such an increase in $B_z$ was not sought and may not be desirable. We have discovered that control of the axial component $B_z$ is closely linked with reducing device damage on the wafer (e.g., due to charge accumulation, high electric fields, high induced currents or voltages). We prefer in many cases to optimize (e.g., increase) the radial component $B_r$ to whatever degree is desired, while simultaneously minimizing the axial component $B_z$.

Figure 53A:
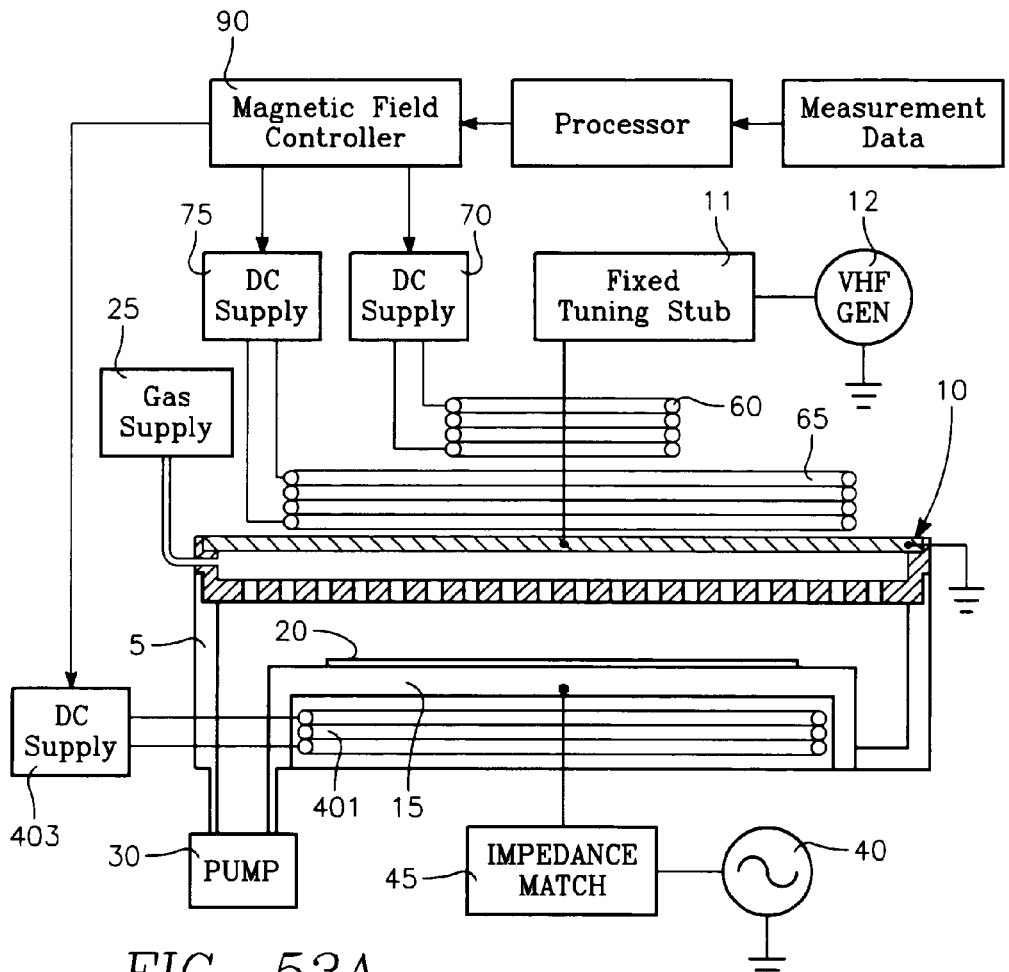
FIGS. 53A and 53B illustrate different embodiments employing two overhead coils and one underlying coil to control plasma ion distribution.
Figure 53B:
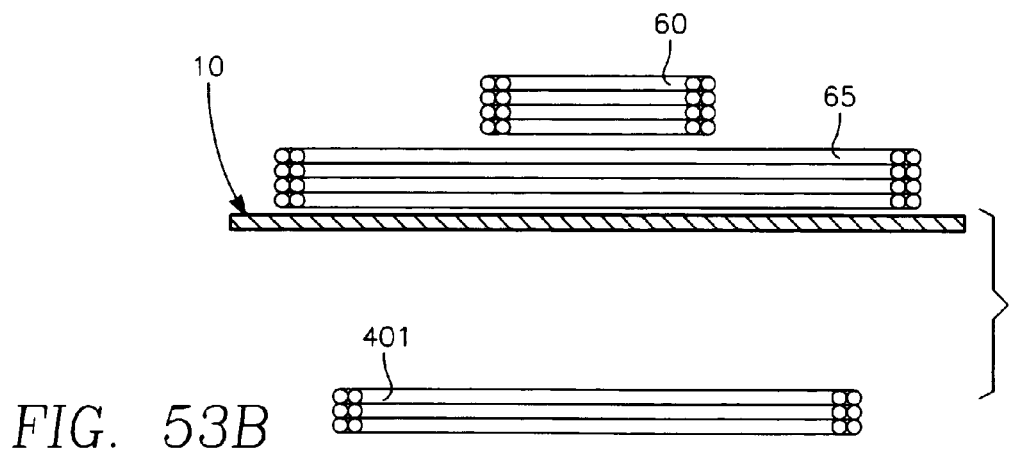
Figure 54:
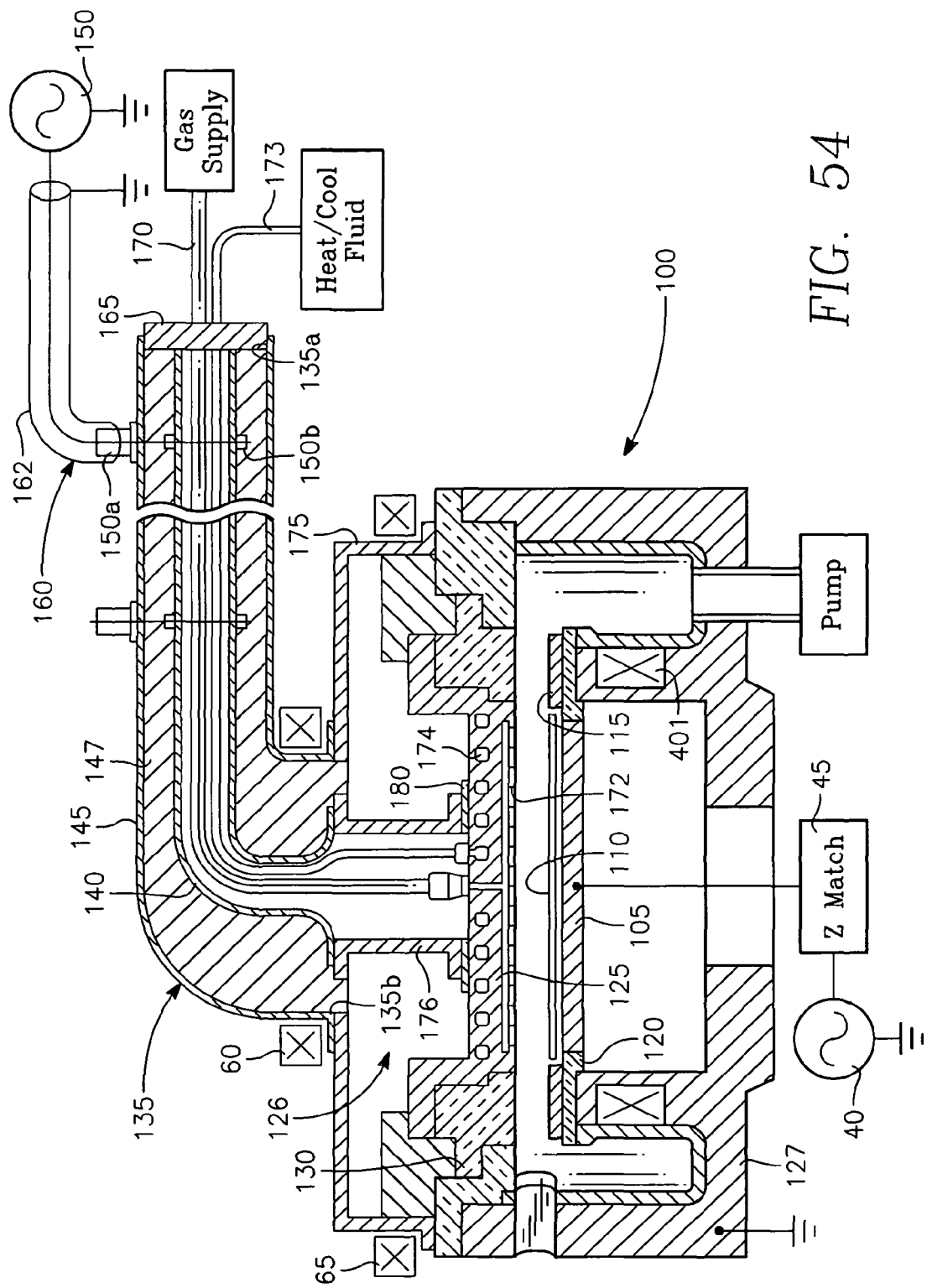
FIG. 54 depicts one embodiment of the present invention.

Referring to FIG. 53A, the inner and outer electromagnets 60, 65 of FIG. 1B are augmented by a bottom electromagnet 401 beneath the plane of the wafer. A D.C. current supply 403 governed by the controller 90 furnishes D.C. current to the bottom electromagnet 401, while the current supplies 70, 75 governed by the controller 90 furnish current to the inner and outer electro-magnets 60, 65. While each electromagnet 60, 65, 401 in FIG. 53A consists of a single conductor winding, they may instead consist of plural windings arranged vertically, as illustrated in FIG. 53B. FIG. 54 illustrates how the three electromagnets 60, 65, 401 may be placed in the reactor of FIG. 24. As described earlier in this specification, the reactor of FIG. 24 has an overhead VHF electrode driven by VHF plasma source power through a fixed impedance match element at a frequency at which the electrode and plasma resonate.

Figure 55A:
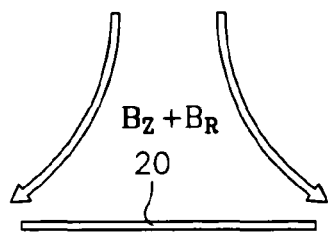
FIGS. 55A through 55C depict three magnetic fields at the wafer plane corresponding to three modes of the reactor of FIG. 54.
Figure 56A:
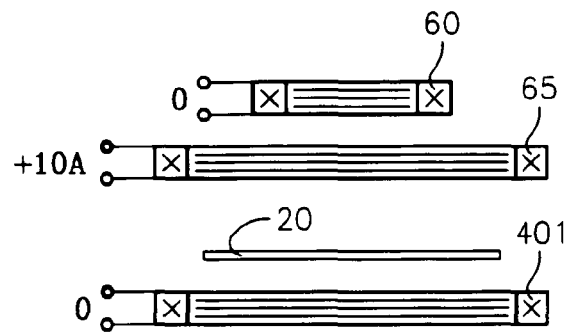
FIGS. 56A through 56C depict the applied electromagnet D.C. currents corresponding to FIGS. 55A through 55C, respectively.
Figure 55B:
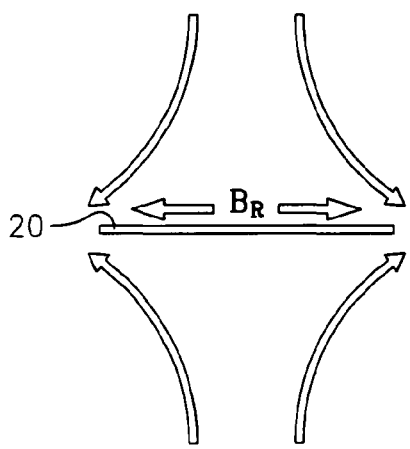
Figure 56B:
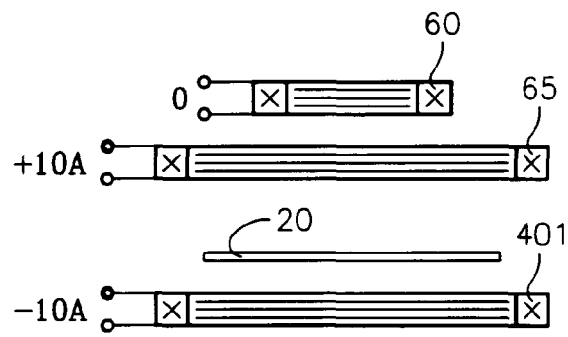
Figure 55C:
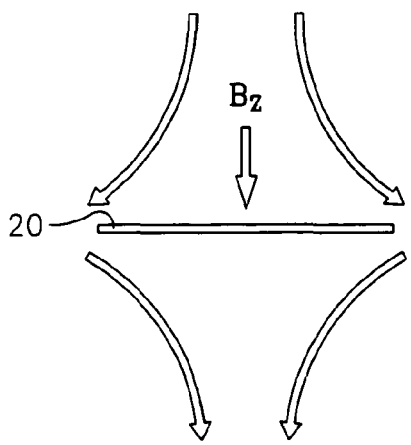
Figure 56C:
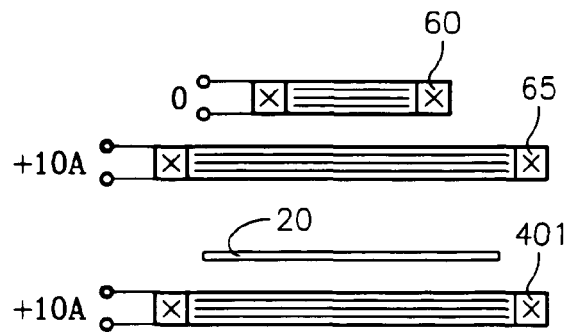

The magnets 60, 65, 401 may be used to generate any one (or a combination) of three types of magnetic fields: (1.) A solenoidal field (FIG. 55A) in which both $B_r$ and $B_z$ are strong at the surface of the wafer 20. Such a solenoidal field may be produced by applying current to only one of the three electromagnets 60, 65, 401. FIG. 56A illustrates an example in which the current is applied to the outer electro-magnet 65 to produce the solenoid field. (2.) A cusp field (FIG. 55B) in which only $B_r$ is strong and $B_z$ may be weak or zero at the surface of the wafer. Such a cusp field may be produced by generating equal and opposite magnetic fields from the bottom electro-magnet 401 and either one of the inner or outer electro-magnet 60, 65. FIG. 56B illustrates an example in which opposing currents are applied to the bottom and outer electromagnets 401, 65 to produce the cusp field. In this example, it is assumed that the coil winding(s) in each magnet 65, 401 are wound in the same (clockwise or counter-clockwise direction). However, in a preferred embodiment they may be wound in opposite directions, which case the polarities of the applied currents would be modified appropriately from that illustrated in FIG. 56. (3.) A mirror magnetic field (FIG. 55C), which may be produced by generating equal and co-directional magnetic fields in the bottom electromagnet 401 and either one of the inner or outer electromagnet 60, 65. FIG. 56C illustrates an example in which equal currents are applied to the bottom and outer electromagnets 401, 65 to generate the mirror field.

Figure 57A:
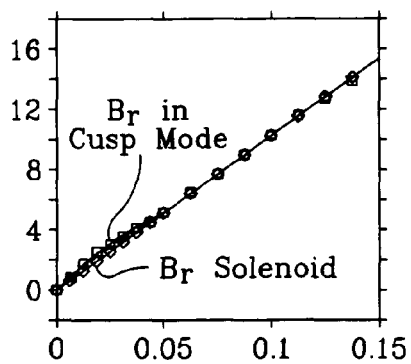
FIGS. 57A and 57B are graphs comparing the distributions of the radial component and axial component, respectfully, of the cusp mode and the solenoid mode of the reactor of FIG. 54.
Figure 57B:
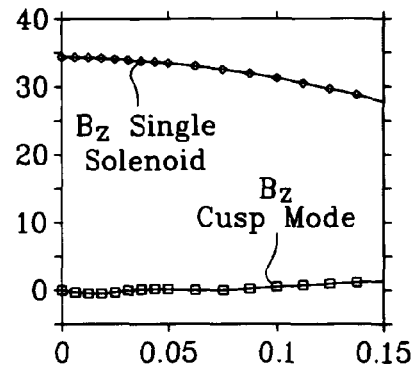
Figure 58A:
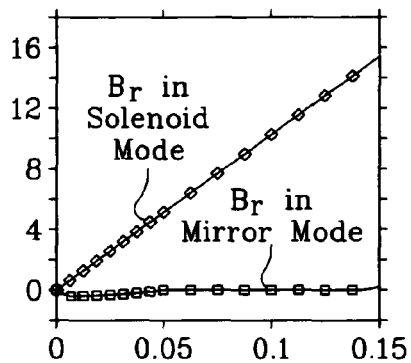
FIGS. 58A and 58B are graphs comparing the radial component and axial component, respectfully, of the solenoid and mirror modes of the reactor of FIG. 54.
Figure 58B:
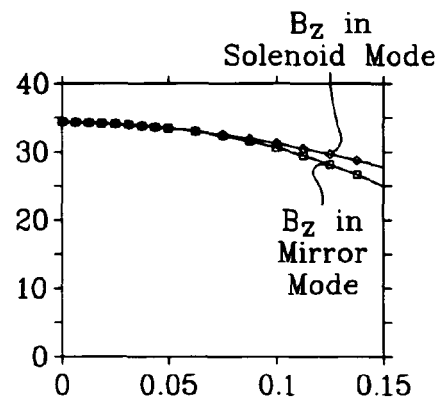

FIGS. 57A, 57B and FIGS. 58A, 58B compare the radial and axial field components $B_r(r)$ and $B_z(r)$ of the cusp and mirror fields to the radial and axial field components $B_r(r)$ and $B_z(r)$ of the solenoidal field, as measured at the plane of the wafer 20 in the reactor of FIG. 53A. FIG. 57A compares the radial components $B_r(r)$ of the solenoidal and cusp fields while FIG. 57B compares the axial components $B_z(r)$ of the solenoidal and cusp fields. FIG. 58A compares the radial components $B_r(r)$ of the solenoidal and mirror fields while FIG. 58B compares the axial components $B_z(r)$ of the solenoidal and mirror fields. The radial components of the solenoidal and cusp fields can be made nearly the same if desired (FIG. 57A), while the axial component of the cusp field is nearly (but not exactly) zero, or far less than the axial component of the solenoidal field (FIG. 57B). The radial component of the mirror field can be made nearly zero if desired (FIG. 58A), or far less than that of the solenoidal field. The axial component of the mirror field can be made nearly the same as that of the solenoidal field (FIG. 58B).

Figure 59:
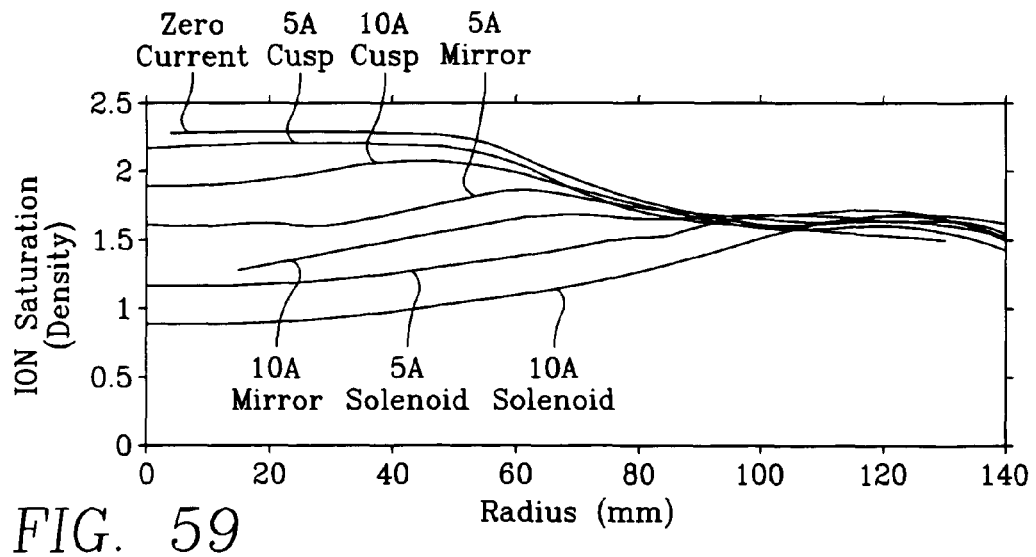
FIG. 59 is a graph of the plasma ion radial distribution (inferred from the ion saturation current) for different modes of the reactor of FIG. 54.

From FIGS. 57A and 58A, it can be seen that the radial field appears to be ideal for correcting a center-high plasma ion distribution, because the radial field increases from the wafer center to a maximum strength at the wafer periphery. This is confirmed in the data depicted in the graph of FIG. 59, in which plasma ion density indicated by the plasma ion saturation current (vertical axis) is plotted as a function of radius (horizontal axis) on the wafer surface. The curve labeled "zero current" corresponds to zero magnetic field, and shows the least optimum disposition for a center-high plasma ion distribution. The best correction for a center high plasma ion distribution are the two solenoid fields produced by either 5 amps or 10 amps in the outer electromagnet 65 (labeled "5 A solenoid" and "10 A solenoid", respectively). It is the solenoid fields which increase the most from the center to the edge of the wafer, according to the graph of FIG. 59.

Figures 60, 61:
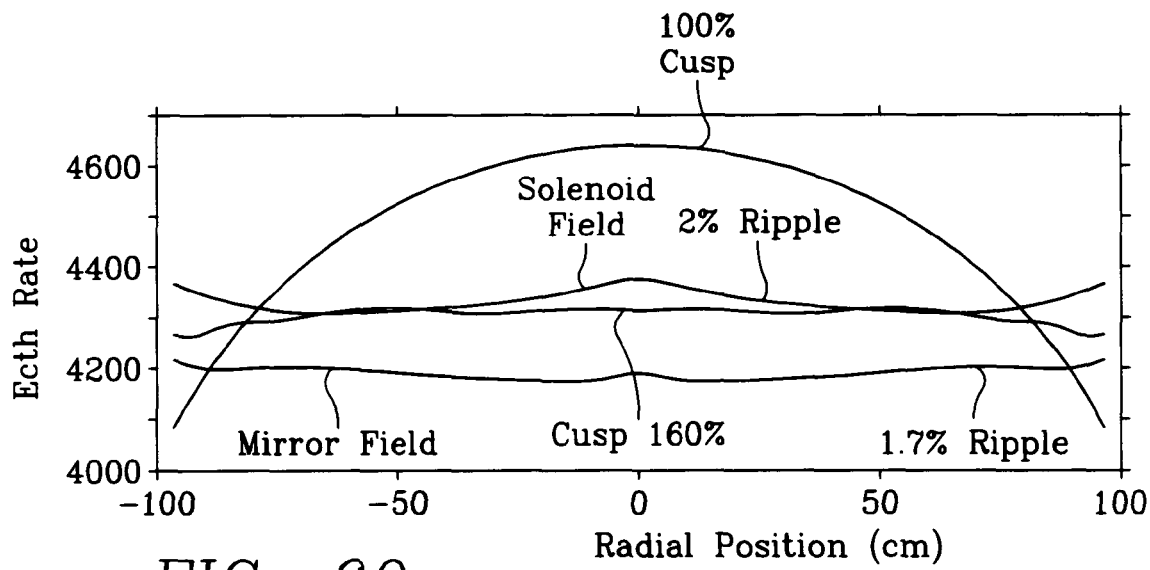
FIG. 60 is a graph of the etch rate as a function of radius for different magnetic fields or modes of the reactor of FIG. 54.
FIG. 61 depicts a table characterizing different magnetic fields or modes by etch rate nonuniformity and device damage.

FIG. 60 is a graph of data obtained by measuring etch rate as a function of radial position on the wafer surface of a 200 mm silicon wafer for different magnetic fields. The mirror field produced the best uniformity or lowest deviation of the etch rate distribution (about 1.7% fractional deviation, where the fractional deviation is defined as the standard deviation divided by the average etch rate across the wafer. The next best uniformity was obtained with a solenoidal field, that produced a fractional deviation of about 2%. The cusp field (labeled "100% cusp") was only third best, with a fractional deviation of 7.9%. However, a measurement of device damage on the wafer (due to charge accumulation, discharge or local high current or voltage conditions) produced opposite results, in which the most uniform case (the mirror field) had the most device damage, and the next best uniform case (the solenoid field) had the next most device damage, while the cusp field had almost no damage. These results will be discussed below with reference to FIG. 61.

The foregoing results bear out our findings that the control of the magnetic field axial component $B_z(r)$ relative to the radial component $B_r(r)$ is closely linked to improving device damage results on the wafer. The cusp field generated little or no device damage. However, we felt that the behavior of the radial component $B_r(r)$ shown in FIGS. 57A and 58A as increasing with radius, held out the better prospects for attaining uniformity than the axial component $B_z(r)$. Therefore, the following method was carried out: The cusp field was adjusted so that the radial component $B_r$ at the wafer edge was the same as in the solenoidal field of FIG. 60 that yielded such good results (i.e., 22 Gauss at the wafer edge). Then, the magnitude of the cusp field was increased (increasing $B_r(r)$ while minimizing or zeroing $B_z$) until uniformity results were obtained approximating the ideal results obtained with the solenoidal field. We found that this required increasing the cusp field magnitude until $B_r$ at the wafer edge increased from 22 Gauss to 32 Gauss (or about 160%). This produced the etch rate distribution curve labeled "cusp 160%" in the graph of FIG. 60. At that point, the fractional deviation in the etch rate was reduced to 2.4%. The cusp field continued to cause little or no device damage despite the dramatic increase in its strength.

The foregoing is summarized in the table of FIG. 61. The left column states the field type and lists, in Gauss, $B_z$ at the wafer center, and $B_r$ at the wafer edge for that field. The middle column lists the corresponding fractional deviation (non-uniformity) of the etch rate, and the right column provides an assessment ("good" or "bad") of device damage and lists the induced device current (in milliamps) and voltage (in volts). The table of FIG. 61 shows the good uniformity and poor device damage results obtained with the solenoid and mirror fields, and the poor uniformity and good device damage results obtained with the cusp field having a $B_r$ at the wafer edge matching that of the solenoidal field. The last row of the table shows the good uniformity and good device damage results obtained when the cusp field (in virtual absence of the other fields) was increased to 160% of its previous level.

Figure 62:
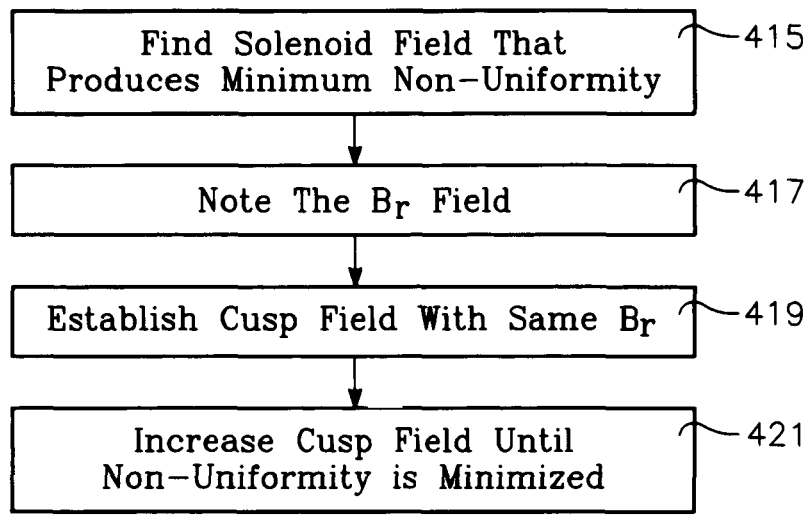
FIG. 62 depicts a basic process for determining optimum D.C. coil currents for at least two of the three magnets.

The foregoing approach is facilitated in the method illustrated in FIG. 62. The first step (block 415 of FIG. 62) is to find a solenoid field strength at which etch rate radial distribution non-uniformity is minimized. This corresponds to the solenoid field of FIG. 60 having a radial component strength of 22 Gauss at the wafer edge. The exact value may vary depending upon the particular process. The radial component value at a selected radius (e.g., the wafer edge) is noted (block 417). Then, a cusp field is established, with the other fields being absent or negligible, having the same radial component field strength at the selected radius (block 419) as noted in the step of block 417. Finally, the cusp field strength is increased until the etch rate radial distribution non-uniformity is minimized (block 421). This step corresponds to the increasing of the cusp radial component from 22 Gauss to 32 Gauss, although these values may vary depending upon the process being carried out.

Figure 63:
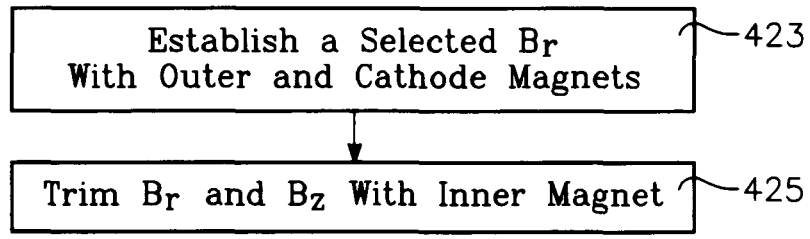
FIG. 63 depicts an additional process that can follow the process of FIG. 62 for determining D.C. currents for all three magnets.

The cusp field in the method of FIG. 62 is established using the outer electromagnetic 65 and the bottom electromagnet 401. Once a desired radial component $B_r(r)$ has been established, in accordance with the method of FIG. 62, further trimming or correction may be made by applying a relatively small current to the inner electromagnet 60. The inner electromagnet current may be selected to further enhance uniformity or to control or reduce the axial component $B_z(r)$ to improve device damage results (i.e., reduce device damage). This approach is implemented in the method of FIG. 63, in which the first step (block 423) is to establish the desired radial component strength $B_r(r)$, using the method of FIG. 62 for example. Then, the conditions are optimized (either to further improve uniformity or to eliminate $B_z$) by furnishing a relatively small current to the inner electromagnet 60 (block 425 of FIG. 63).

Figure 64:
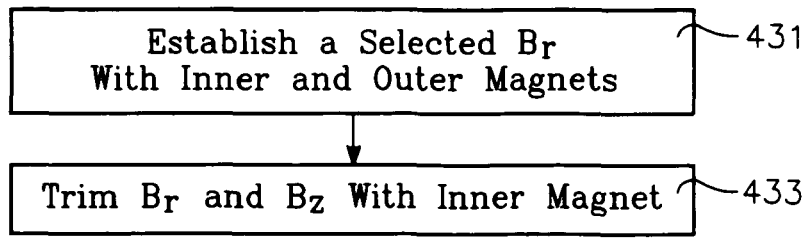
FIG. 64 depicts an alternative to the process of FIG. 63.

In a modification of this process illustrated in FIG. 64, a desired magnetic field (e.g., an ideal $B_r(r)$) is established with the inner and outer magnets 60, 65, while the bottom magnet is inactive (block 431 of FIG. 64). Then, the field is trimmed in block 433 of FIG. 64 (e.g., to increase $B_r$ if desired) by increasing current flow through the inner electromagnet 401 until the desired results are obtained. In some embodiments, it may be that improved uniformity of plasma ion density distribution is obtained by actually adding a very small axial magnetic field $B_z$ from the inner magnet 60 without incurring an unacceptable increase in device damage.

Figure 65:
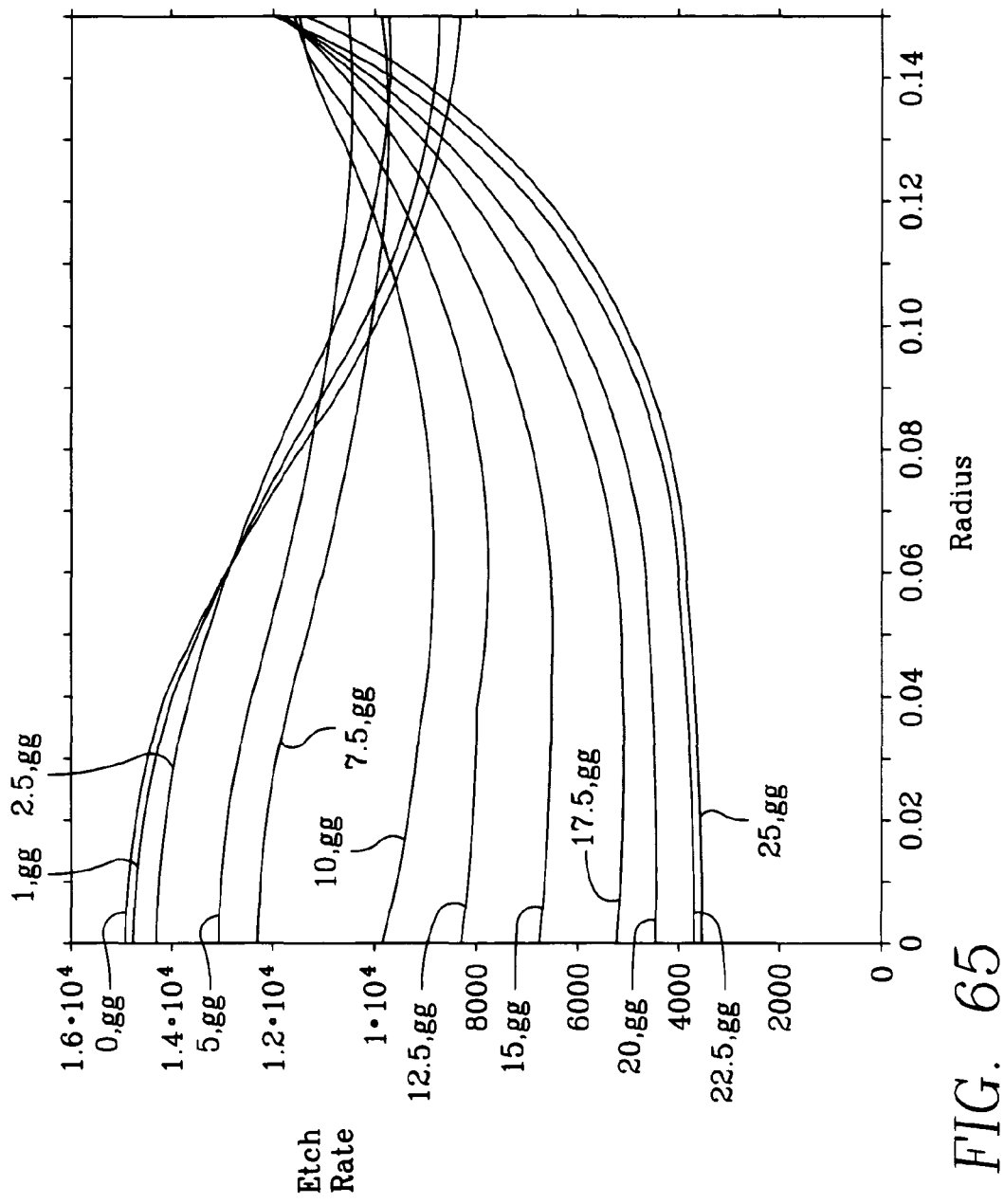
FIG. 65 is a graph depicting etch rate radial distribution for different magnetic field strengths in accordance with a first search with one magnet.
Figure 66:
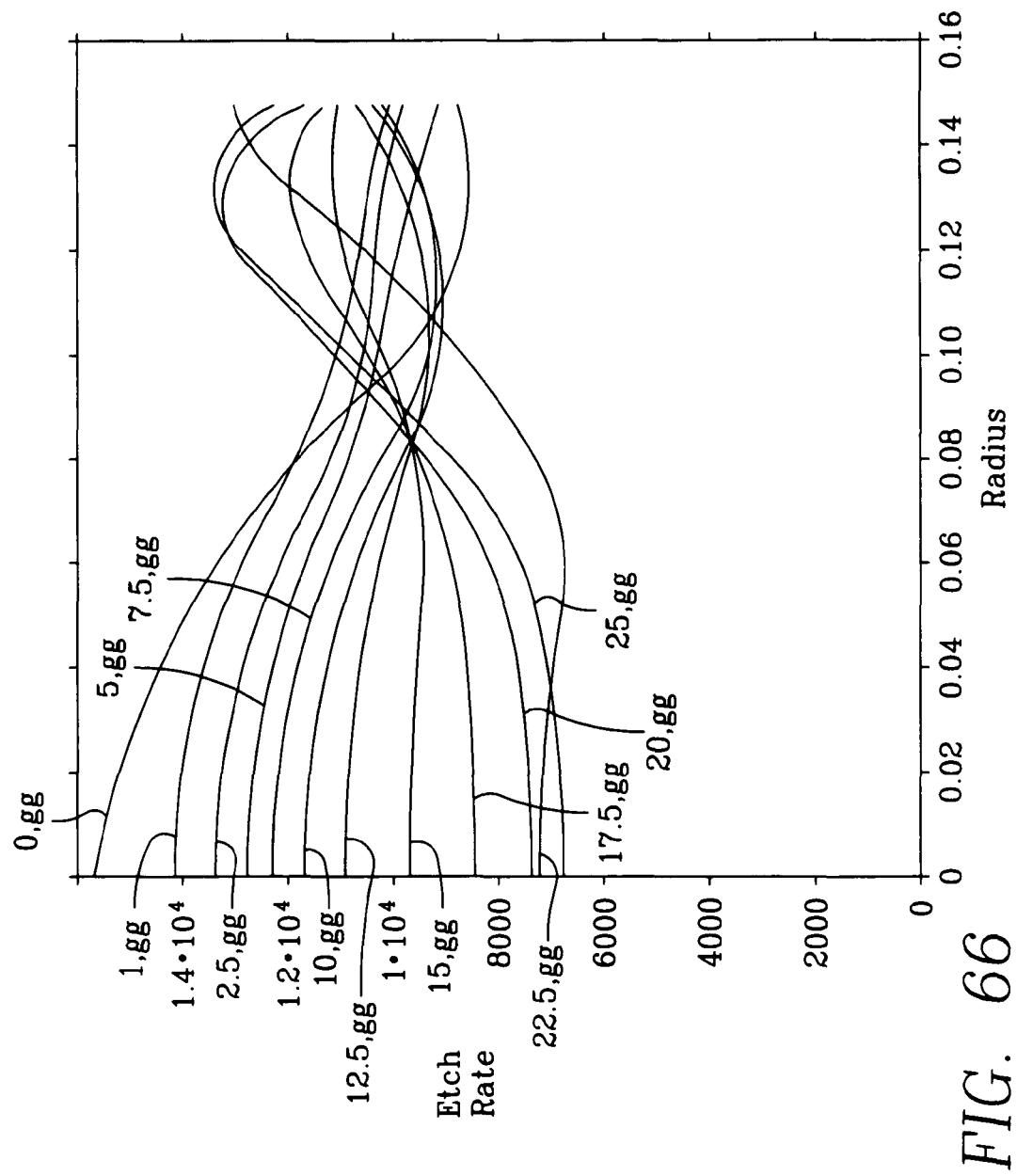
FIG. 66 is a graph depicting etch rate radial distribution for different magnetic field strengths in accordance with a second search with another magnet.

In carrying out the process of FIG. 64, a desired set of D.C. current values for the inner and outer electromagnets 60, 65 may be found for minimum non-uniformity of the etch rate distribution. This may be accomplished by measuring the etch rate radial distribution obtained for each value of the current in one of the inner and outer electromagnets 60, 65 when the other has zero current. For example, FIG. 65 is a graph containing curves representing the etch rate radial distribution data for different values of the D.C. current furnished to the inner magnet 60 within a selected range (0 Amps to 25 Amps). FIG. 66 is a graph containing curves representing the etch rate radial distribution data for different values of the D.C. current furnished to the outer magnet 65 within a selected range (0 Amps to 25 Amps). Different pairs of the etch rate distribution curves from FIGS. 65 and 66 may be superimposed to simulate the resultant etch rate distribution for a given pair of inner and outer magnet current values $I_i, I_o$ until many or all possible pairs have been juxtaposed and the corresponding etch rate radial distributions $E(r)_{I_i,I_o}$ obtained by superposition. Then, each etch rate distribution is processed to compute the corresponding non-uniformity (e.g., the fractional deviation D, which has been defined previously herein). This produces a set of deviations $D(I_i,I_o)$ which may be represented as a single surface illustrated in FIG. 67. This surface or function may be inspected using conventional techniques to find the value or set of values of $I_i, I_o$ that minimize the fractional deviation D (vertical axis of FIG. 67). These are the values selected by the controller 90 for the inner and outer magnet currents.

Figure 67:
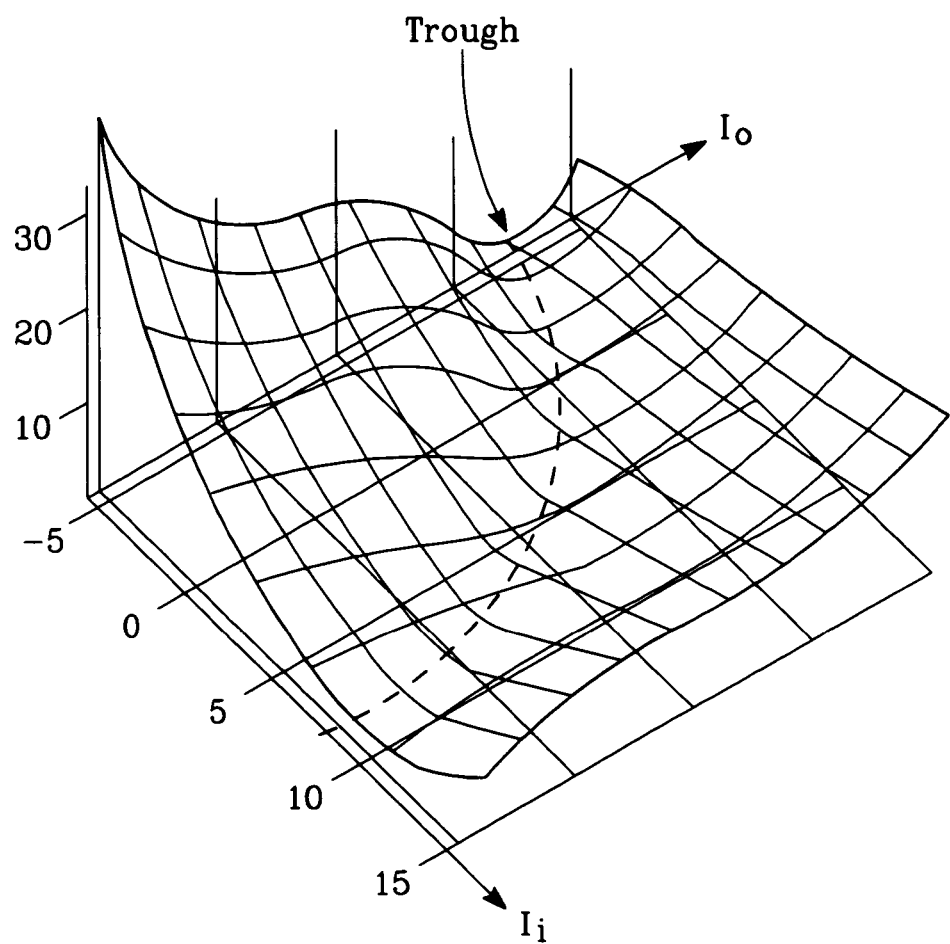
FIG. 67 is a graph depicting a mathematical distribution function constructed from the distributions of FIGS. 65 and 66.
Figure 68:
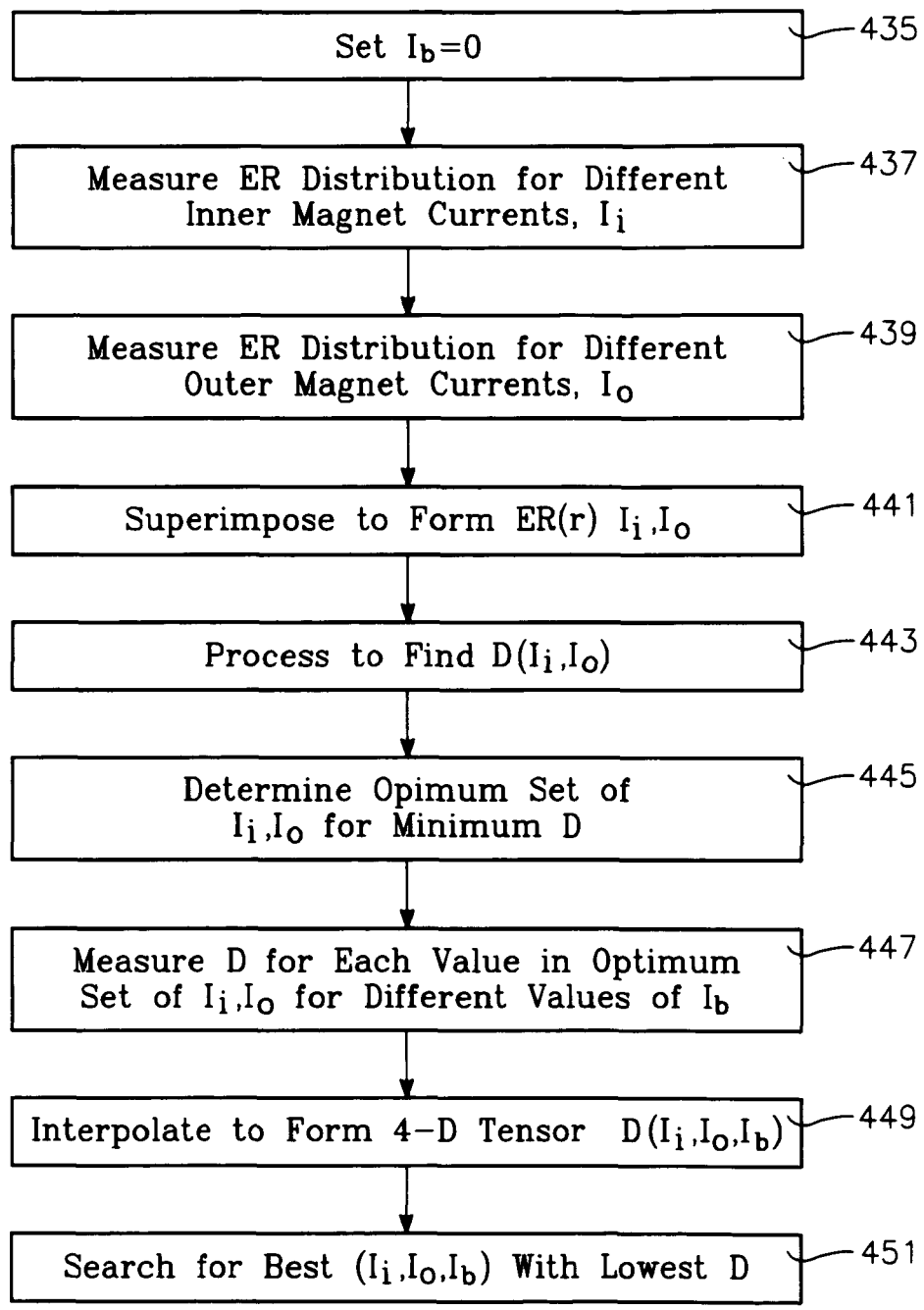
FIG. 68 depicts one process for determining optimum electromagnet D.C. currents.

The foregoing approach is implemented in the method illustrated in FIG. 68. First, the bottom magnet current is set to zero (block 435). The etch rate radial distribution is measured for different inner magnet currents to obtain a set of distributions $E(r)_{I_i}$ (block 437) and for different outer magnet currents to obtain a set of distributions $E(r)_{I_o}$ (block 439). Corresponding pairs of the two distributions are superimposed to form different etch rate distributions $E(r)_{I_i,I_o}$ (block 441) from which the corresponding deviations $D(I_i,I_o)$ are computed (block 443). The set of deviations $D(I_i,I_o)$ are represented by a surface (FIG. 67), which is searched for the set of values of $(I_i,I_o)$ which yield minimum fractional deviation D (block 445).

Inspection of the 3-dimensional surface $D(I_i,I_o)$ of FIG. 67 reveals an elongate trough (highlighted by dashed line) corresponding to a series or list of successive optimum pairs $(I_i,I_o)$ for which D (vertical axis) is minimum. This trough may be found by conventional searching. In order to optimize use of the third magnet (i.e., the bottom magnet 401), each one of the optimum pairs $(I_i,I_o)$ may be combined with successive values of the bottom magnet current, $I_b$, lying in a predetermined range and each combination of three currents $(I_i,I_o,I_b)$ applied to the reactor and the etch rate deviation measured. This last operation is the step of block 447 of FIG. 68. The results may be interpolated (block 449) to generate a set of deviation values $D(I_i,I_o,I_b)$. These sets of values may be represented by a 4-dimensional surface which is searched (block 451) using conventional techniques for the set of values $(I_i,I_o,I_b)$ that minimizes D. This minimization can provide an improvement upon the minimization obtained in the step of block 445 that used only two magnets. The final optimum value or values of $(I_i, I_o, I_b)$ are applied to the respective electromagnets 60, 65, 401 during processing of a production wafer for optimum process uniformity.

The process of FIG. 68 may be summarized as follows: Initially, only a pair of the three magnets is characterized, e.g., the inner and outer magnets 60, 65. This magnet pair is then treated as a single entity and characterized with third magnet, e.g., the bottom magnet 401, so that simultaneous use of the three magnets is optimized. However, there are three possible orders in which the three magnets are characterized. One is the example given in FIG. 68. In a second one, the initial pair of magnets characterized is the outer magnet 65 and the bottom magnet 401, and the third magnet is the inner magnet 60. In a third one, the initial pair of magnets characterized is the inner magnet 60 and the bottom magnet 410, and the third magnet is the outer magnet 65.

Figure 69:
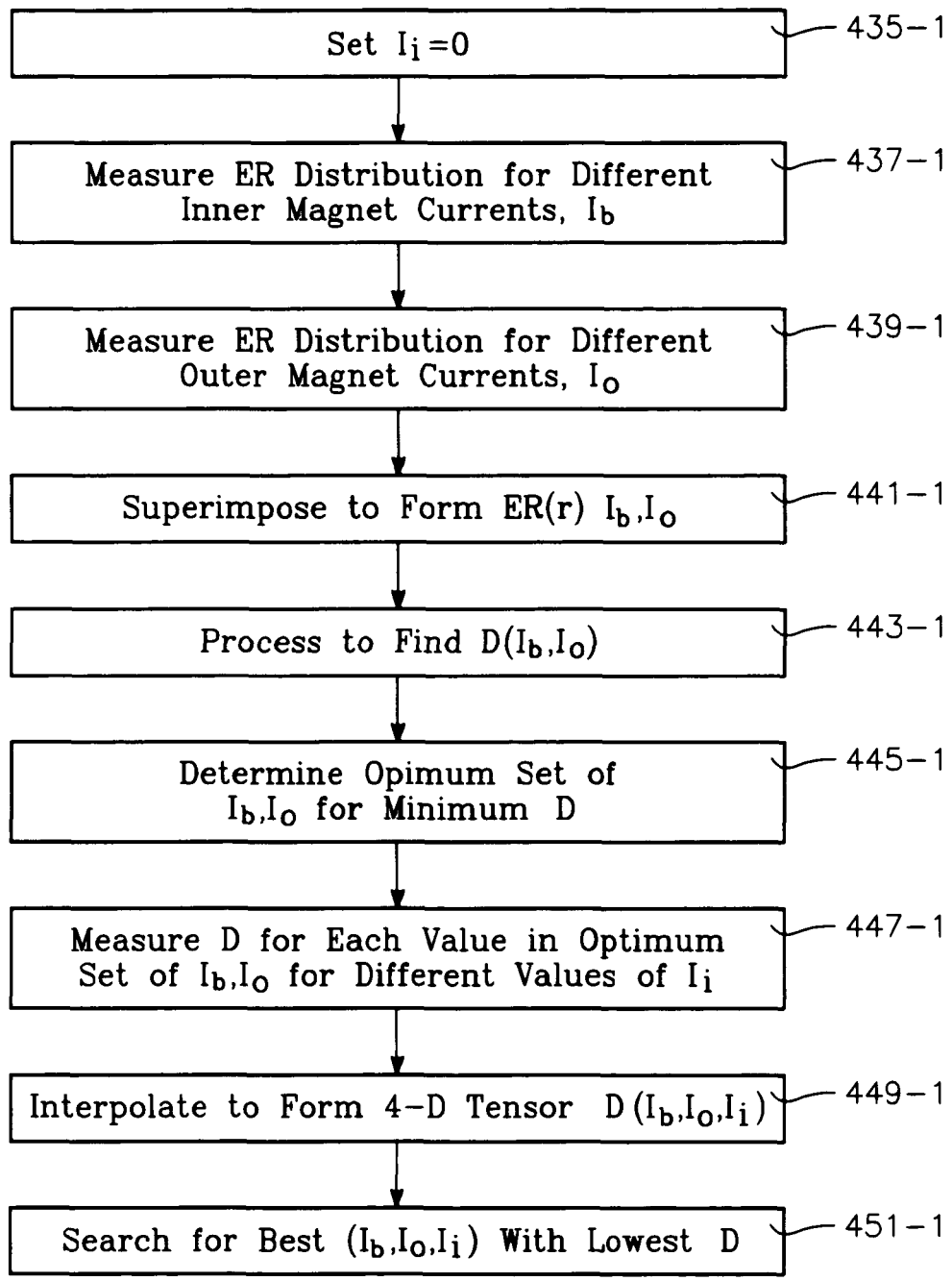
FIG. 69 depicts another process for determining optimum electromagnet D.C. currents.

FIG. 69 illustrates the second version of this process, in which the initial magnet pair is the outer magnet 65 and the bottom magnet 401 and the third magnet is the inner magnet 60. In the first step of FIG. 69, the inner magnet current is set to zero (block 435-1). The etch rate radial distribution is measured for different bottom magnet currents to obtain a set of distributions $E(r)_{Ib}$ (block 437-1) and for different outer magnet currents to obtain a set of distributions $E(r)_{Io}$ (block 439-1). Corresponding pairs of the two distributions are superimposed to form different etch rate distributions $E(r)_{Ib,Io}$ (block 441-1) from which the corresponding deviations $D(I_b, I_o)$ are computed (block 443-1). The set of deviations $D(I_b, I_o)$ are represented by a surface (similar to that of FIG. 67), which is searched for the set of optimum values of $(I_b, I_o)$ which yield minimum deviation or minimum fractional deviation D (block 445-1).

In order to optimize use of the third magnet (i.e., the bottom magnet 401), each one of the optimum pairs $(I_i, I_o)$ may be combined with successive values of the bottom magnet current, $I_b$, lying in a predetermined range and each combination of three currents $(I_i, I_o, I_b)$ applied to the reactor and the etch rate deviation measured. This last operation is the step of block 447-1 of FIG. 69. The results may be interpolated (block 449-1) to generate a set of deviation values $D(I_i, I_o, I_b)$. These sets of values may be represented by a matrix (or 4-dimensional surface) which is searched (block 451-1) using conventional techniques for the set of values $(I_i, I_o, I_b)$ that minimizes the deviation or minimize the fractional deviation D. The D.C. currents applied to the three magnets 60, 65, 401 are established according to this final set of values.

Figure 70:
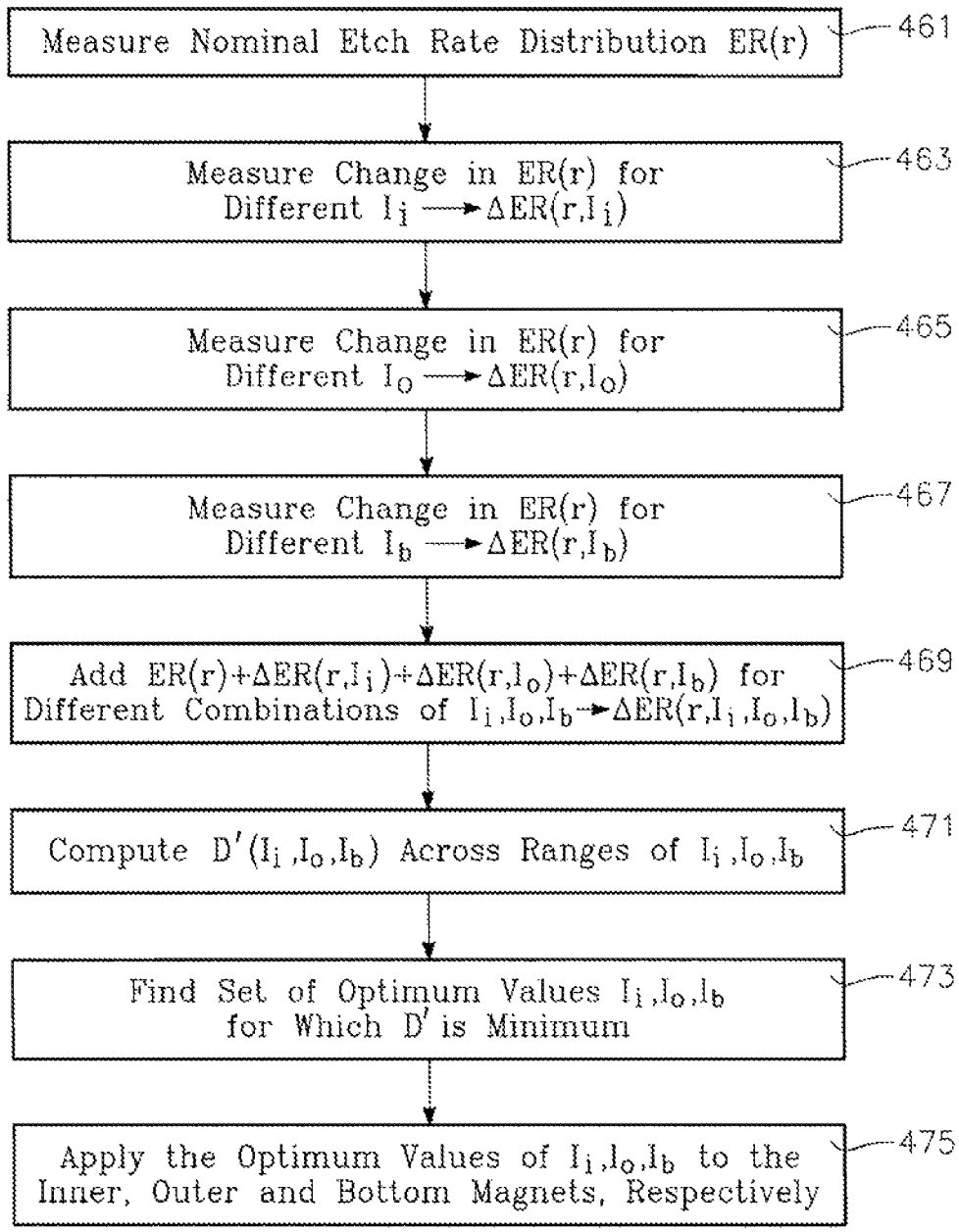
FIG. 70 depicts yet another process for determining optimum electromagnet D.C. currents.

FIG. 70 is a flow diagram illustrating another method for achieving uniform plasma or etch rate distribution using the three electromagnets 60, 65, 401. First, a nominal (uncorrected) etch rate distribution $ER(r)$ is measured while no current is applied to the electromagnets 60, 65, 401 (block 461). Then, the change in etch rate radial distribution caused by the inner coil current $I_i$, namely $\Delta ER(r, I_i)$, is measured for many different values of $I_i$ (block 463). The change in etch rate radial distribution caused by the outer coil current Io, namely $\Delta ER(r, I_o)$, is measured for many different values of $I_o$ (block 465). The change in etch rate radial distribution caused by the bottom coil current $I_b$, namely $\Delta ER(r, I_b)$, is measured for many different values of $I_b$ (block 467). Then for each combination of different values of $I_i$, $I_o$ and $I_b$, an etch rate distribution is computed (block 469) as:

$ER(r, I_i, I_o, I_b) = ER(r) + \Delta ER(r, I_i) + \Delta ER(r, I_o) + \Delta ER(r, I_b)$. The non-uniformity or deviation or fractional deviation $D(I_i, I_o, I_b)$ of each of these distributions is computed (block 471). The matrix $D(I_i, I_o, I_b)$ may be interpolated to provide a smooth function, which is then searched (block 473) for the set or sets of values $(I_i, I_o, I_b)$ for which D is minimum. The optimum set of D.C. currents $(I_i, I_o, I_b)$ thus found are applied to the three magnets 60, 65, 401 (block 475).

Figure 71A:
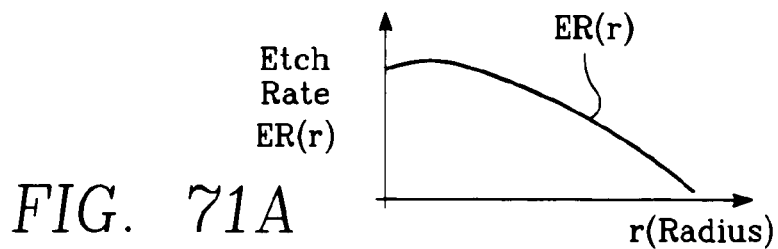
FIGS. 71A through 71E depict etch rate distributions obtained in successive steps of the process of FIG. 70.
Figure 71B:
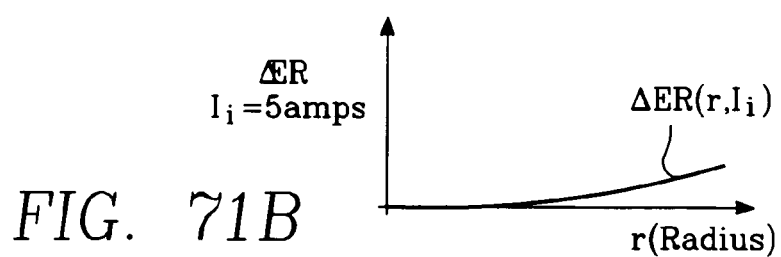
Figure 71C:
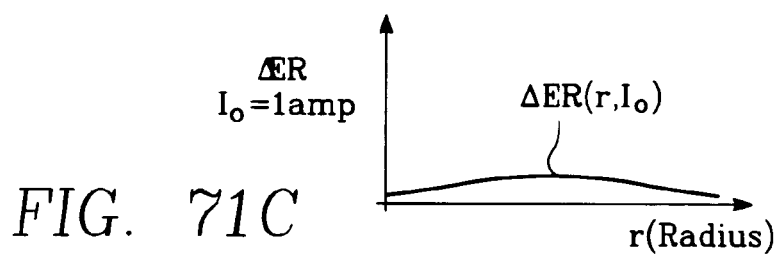
Figure 71D:
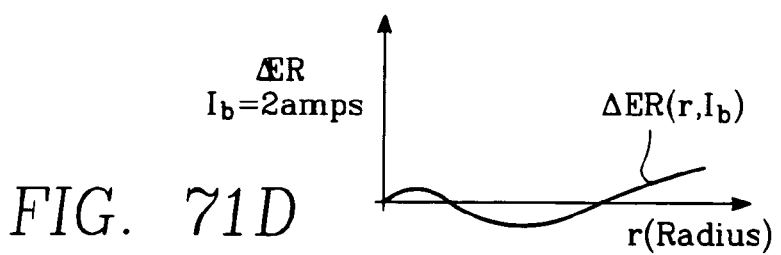
Figure 71E:
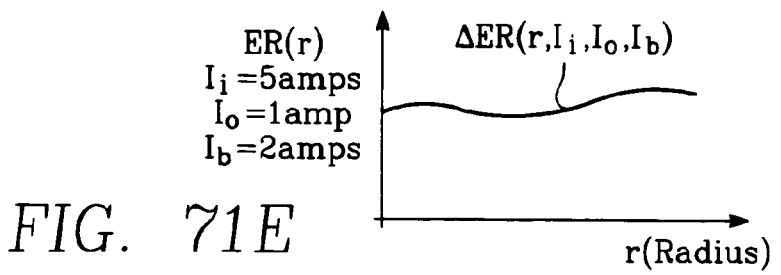

FIGS. 71A through 71E graphically illustrate a tutorial example of the computation of a single one of the etch rate distributions $ER(r, I_i, I_o, I_b)$. A nominal etch rate distribution $ER(r)$ is depicted in the graph of FIG. 71A. The change $\Delta ER(r, I_i)$ from the nominal distribution caused by applying 5 amperes of D.C. current to the inner electromagnet 60 is depicted in FIG. 71B. The change $\Delta ER(r, I_o)$ from the nominal distribution caused by applying 1 ampere of D.C. current to the outer electromagnet 65 is depicted in FIG. 71C. The change $\Delta ER(r, I_b)$ from the nominal distribution caused by applying 2 amperes of D.C. current to the bottom magnet is depicted in FIG. 71D. The sum of the etch rate distributions of FIGS. 71A through 71D is depicted in FIG. 71E, and is the etch rate distribution $ER(r, I_i=5, I_o=1, I_b=2)$.

Another method of determining the optimum currents $(I_i, I_o, I_b)$ of the three magnets is to directly measure etch rate distributions $ER(r, I_i, I_o, I_b)$ for many different combinations of values of $(I_i, I_o, I_b)$ This approach entails a large number of measurements, and replaces the steps of blocks 461-469 of FIG. 70. Once a sufficient number of different $ER(r, I_i, I_o, I_b)$ have been thus measured, the steps of blocks 471, 473 and 475 of FIG. 70 are performed.

In the foregoing process uniformity was defined with reference to radial distribution of etch rate across a wafer etched in the reactor. However, more generally, process uniformity may be defined as the uniformity of radial distribution of plasma ion density across the wafer surface for any process, including an etch process or a deposition process. In an etch reactor, the plasma ion density distribution is inferred from the etch rate radial distribution measured on a wafer that has been processed in a plasma enhanced reactive ion etch process carried out in the reactor.

While the reactor has been described in detail by specific reference to preferred embodiments, it is understood that variations and modifications thereof may be made without departing from the true spirit and scope of the reactor.

What is claimed is:

1. A method of processing a wafer in a plasma reactor comprising a workpiece support surface and an overhead source power applicator overlying a ceiling of the reactor and facing said workpiece support surface, comprising:

generating a plasma in a process region over said workpiece support surface while supporting the workpiece on said workpiece support surface;

generating a DC magnetic field in said process region by applying respective DC current levels to concentric inner and outer DC coils above and displaced by different distances from said RF source power applicator and to a bottom DC coil at an axial location below said wafer;

determining an uncorrected plasma ion density distribution at said workpiece support surface;

determining changes in plasma ion density distribution as functions of D.C. current applied one at a time to respective ones of said inner, outer and bottom electromagnets;

mathematically adding said functions with said uncorrected plasma distribution for different combinations of D.C. currents applied to said inner, outer and bottom electromagnets, so as to compute plural trial plasma ion density distributions;

searching said trial plasma ion density distributions for at least one corresponding to a desired correction in plasma ion density distribution, and determining a corrective set of currents corresponding to coil currents associated with the one trial density distribution; and performing the desired correction by applying said corrective set of currents to respective ones of said inner, outer and bottom electromagnets.

2. The method of claim 1 wherein said desired correction in plasma ion distribution comprises an increase in plasma ion density near a periphery of said process region relative to plasma ion density near the center of said process region.

3. The method of claim 1 wherein said desired correction in plasma ion density distribution comprises a change in plasma ion density near a periphery of said process region relative to plasma ion density at a center of said process region.

4. The method of claim 1 wherein two of said respective DC current levels are non-zero current levels whereby two of said DC coils corresponding to the two non-zero DC current levels establish a radial magnetic field.

5. The method of claim 4 further comprising generating an axial magnetic field by applying a DC current to a third one of said DC coils, said axial magnetic field having a strength less than said radial magnetic field.

6. The method of claim 5 wherein said two DC coils comprise one of said inner and outer coils and said bottom coil and said third DC coil is the other of said inner and outer coils.

7. The method of claim 1 further comprising:
prior to processing said wafer, finding a solenoidal magnetic field in said process region that produces a desired uniformity of plasma ion density radial distribution and determining a radial component of said solenoidal field; and
wherein said performing said desired correction comprises increasing a radial component produced by said coils beyond the strength of said radial component of said solenoidal magnetic field until plasma ion density radial distribution uniformity at least nearly reaches said desired uniformity produced by said solenoidal magnetic field.

8. A method of processing a wafer in a plasma reactor comprising a workpiece support surface and an overhead source power applicator overlying a ceiling of the reactor and facing said workpiece support surface, comprising:
generating a plasma in a process region over said workpiece support surface while supporting the workpiece on said workpiece support surface;
generating a DC magnetic field in said process region by applying respective DC current levels to concentric inner and outer DC coils above and displaced by different distances from said RF source power applicator;
determining an uncorrected plasma ion density distribution at said workpiece support surface;
determining changes in plasma ion density distribution as functions of D.C. current applied one at a time to respective ones, of said inner and outer electromagnets;
mathematically adding said functions with said uncorrected plasma distribution for different combinations of D.C. currents applied to said inner and outer electromagnets, so as to compute plural trial plasma ion density distributions;
searching said trial plasma ion density distributions for at least one corresponding to a desired correction in plasma ion density distribution, and determining a corrective set of currents corresponding to coil currents associated with the one trial density distribution; and
performing the desired correction by applying said corrective set of currents to respective ones of said inner and outer electromagnets.

9. The method of claim 8 wherein said desired correction in plasma ion distribution comprises an increase in plasma ion density near a periphery of said process region relative to plasma ion density near the center of said process region.

10. The method of claim 8 wherein said desired correction in plasma ion density distribution comprises a change in plasma ion density near a periphery of said process region relative to plasma ion density at a center of said process region.

* * * * *